(12) United States Patent
Masuda

(10) Patent No.: US 8,441,774 B2
(45) Date of Patent: May 14, 2013

(54) CAPACITANCE ELEMENT, PRINTED CIRCUIT BOARD, SEMICONDUCTOR PACKAGE, AND SEMICONDUCTOR CIRCUIT

(75) Inventor: Koichiro Masuda, Tokyo (JP)

(73) Assignee: NEC Corporation, Tokyo (JP)

( * ) Notice: Subject to any disclaimer, the term of this patent is extended or adjusted under 35 U.S.C. 154(b) by 321 days.

(21) Appl. No.: 12/530,388

(22) PCT Filed: Mar. 4, 2008

(86) PCT No.: PCT/JP2008/053808
§ 371 (c)(1),
(2), (4) Date: Sep. 8, 2009

(87) PCT Pub. No.: WO2008/108350
PCT Pub. Date: Sep. 12, 2008

(65) Prior Publication Data
US 2010/0084738 A1 Apr. 8, 2010

(30) Foreign Application Priority Data
Mar. 8, 2007 (JP) ................... 2007-058915

(51) Int. Cl.
*H01L 27/04* (2006.01)
*H01G 4/005* (2006.01)
*H01G 4/008* (2006.01)
*H05K 1/16* (2006.01)

(52) U.S. Cl.
USPC ............ 361/303; 361/301.1; 361/306.1; 361/307; 361/308.1; 438/393; 438/381; 257/528; 257/532; 257/534; 257/E27.048; 174/250; 174/260

(58) Field of Classification Search ............ 257/666, 257/691, 692
See application file for complete search history.

(56) References Cited

U.S. PATENT DOCUMENTS 3,641,398 A * 2/1972 Fitzgerald, Jr. ............... 257/728
4,698,661 A * 10/1987 Bessonneau et al. ......... 257/664
(Continued)

FOREIGN PATENT DOCUMENTS
JP 1991083368 A 4/1991
JP 04-023490 A 1/1992
(Continued)

OTHER PUBLICATIONS

International Search Report for PCT/JP2008/053808 mailed May 27, 2008.
(Continued)

*Primary Examiner* — Matthew W Such
*Assistant Examiner* — William Harriston

(57) ABSTRACT

A capacitive element that can efficiently reduce high-frequency noise generated in a circuit is provided. A capacitive element 1 includes a capacitive formation portion 100, which is formed in the shape of a loop to separate the inside from the outside. The capacitive formation portion 100 includes an electrode 110, an opposite electrode 111, and a dielectric layer 120. One or more outgoing terminals (one or more outer circumference outgoing terminals 140, and one or more internal circumference outgoing terminals 130) are provided at the outer and inner circumferences of the electrode 110, respectively. A printed wiring board is made by mounting the capacitive element inside the board or on the surface of the board. A semiconductor package is made by putting the capacitive element 1 on a target semiconductor circuit portion. Moreover, a semiconductor circuit is made by placing the capacitive element on a target functional circuit portion 301.

36 Claims, 83 Drawing Sheets

U.S. PATENT DOCUMENTS

| | | | | | |
|---|---|---|---|---|---|
| 5,023,703 | A | * | 6/1991 | Hidaka et al. | 257/709 |
| 5,031,069 | A | * | 7/1991 | Anderson | 361/321.1 |
| 5,235,496 | A | * | 8/1993 | Chomette et al. | 361/764 |
| 5,237,202 | A | * | 8/1993 | Shimizu et al. | 257/672 |
| 5,574,314 | A | * | 11/1996 | Okada et al. | 257/728 |
| 5,576,577 | A | * | 11/1996 | Takenouchi et al. | 257/672 |
| 5,629,559 | A | * | 5/1997 | Miyahara | 257/666 |
| 5,736,783 | A | * | 4/1998 | Wein et al. | 257/691 |
| 5,831,331 | A | * | 11/1998 | Lee | 257/659 |
| 5,905,634 | A | * | 5/1999 | Takeda et al. | 361/704 |
| 5,956,226 | A | * | 9/1999 | Jung et al. | 361/514 |
| 6,093,957 | A | * | 7/2000 | Kwon | 257/666 |
| 6,172,412 | B1 | * | 1/2001 | Wein et al. | 257/664 |
| 6,489,679 | B2 | * | 12/2002 | Tsukiyama et al. | 257/728 |
| 6,518,501 | B1 | * | 2/2003 | Kawahara et al. | 174/538 |
| 6,559,533 | B1 | * | 5/2003 | Yamamoto | 257/705 |
| 6,621,162 | B1 | * | 9/2003 | Ishida et al. | 257/728 |
| 6,635,961 | B2 | * | 10/2003 | Yoshida et al. | 257/728 |
| 6,721,171 | B2 | * | 4/2004 | Masuda et al. | 361/523 |
| 6,833,619 | B1 | * | 12/2004 | Jang et al. | 257/728 |
| 6,836,195 | B2 | * | 12/2004 | Arai et al. | 333/182 |
| 6,850,404 | B2 | * | 2/2005 | Engel et al. | 361/301.4 |
| 6,873,518 | B2 | * | 3/2005 | Masuda et al. | 361/525 |
| 6,876,076 | B2 | * | 4/2005 | Gloria et al. | 257/728 |
| 7,035,079 | B1 | * | 4/2006 | Park et al. | 361/303 |
| 7,115,988 | B1 | * | 10/2006 | Hool | 257/713 |
| 7,144,486 | B1 | * | 12/2006 | Fritsch et al. | 204/403.06 |
| 7,161,244 | B2 | * | 1/2007 | Fournier et al. | 257/728 |
| 7,315,226 | B2 | * | 1/2008 | Tohya et al. | 333/182 |
| 7,456,077 | B2 | * | 11/2008 | Sherwood et al. | 438/396 |
| 7,486,157 | B2 | * | 2/2009 | Takagi | 333/34 |
| 7,646,589 | B2 | * | 1/2010 | Kuriyama | 361/528 |
| 2002/0003298 | A1 | * | 1/2002 | Koriyama et al. | 257/728 |
| 2002/0140075 | A1 | * | 10/2002 | Laureanti | 257/686 |
| 2003/0007310 | A1 | * | 1/2003 | Trinh et al. | 361/302 |
| 2004/0080376 | A1 | * | 4/2004 | Kaehs | 333/26 |
| 2004/0124486 | A1 | * | 7/2004 | Yamamoto | 257/433 |
| 2005/0280060 | A1 | * | 12/2005 | Juengling | 257/296 |
| 2005/0285243 | A1 | * | 12/2005 | Stone et al. | 257/678 |
| 2006/0164813 | A1 | * | 7/2006 | Yoshioka et al. | 361/717 |
| 2007/0217122 | A1 | * | 9/2007 | Gevorgian et al. | 361/307 |
| 2010/0084738 | A1 | * | 4/2010 | Masuda | 257/532 |
| 2010/0246144 | A1 | * | 9/2010 | Yamazaki et al. | 361/749 |

FOREIGN PATENT DOCUMENTS

| | | | |
|---|---|---|---|
| JP | 6-268012 | A | 9/1994 |
| JP | 11-87880 | A | 3/1999 |
| JP | 2001-267702 | A | 9/2001 |
| JP | 2001-274558 | A | 10/2001 |
| JP | 2001-332825 | A | 11/2001 |
| JP | 2002-83891 | A | 3/2002 |
| JP | 2002-368355 | A | 12/2002 |
| JP | 2003-101311 | A | 4/2003 |
| JP | 2003-124066 | A | 4/2003 |
| JP | 2004-119709 | A | 4/2004 |
| JP | 2004-327941 | A | 11/2004 |
| JP | 2005-011938 | A | 1/2005 |
| JP | 2005-33813 | A | 2/2005 |
| JP | 2005-158959 | A | 6/2005 |
| JP | 2005-236090 | A | 9/2005 |
| JP | 2006-216755 | A | 8/2006 |

OTHER PUBLICATIONS

Japanese Office Action for JP2009-502582 mailed on Jan. 24, 2013.

* cited by examiner

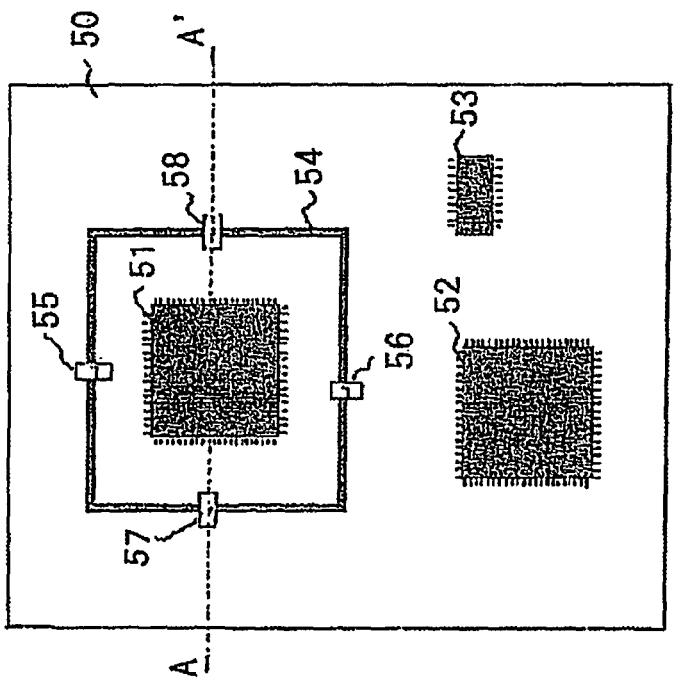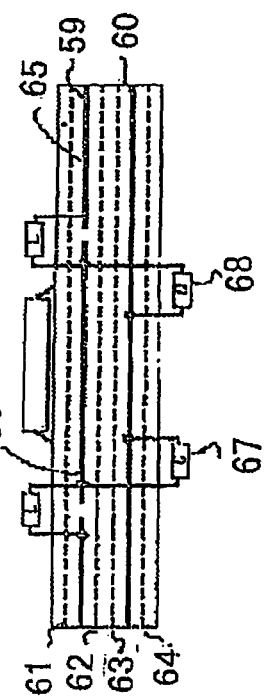
FIG. 3A —Prior Art—
FIG. 3B —Prior Art—

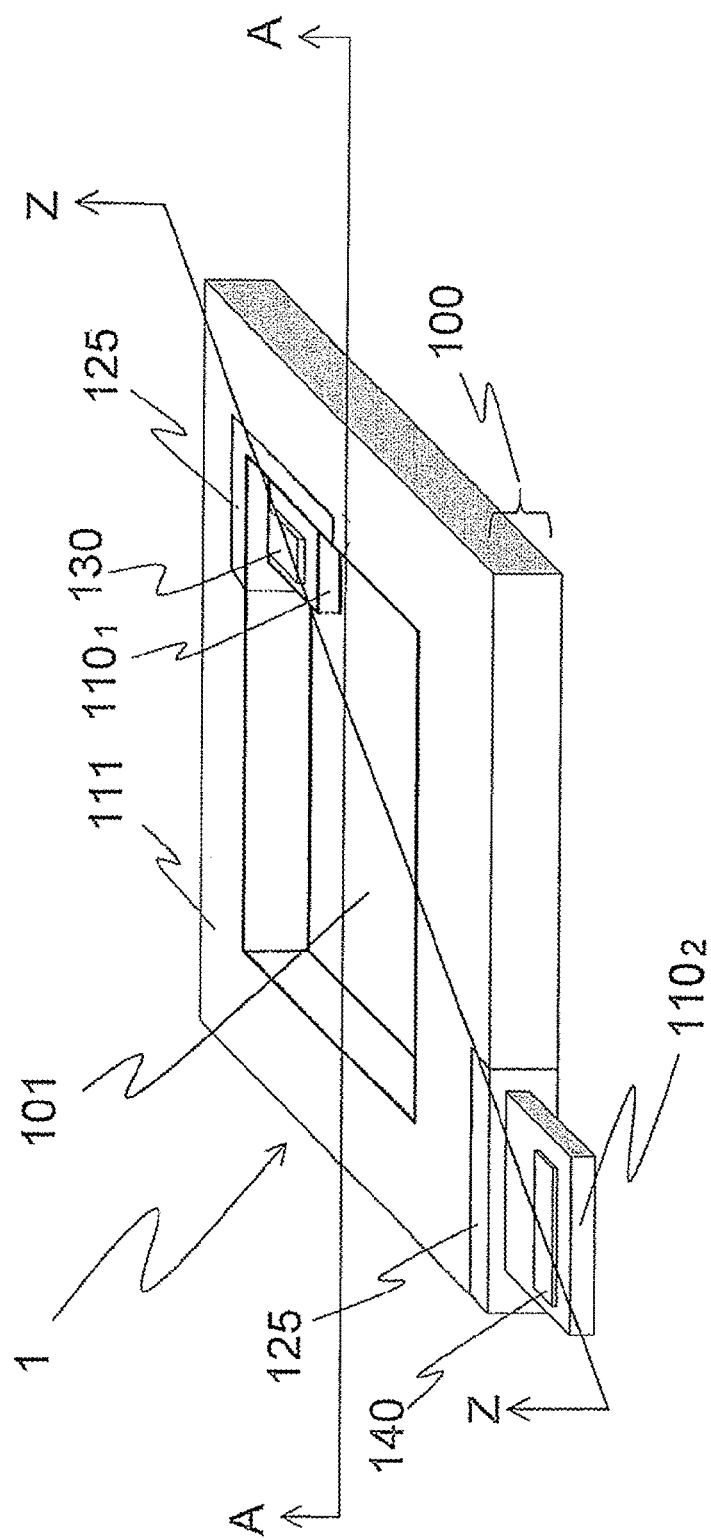

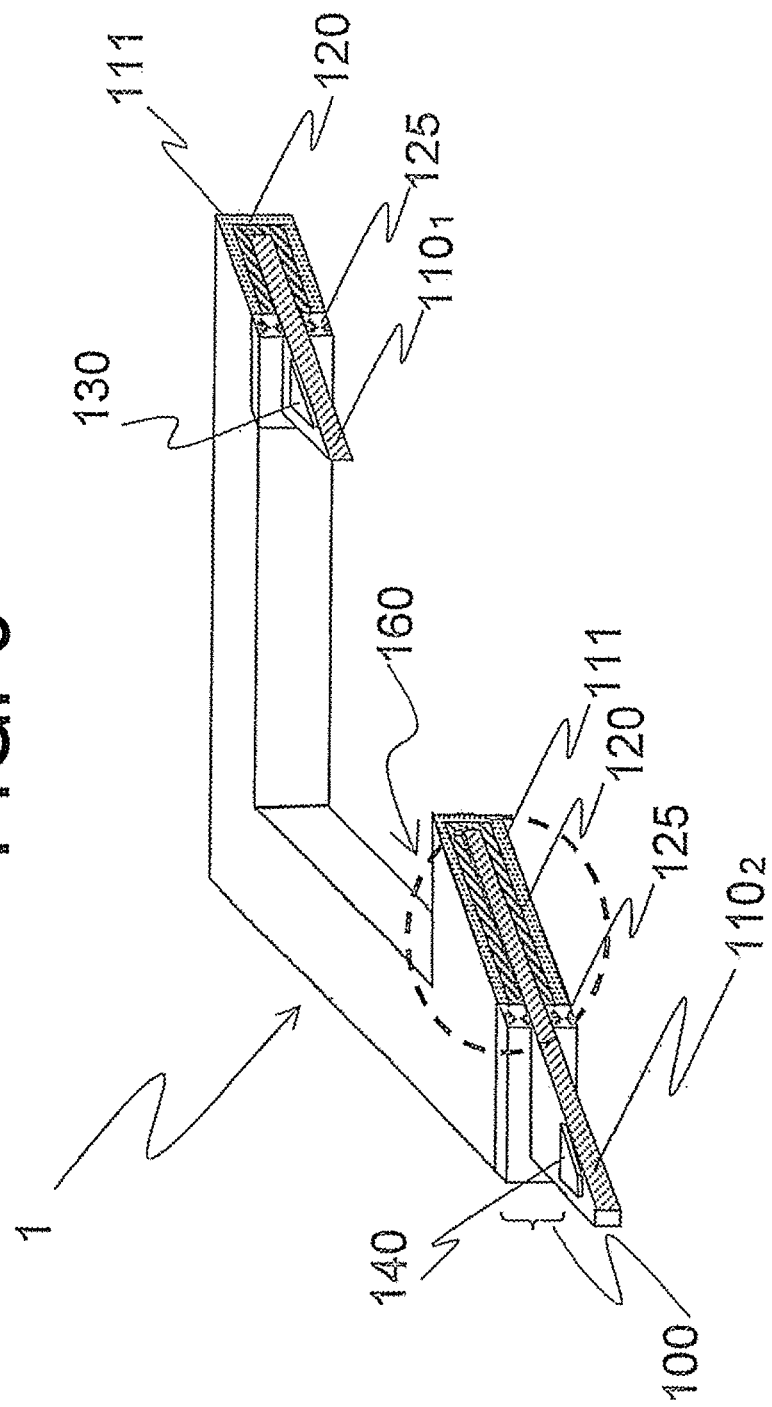

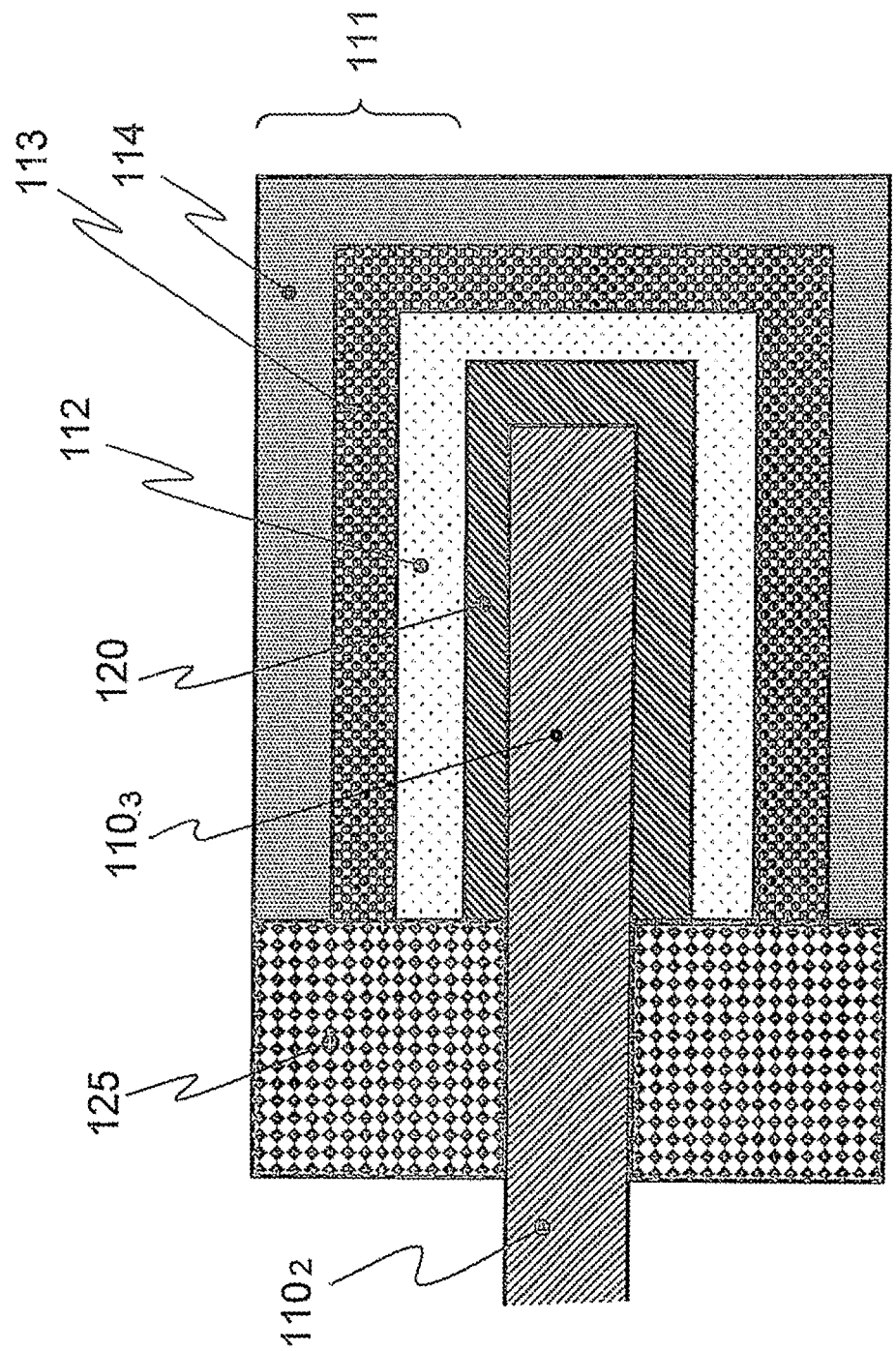

CROSS SECTION ALONG A-A

CAPACITANCE ELEMENT, PRINTED CIRCUIT BOARD, SEMICONDUCTOR PACKAGE, AND SEMICONDUCTOR CIRCUIT

TECHNICAL FIELD

The present invention relates to a capacitive element that, when there is a circuit to generate high-frequency power or when there is a possibility that high-frequency power would enter from a power wiring and the like, allows direct current, or low-frequency power or signals to pass through at a power wiring and a signal wiring and allows high-frequency power to reduce (attenuate) at the power wiring and the signal wiring, or the present invention relates to a capacitive element which stabilizes power supply voltage, a printed wiring board, a semiconductor package, and a semiconductor circuit. The present application is the National Phase of PCT/JP2008/053808, filed on Mar. 4, 2008, which claims priority from Japanese Patent Application No. 2007-058915 filed Mar. 8, 2007, and the contents of Japanese Patent Application No. 2007-058915 are incorporated in the description of the present application.

BACKGROUND ART

In recent years, circuits of a digital information device such as a personal computer or a portable information terminal such as a cellular phone run at extremely high speed because of technological advances in performance and function. If the clock speed rises over several hundred MHz, it becomes difficult to substantially suppress noise (high-frequency oscillation) that leaks from LSI to a power wiring of a printed circuit board by using only conventional laminated ceramic capacitor and three-terminal capacitor, increasing the likelihood that malfunction or radio disturbance would occur due to an increase in noise. As a capacitive element that can deal with the above problem, the applicant(s) has already proposed a strip-line-type element (for example, see Patent Documents 1 and 2).

FIG. 1 is a plain view of a strip-line-type element disclosed in Patent Document 1. FIG. 2 is a cross-sectional view of FIG. 1 taken along the line P-P. As shown in FIGS. 1 and 2, on the surface of a metal plate 10 made of aluminum, a dielectric film 20 made of an oxide compound is formed. On the dielectric film 20, a conductive layer 30 including a conductive polymer layer 31, a conductive carbon paste layer 32, and a silver paste layer 33 is formed. To both ends of the longitudinal direction of the metal plate 10, anode outgoing terminals 11 and 12 are connected. On one surface of the conductive layer 30, metal plates 40 that are copper foil are piled up. Both ends of the longitudinal direction of the metal plate 40 are cathode outgoing terminals 41 and 42.

Moreover, a technique to separate a power layer and dispose a capacitive element is disclosed in Patent Documents 3 to 8.

FIGS. 3A and 3B shows a printed wiring board disclosed in Patent Document 6. FIG. 3A is a plain view. FIG. 3B is a cross-sectional view of FIG. 3A taken along the line A-A'. The printed wiring board 50 includes 6 layers: a power layer 59, a ground layer 60, and signal layers 61 to 64. Immediately under LSI 51, the power layer 59 is divided by a moat 54 into a peripheral power source 65 and an island power source 66 which are electrically connected by inductances 55, 56, 57, and 58. The layers between the power source 66 and the ground layer 60 are electrically connected by capacitors 67 and 68.

Patent Document 1: JP-A-2003-101311
Patent Document 2: JP-A-2003-124066
Patent Document 3: JP-A-2005-033813
Patent Document 4: JP-A-2002-368355
Patent Document 5: JP-A-2001-332825
Patent Document 6: JP-A-2001-274558
Patent Document 7: JP-A-2001-267702
Patent Document 8: JP-A-11-087880

DISCLOSURE OF THE INVENTION

Problems to be Solved by the Invention

The above-described strip-line-type element and the like have a high capability in reducing noise. However, the problem is that the above-described strip-line-type element and the like cannot sufficiently exhibit the capability depending on packaging method. The technique to separate the power supply and dispose the capacitive element and the like has the following drawback: The noise propagates as frequencies become higher, due to spatial (electromagnetic) coupling even though the power supply is separated.

The object of the present invention is to solve the above-mentioned problems of conventional arts. The typical object is to provide a capacitive element capable of efficiently reducing high-frequency noise generated in a circuit.

Means for Solving the Problems

A capacitive element according to the present invention includes a capacitive formation portion that includes an opening for surrounding a circuit that generates high-frequency power or needs to be protected from high-frequency power, wherein the capacitive formation portion includes an electrode in the shape of a closed curve, a dielectric layer that covers the electrode, and an opposite electrode that covers the dielectric layer and faces the electrode;

the electrode includes at least one first projecting portion for electric connection at the inner circumference of the capacitive formation portion, and at least one second projecting portion for electric connection at the outer circumference of the capacitive formation portion;

the dielectric layer covers, except the first and second projecting portions, the electrode; and the first projecting portion serves as a connection portion to be electrically connected to the circuit.

Further, a capacitive element according to the present invention includes a capacitive formation portion that includes an opening for surrounding a circuit that generates high-frequency power or needs to be protected from high-frequency power, wherein the capacitive formation portion includes an electrode in the shape of a closed curve, a dielectric layer that covers the electrode, and an opposite electrode that covers the dielectric layer and faces the electrode;

the dielectric layer and the opposite electrode are opened so as to expose at least two portions of one surface of the electrode; and one of the exposed surfaces of the electrode serves as a connection portion to be electrically connected to the circuit.

A printed wiring board, a semiconductor package, and a semiconductor circuit according to the present invention use the capacitive element according to the present invention.

In the structure of un-surrounding a circuit that generates high-frequency power or needs to be protected from high-frequency power, since there was a bypass (spatial coupling)

of the high-frequency power (electromagnetic waves) due to the inductance arising from the structure of the terminal or the structure made without consideration for shielding, the performance of suppressing the high-frequency power in a high frequency range in more than 10 kHz, particularly several GHz decreases. Since the capacitive element according to the present invention surrounds a circuit generating the high-frequency power, the capacitive element can prevent the high-frequency power from going outside. Moreover, since the capacitive element according to the present invention surrounds a circuit that needs to be protected from the high-frequency power, the capacitive element can prevent the high-frequency power from being input from the outside.

Advantages of the Invention

The exemplary first effect of the present invention is to be able to provide a capacitive element that can efficiently attenuate high-frequency power.

The exemplary second effect of the present invention is to be able to provide a capacitive element that can efficiently reduce spatial coupling and can operate even at high frequency in an effective manner.

The exemplary third effect of the present invention is that when a capacitive element is mounted on a printed wiring board, a semiconductor package, or a semiconductor circuit, the capacitive element can be substituted for a power wiring layer and provide the same benefit as when a power layer is added.

BRIEF DESCRIPTION OF THE DRAWINGS

FIGS. 3A and 3B are a diagram illustrating a printed wiring board according to a conventional art.

FIG. 4 is a perspective view of a capacitive element according to a first embodiment of the present invention.

FIG. 5 is a perspective cross-sectional view of FIG. 4 taken along the line Z-Z.

FIG. 6 is an enlarged view of a portion 160 shown in FIG. 5 which is surrounded by a dotted line.

EXPLANATION OF REFERENCE SYMBOLS

Figure 1:
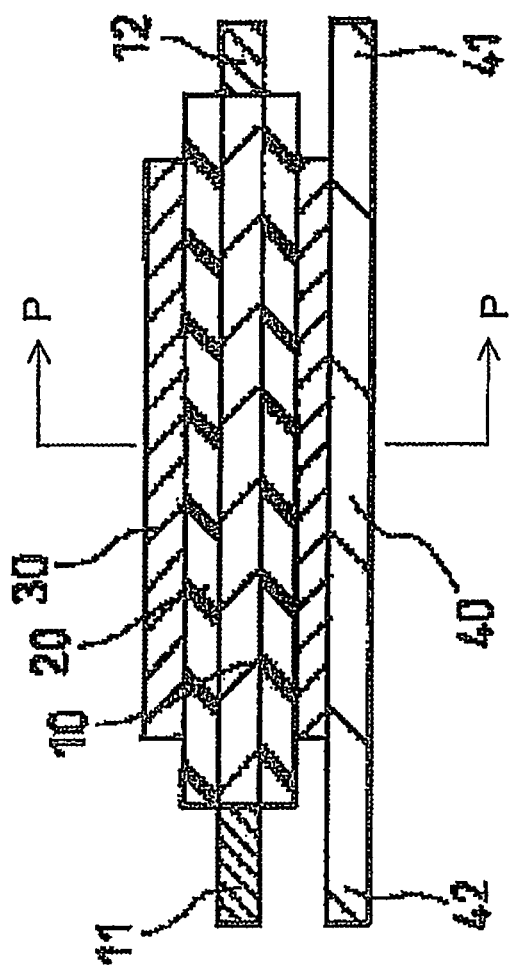
FIG. 1 is a top view of a strip-line-type element.
Figure 2:
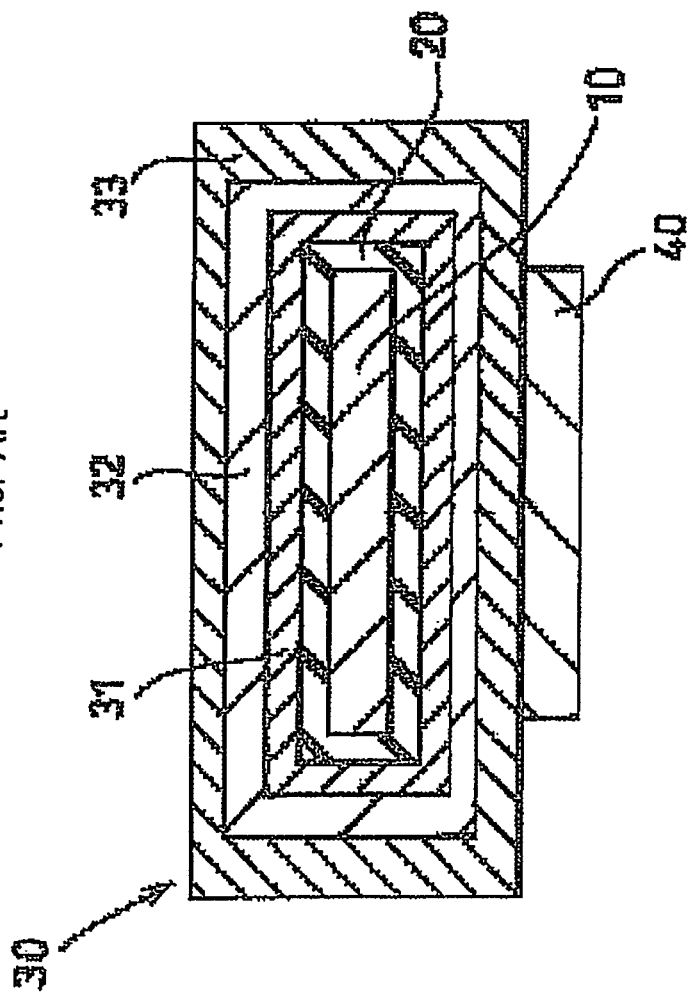
FIG. 2 is a cross-sectional view of FIG. 1 taken along the line P-P.

1, 2, 3, 4, 5: Capacitive element
100: Capacitive formation portion
101: Hole (Opening)
110: Electrode
111: Opposite electrode
112: Conductive polymer
113: Carbon graphite
114: Silver paste
120: Dielectric layer
125: Insulating resin
130: Internal circumference outgoing terminal
140: Outer circumference outgoing terminal
141: Conductive polymer
142: Conductive material (Silver paste)
143: Conductive material (Carbon graphite)
150: Outer surface outgoing terminal
200: Printed wiring board
201, 202: Double-side board
230: Power wiring (Target circuit portion)
240, 340: Power wiring (Board power supply portion)
241: Power wiring end portion
250, 350: Ground (A pair of wiring layers)
251, 351: Ground end portion
252, 352: Ground inside a power wiring layer
260, 261, 262, 263, 264: Conductive adhesive
271, 272, 273: Via
280: Through hole
281, 282: Slit
284: Thermosetting insulating resin
285: Insulating resin
290, 291, 292, 293, 294, 295: Signal wiring layer
300: Semiconductor circuit
310: Semiconductor chip
320: Silicon wafer
330: Interposer
340: Bonding wire
370: Connection pad
385: Molding resin
400: Semiconductor package
410: LSI
411: Noise source
412: LSI power supply pin
413: LSI ground pin
420, 421, 422, 423, 424: Wiring layer
501: Decoupling characteristics according to a first embodiment of the present invention
502: Decoupling characteristics according to a conventional art (line element)
503: Decoupling characteristics according to a conventional art (a ceramic capacitors of 0.1 µF)
511, 512: Deterioration of characteristics resulting from spatial coupling
601: Chemical conversion tank
602: Variable power supply
603: Positive electrode wiring
604: Negative electrode wiring
605: Negative electrode plate
611, 612, 613, 614, 615: Container
621: Chemical conversion solution
622, 626: Cleaning fluid
623: Oxidizing agent
624: Monomer solution
625: Mask resin
627: Removal fluid
628: Carbon paste
631: Pipette
701: Functional circuit portion
702: Noise source
704, 704a: Power layer 705, 705a, 705b: Ground layer
706: Signal wiring
720: Silicon wafer
761, 762, 763: Conductive adhesive
770V: Power supply pad
770G: Ground pad
770S: Signal pad

BEST MODE FOR CARRYING OUT THE
INVENTION

Hereinafter, typical embodiments of the present invention will be described in detail with reference to the accompanying drawings.

First Embodiment

Figure 7:
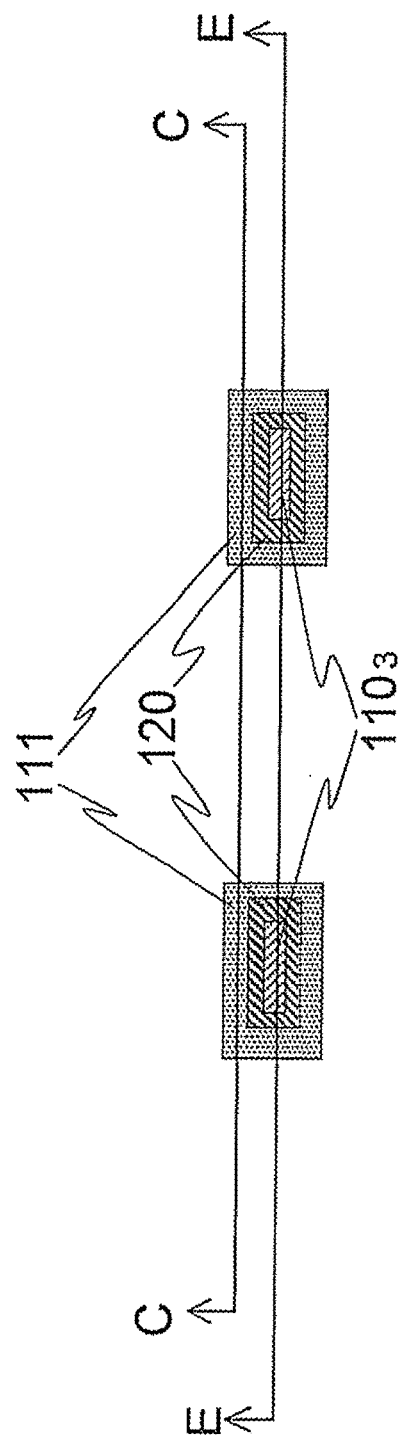
FIG. 7 is a cross-sectional view of FIG. 4 taken along the line A-A.
Figure 8:
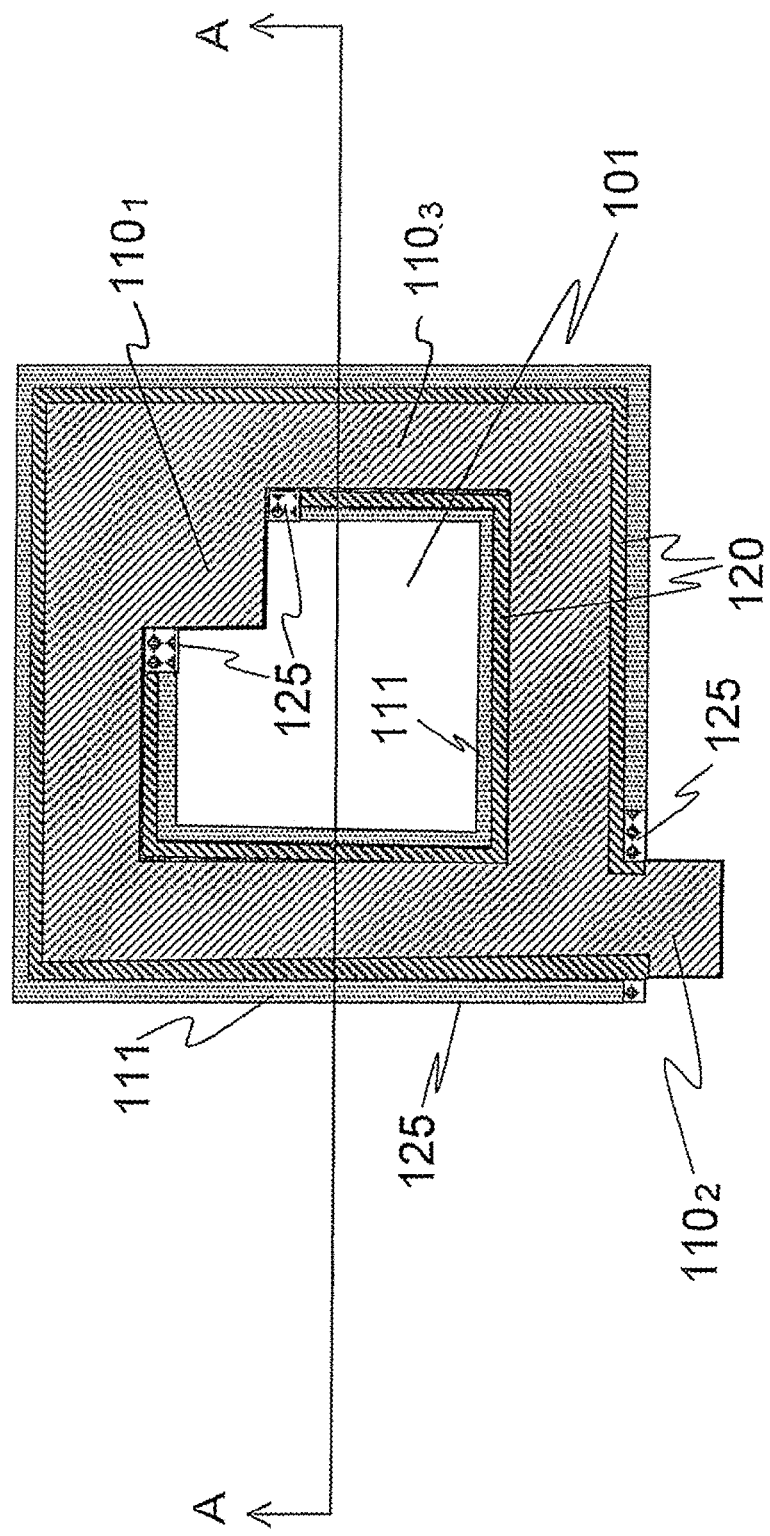
FIG. 8 is a cross-sectional view of FIG. 7 taken along the line E-E.
Figure 9:
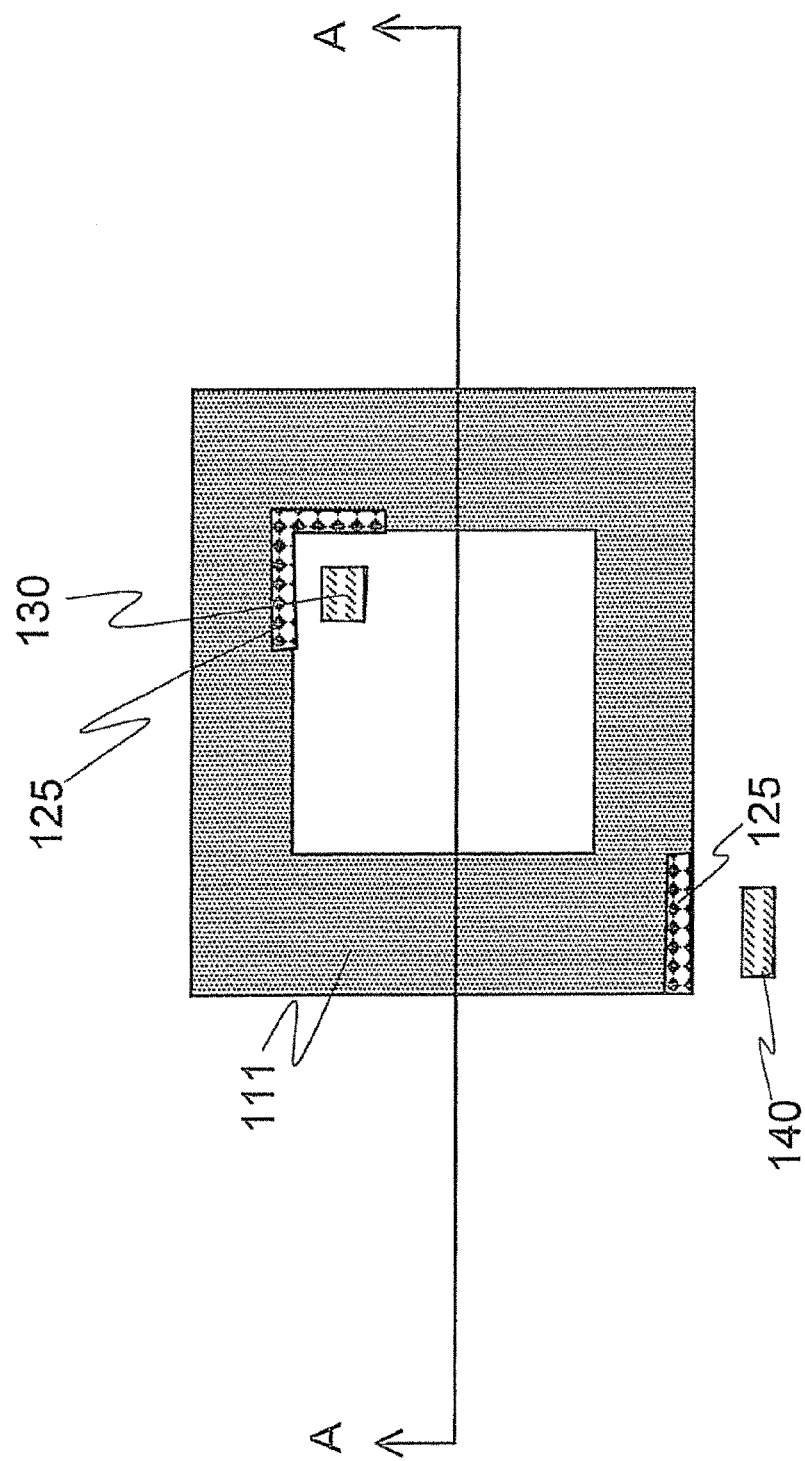
FIG. 9 is a cross-sectional view of FIG. 7 taken along the line C-C.
Figure 10:
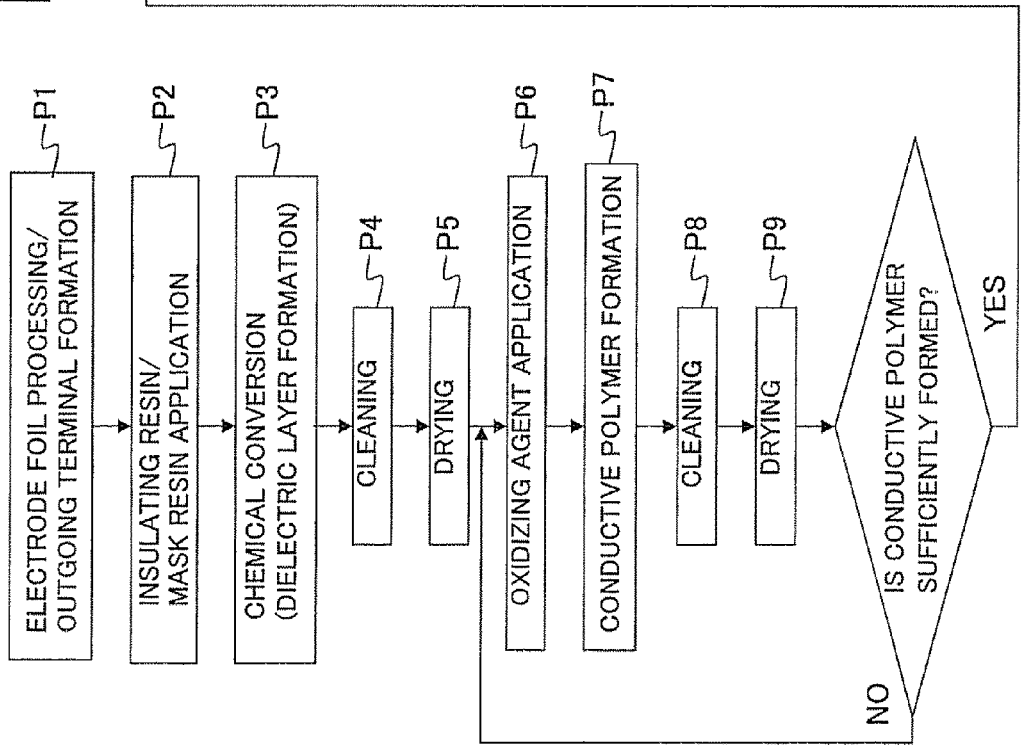
FIG. 10 is a flowchart illustrating a production process of the capacitive element according to the first embodiment of the present invention.
Figure 28:
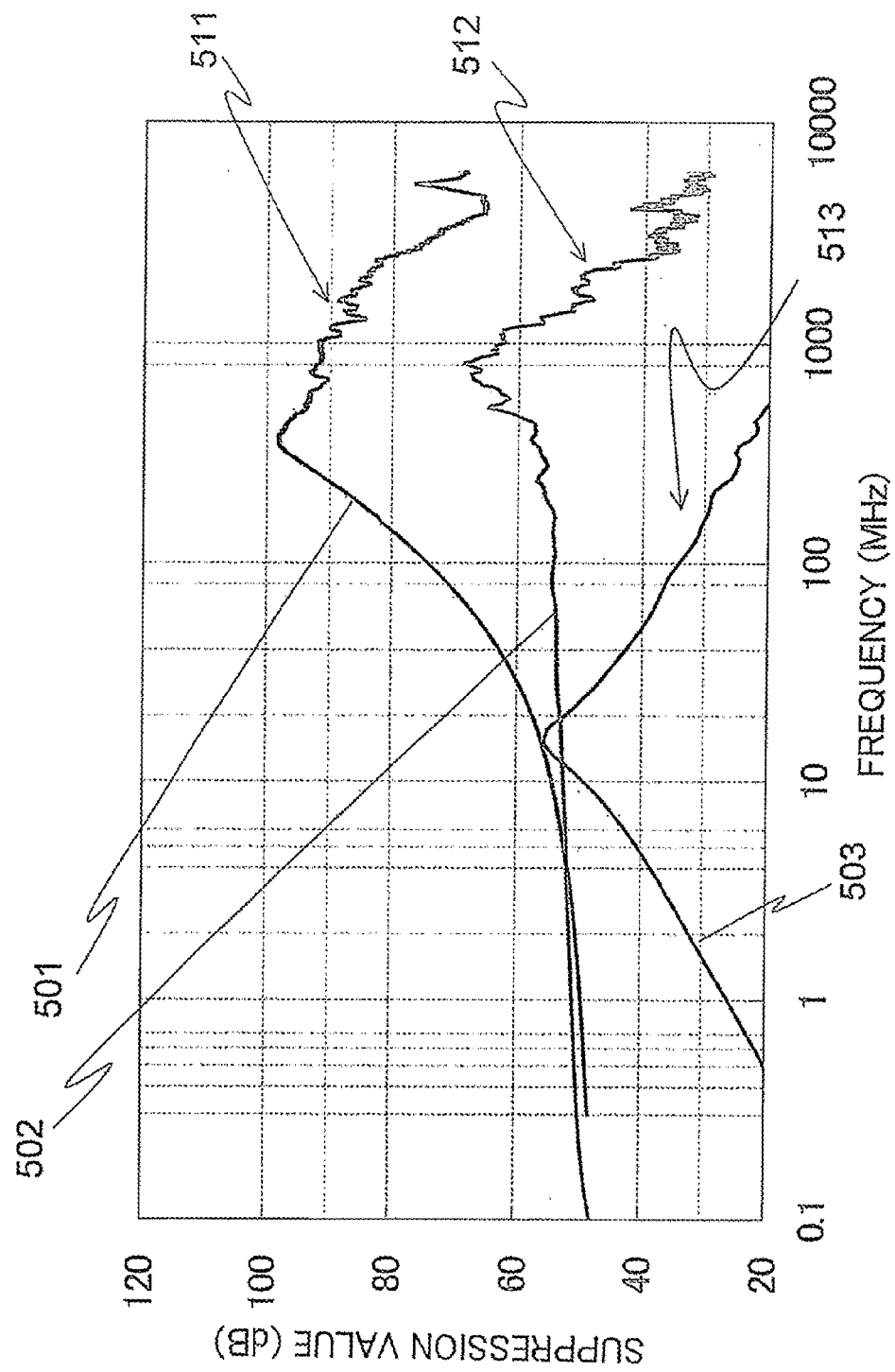
FIG. 28 is a diagram showing the characteristics of the capacitive element.
Figure 29:
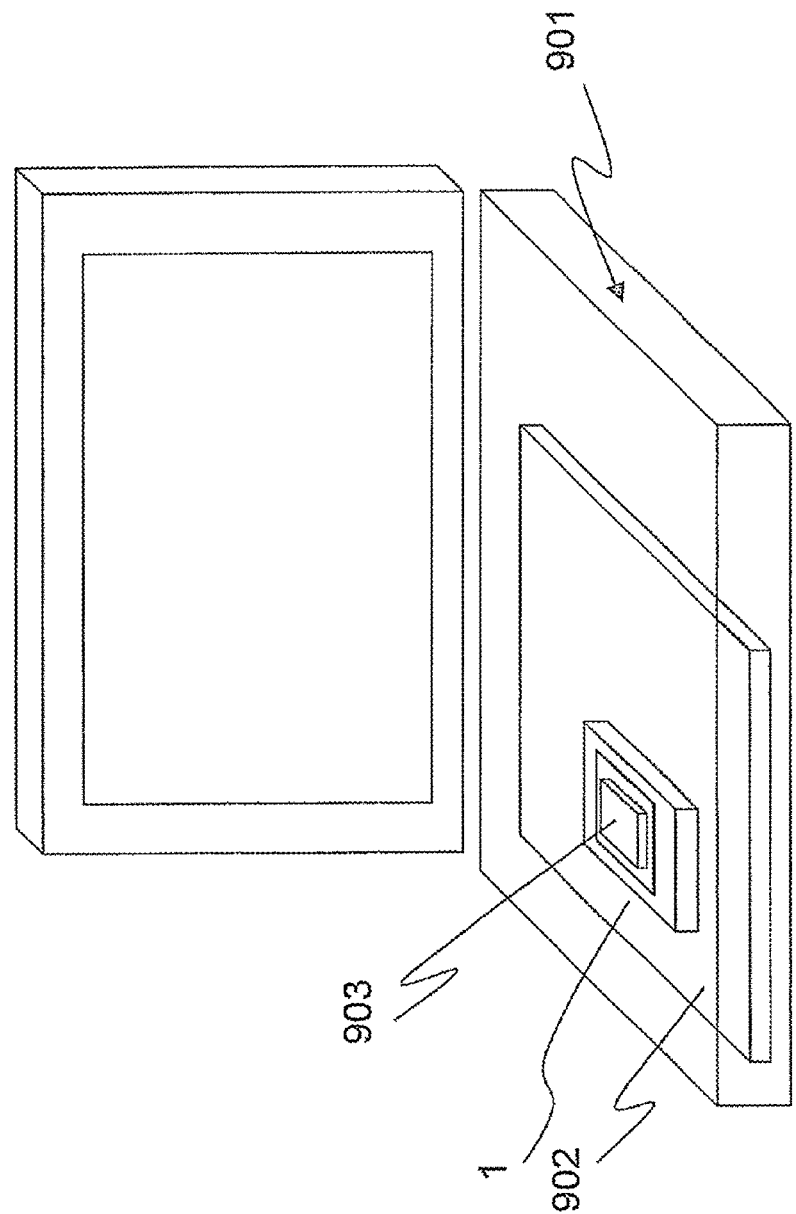
FIG. 29 is a conceptual diagram to illustrate the case where the capacitive element is used in a notebook personal computer.
Figure 30:
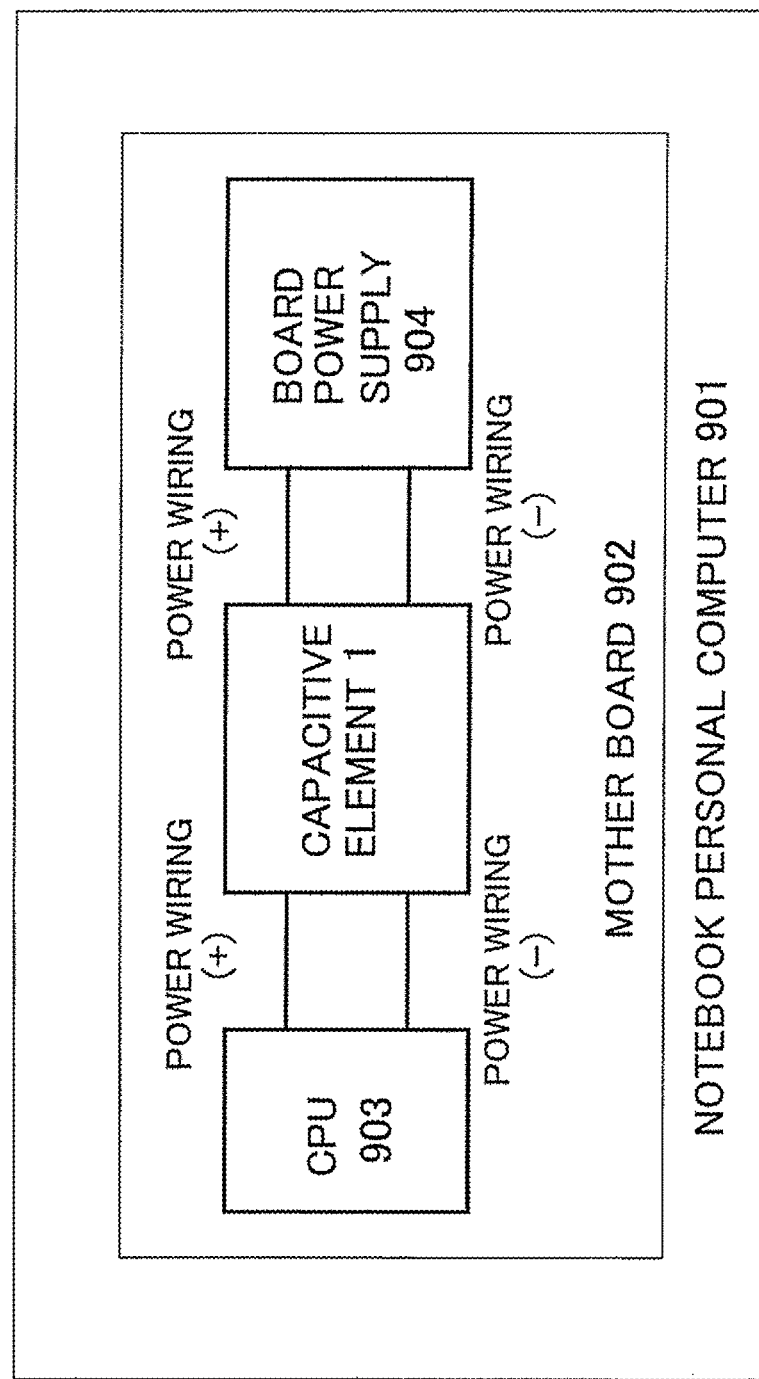
FIG. 30 is a block diagram to illustrate the case where the capacitive element is used in a notebook personal computer.
Figure 31:
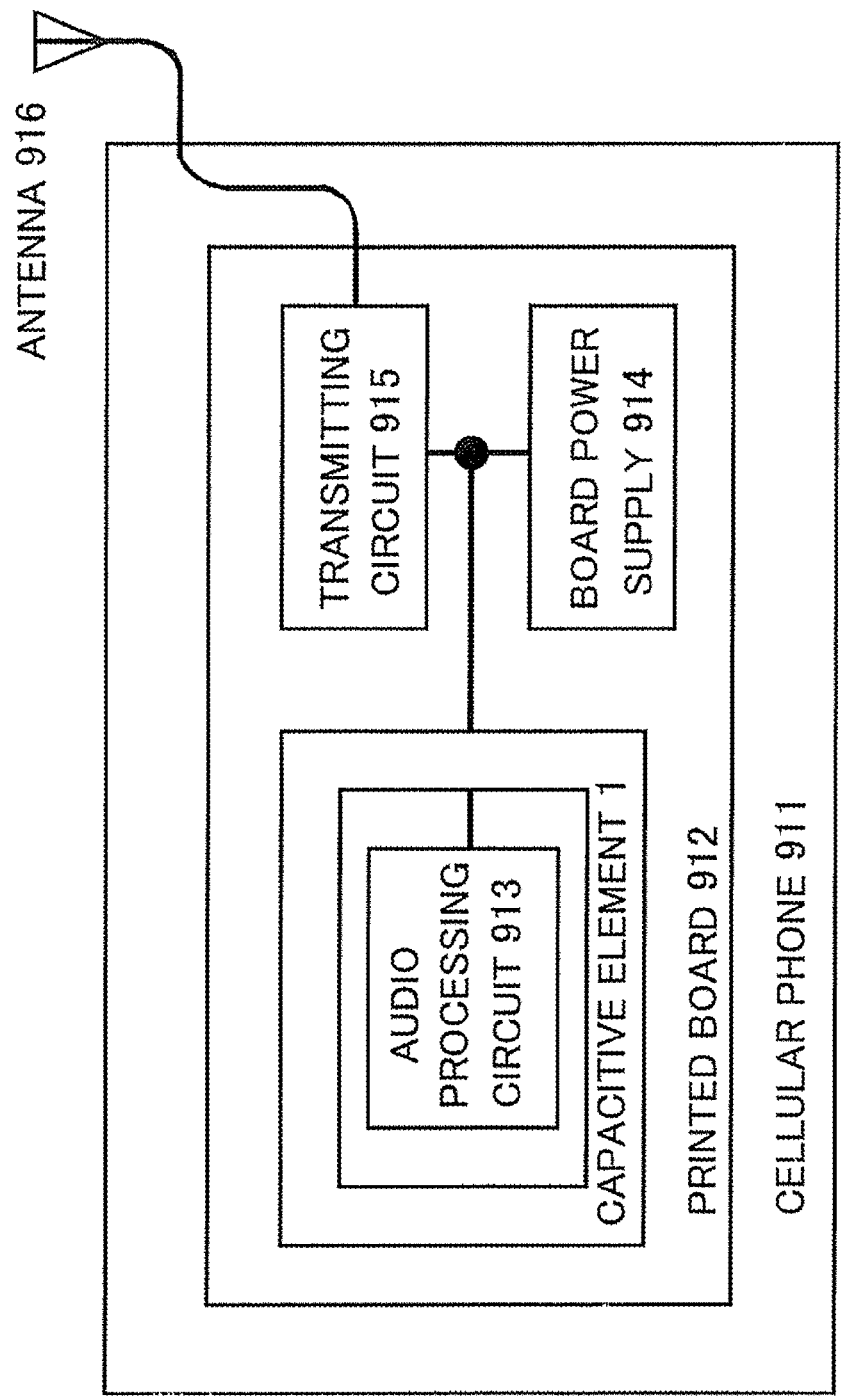
FIG. 31 is a block diagram to illustrate the case in which the capacitive element is used in a cellular phone.

FIG. 4 shows a perspective view of a capacitive element according to a first embodiment of the present invention. FIG. 5 is a perspective cross-sectional view of FIG. 4 taken along the line Z-Z. FIG. 6 is an enlarged view of a portion 160 shown in FIG. 5 which is surrounded by a dotted line. FIG. 7 is a cross-sectional view of FIG. 4 taken along the line A-A. FIG. 8 is a cross-sectional view of FIG. 7 taken along the line E-E; FIG. 9 is a cross-sectional view of FIG. 7 taken along the line C-C. FIG. 10 is a flowchart illustrating a production process. FIGS. 11 to 27 are explanatory diagrams of the production process. FIG. 28 is a diagram showing characteristics. FIGS. 29 and 30 are a conceptual diagram and a block diagram, respectively, for illustrating the case where the capacitive element is used in a notebook personal computer. FIG. 31 is a block diagram for illustrating the case in which the capacitive element is used in a cellular phone. Incidentally, in order to make the elements of the configurations easily recognizable, the diagrams showing the configurations are drawn in a way that does not reflect the actual thickness and ratios of dimension.

According to the present embodiment, a capacitive element 1 includes an electrode 110, an opposite electrode 111, a dielectric layer 120, an internal circumference outgoing terminal (which is a first outgoing terminal) 130, and an outer circumference outgoing terminal (which is a second outgoing terminal) 140. As shown in FIG. 8, the electrode 110 is formed so as to form the shape of a closed curve, including a frame-like portion $110_3$ which is in the shape of a square frame, a first projecting portion $110_1$ projecting toward the inner circumference of the frame-like portion $110_3$, and a second projecting portion $110_2$ projecting toward the outer circumference of the frame-like portion $110_3$. Between the frame-like portion $110_3$ of the electrode 110 and the opposite electrode 111, the dielectric layer 120 is formed to be a capacitive formation portion 100. As shown in FIG. 6, the frame-like portion $110_3$ of the electrode 110 is covered with the dielectric layer 120, and the dielectric layer 120 is covered with the opposite electrode 111. The first projecting portion $110_1$ is formed at the inner-circumference side of the capacitive formation portion 100, and the second projecting portion $110_2$ is formed at the outer-circumference side of the capacitive formation portion 100. As shown in FIG. 6, a conductive polymer 112, carbon graphite 113, and a silver paste 114 are piled up to form the opposite electrode 111.

As shown in FIG. 4, the internal circumference outgoing terminal 130 is formed at the first projecting portion $110_1$ of the electrode 110, and the outer circumference outgoing terminal 140 is formed at the second projecting portion $110_2$ of the electrode 110. An electric insulating resin 125 is provided near the internal circumference outgoing terminal 130 and the outer circumference outgoing terminal 140 for short-circuit prevention between the electrode 110 and the opposite electrode 111.

The first projecting portion $110_1$ of the electrode 110 serves as a connection portion to which connected is a circuit that generates high-frequency power or a circuit that needs to be protected from high-frequency power. The connection portion is connected to the circuit via the internal circumference outgoing terminal 130. The insulating resin 125 serves as a bank to prevent electric conduction between the opposite electrode 111 and the electrode 110.

The following sequentially describes a production process according to the first embodiment of the present invention, with reference to a flowchart illustrating the production process (FIG. 10) and the explanatory diagrams of each step (FIGS. 11 to 27). FIGS. 11 to 27 are diagrams to illustrate steps P1 to P17 described below.

[Electrode Foil Processing/Outgoing Terminal Formation Process (Step P1)]

Figure 11:
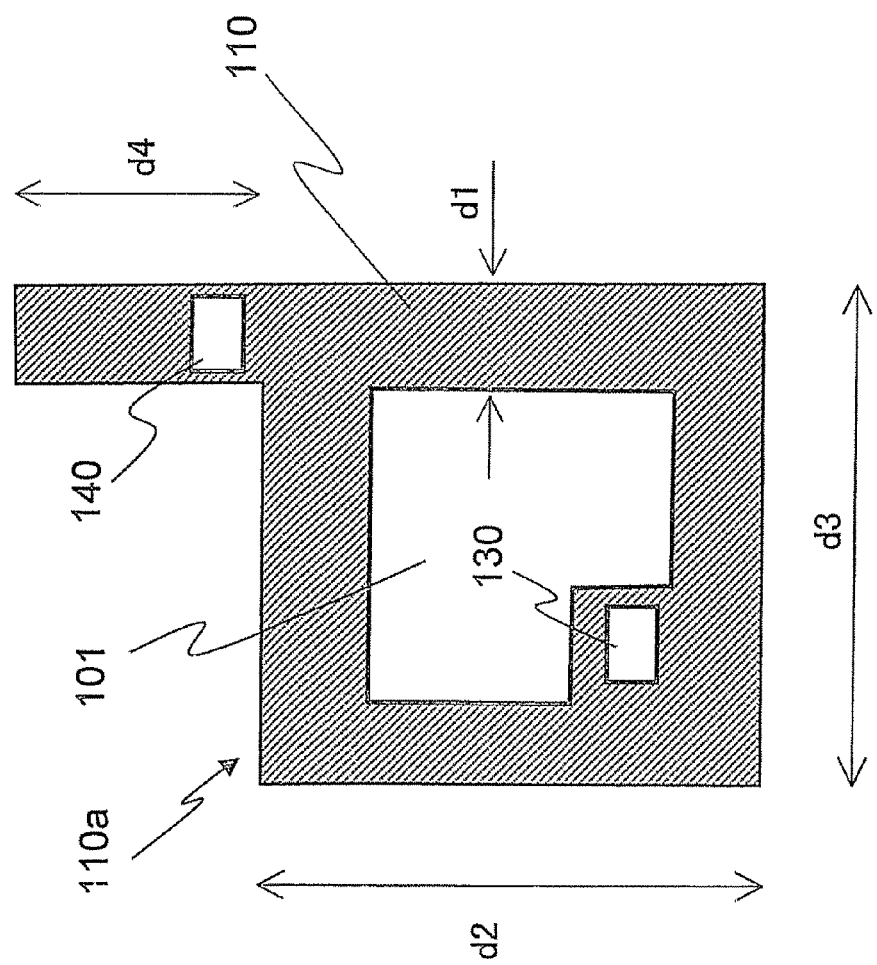
FIG. 11 is an explanatory diagram of the production process of the capacitive element.
Figure 12:
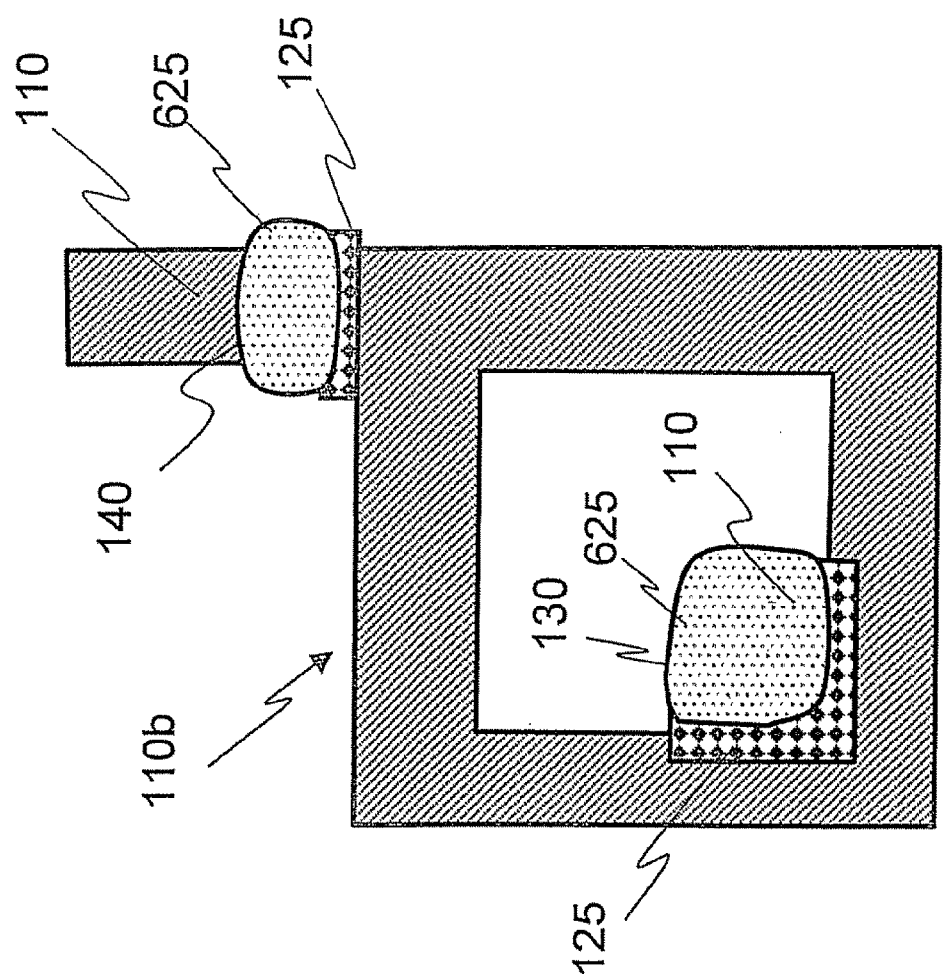
FIG. 12 is an explanatory diagram of the production process of the capacitive element.

An aluminum plate with thickness of 0.15 mm to which an etching process was applied to increase the size of the surface area by about 100 times is made in the shape shown in FIG. 11. The width d1 of a portion surrounding a hole 101 which is an opening is about 4 mm. The outer size (the length of one side of the circumference) d2 or d3 of a portion (which is, in this case, in the shape of a square frame) surrounding the hole 101 is about 18 mm.

A projecting portion on which the outer circumference outgoing terminal 140 is provided remains left after cutting such that the length d4 of the projecting portion is about 50 mm. The projecting portion is formed so as to be longer than the second projecting portion shown in FIG. 4, and will be cut off in an electrode unnecessary portion cutting process (Step P17) described below. Then, the internal circumference outgoing terminal 130 and the outer circumference outgoing terminal 140 are attached to an aluminum plate by resistance welding. Therefore, a structure $110_a$ having the internal circumference outgoing terminal 130 and the outer circumference outgoing terminal 140 on the electrode 110 is obtained. The material of the internal circumference outgoing terminal 130 and the outer circumference outgoing terminal 140 is not limited to a specific material, as long as the material is electrically conductive. Incidentally, the internal circumference outgoing terminal 130 and the outer circumference outgoing terminal 140 are provided to do an electrical connection, or to ensure an electrical connection. If an electrical connection is made possible directly by the first projecting portion and the second projecting portion, the internal circumference outgoing terminal 130 and the outer circumference outgoing terminal 140 can be omitted. If a wiring such as a copper line is soldered, a copper plate with thickness of 0.1 mm, for example, is welded. The materials suitable for soldering include a tin plate, and a tin-plated plate which is copper plated with tin.

[Insulating Resin/Mask Resin Application Process (Step P2)]

Epoxy thermosetting resin is applied to a portion which is a boundary between the capacitive formation portion 100, and the first projecting portion $110_1$ and the second projecting portion $110_2$ as shown in FIG. 4, and then solidified to form the insulating resin 125. The insulating resin 125 is provided at the boundary between the capacitive formation portion 100, and the first projecting portion $110_1$ and the second projecting portion $110_2$ to prevent short circuits between the electrode 110 and the opposite electrode 110. Hexafluoropropylene is applied to the internal circumference outgoing terminal 130, the outer circumference outgoing terminal 140, and the areas around the internal circumference outgoing terminal 130 and the outer circumference outgoing terminal 140, and serves as a mask resin 625. The mask resin 625 will sink in a solution in a later process at a portion (the outgoing terminal and the electrode 110 around the outgoing terminal) shown in FIG. 12, and needs to completely cover a portion where the opposite electrode 111 is not formed. Therefore, a structure $110_b$ to which the insulating resin 125 and the mask resin 625 are applied is obtained.

[Dielectric Layer Formation Process (Step P3)]

Figure 13:
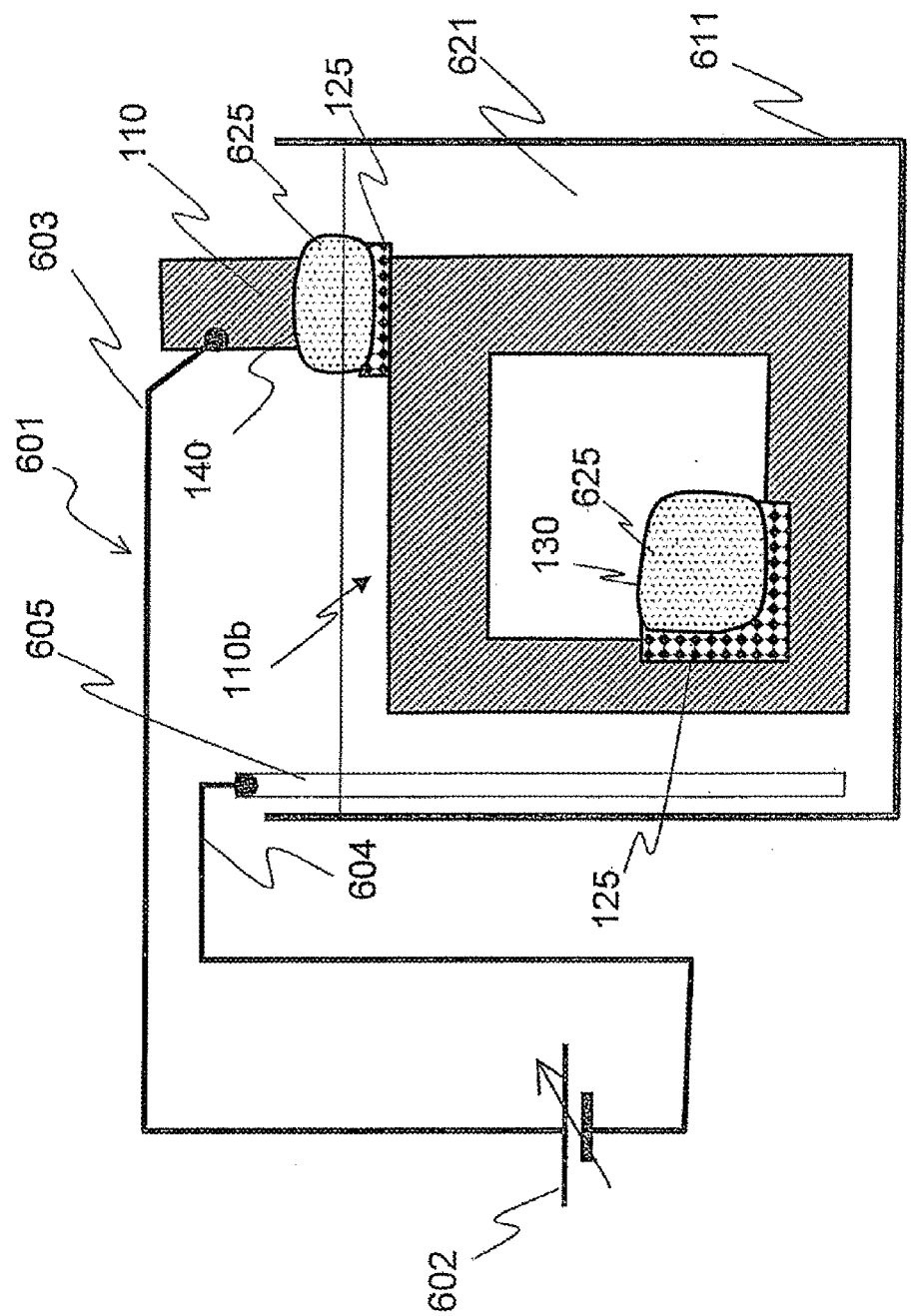
FIG. 13 is an explanatory diagram of the production process of the capacitive element.

As shown in FIG. 13, a chemical conversion tank 601 includes: a container 611, in which a chemical conversion solution 621, or a ammonium borate solution, is stored; a variable power supply 602; a positive electrode wiring 603, which is connected to the electrode 110 of a target object; a negative electrode plate 605, which sinks in the chemical conversion solution 621; and a negative electrode wiring 604, which connects the negative electrode plate 605 and the variable power supply 602. The structure $110_b$ is dipped in the chemical conversion solution 612, and the electrode 110 outside the chemical conversion solution 621 is connected to the positive electrode wiring 603. The output voltage of the variable power supply 602 is gradually increased; the output voltage value finally becomes 4V. On the surface of the electrode 110 which is in contact with the chemical conversion solution 621, a metal oxide film (aluminum oxide) with the applied voltage of 4V is formed as the dielectric layer 120. Therefore, a structure $110_c$ on the surface of which the dielectric layer 120 is formed is obtained.

[Cleaning Process (Step P4)]

Figure 14:
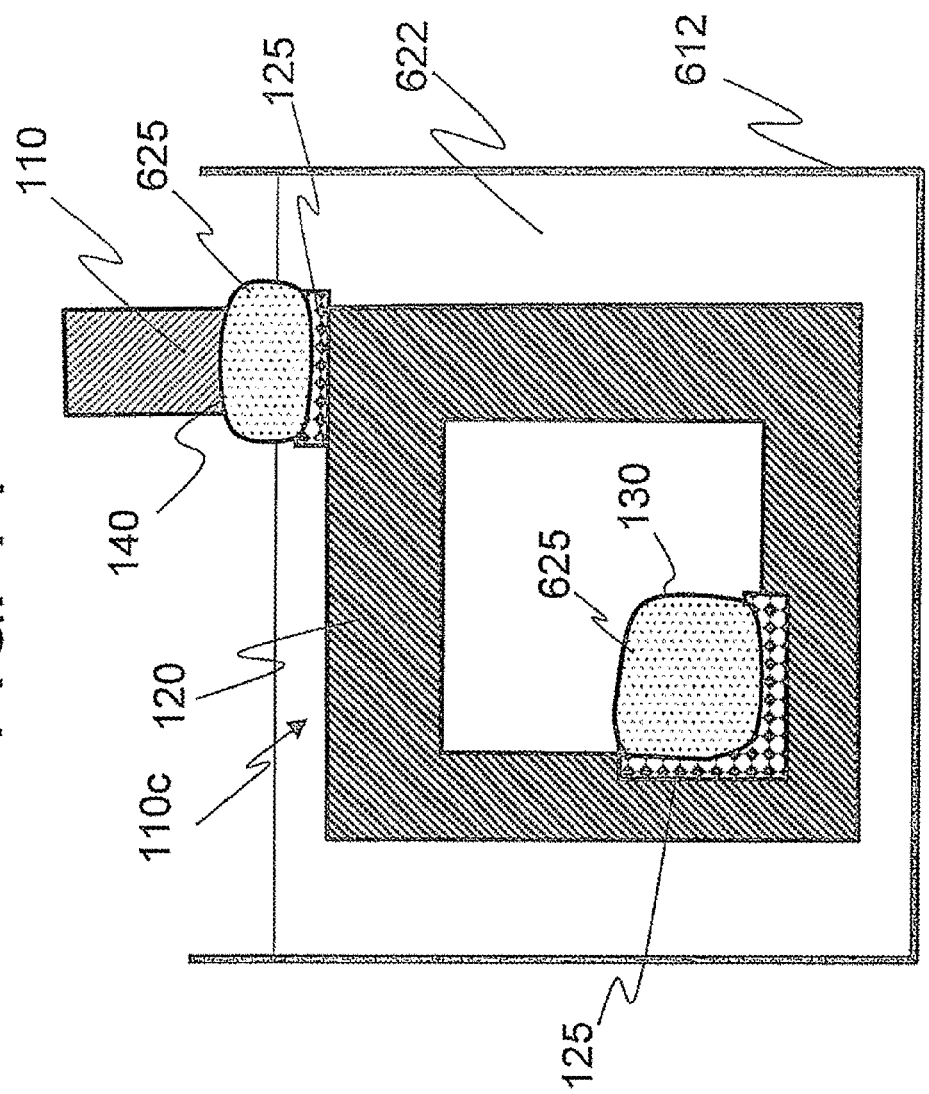
FIG. 14 is an explanatory diagram of the production process of the capacitive element.

As shown in FIG. 14, the chemical conversion solution 621 adhering to the structure $110_c$ is washed away by a cleaning fluid 622. According to the present embodiment, a container 612 is filled with the cleaning fluid (water) 622 into which the structure $110_c$ is dipped for 10 minutes for cleaning. The time for the structure $110_c$ to be dipped varies according to the size of the container 612 and the cleanliness factor of the cleaning fluid 622.

[Drying Process (Step P5)]

Figure 15:
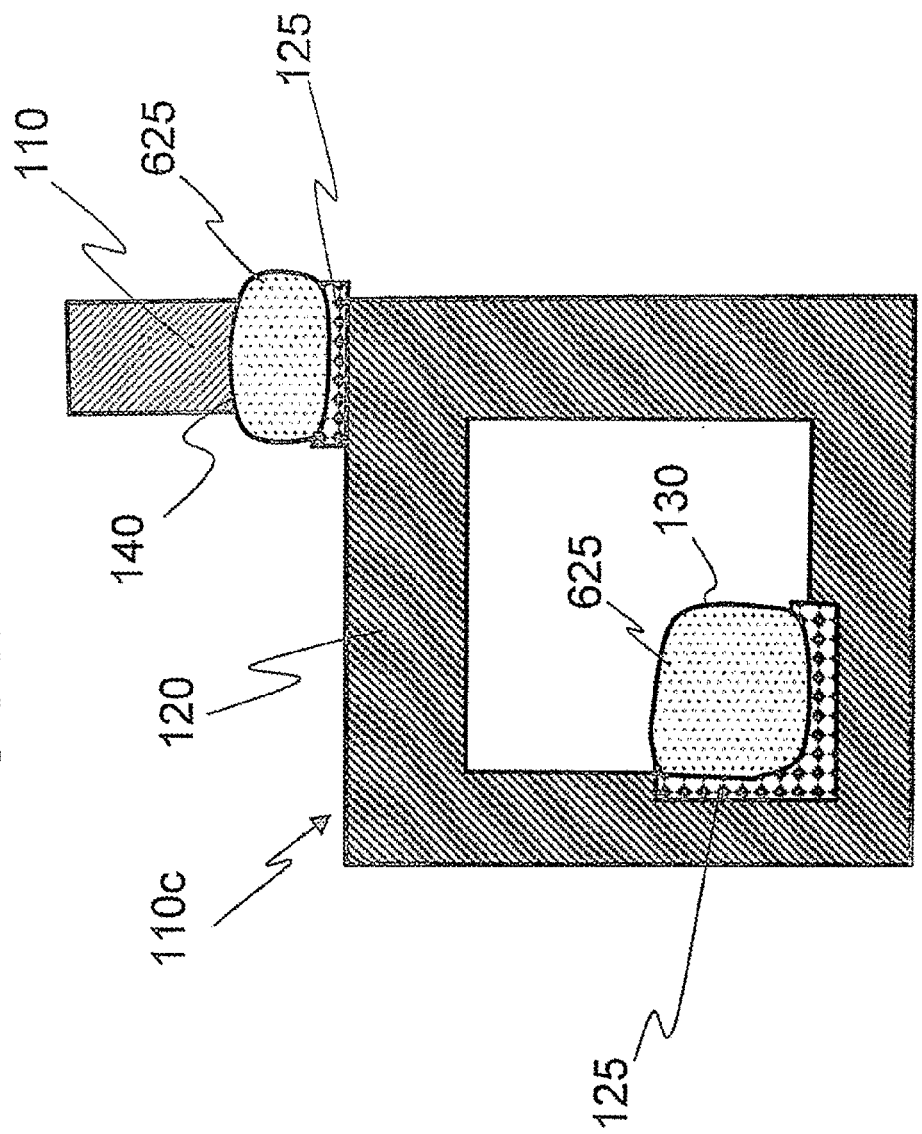
FIG. 15 is an explanatory diagram of the production process of the capacitive element.

A dry oven whose temperature is set at 110 degrees Celsius is used to evaporate the cleaning fluid 622 adhering to the cleaned structure $110_c$. As to the conditions for drying, there is no limitation on equipment to be used as long as the structure $110_c$ is dried. FIG. 15 shows the dried structure $110_c$.

[Oxidizing Agent Application Process (Step P6)]

Figure 16:
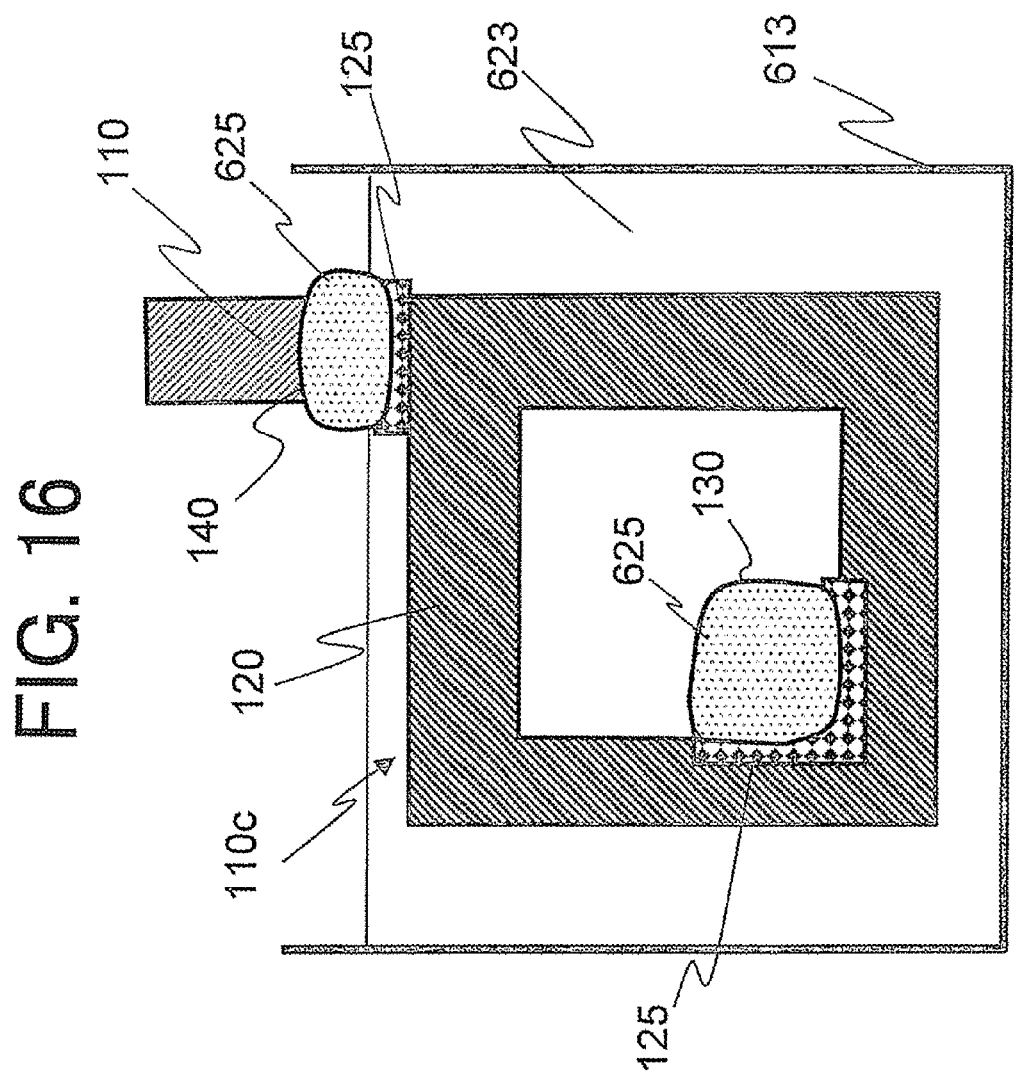
FIG. 16 is an explanatory diagram of the production process of the capacitive element.

An ethanol solution including ferric dodecylbenzenesulfonate whose concentration is 10% by mass is prepared as an oxidizing agent 623. As shown in FIG. 16, a container 613 is filled with the oxidizing agent 623 into which the structure $110_c$ is dipped. The structure $110_c$ is taken out from the oxidizing agent 623 and is dried in air at ambient temperature for 30 minutes; a structure $110f$ with the dielectric layer 120 to the surface of which the oxidizing agent 623 adheres is obtained.

[Conductive Polymer Formation Process (Step P7)]

Figure 17:
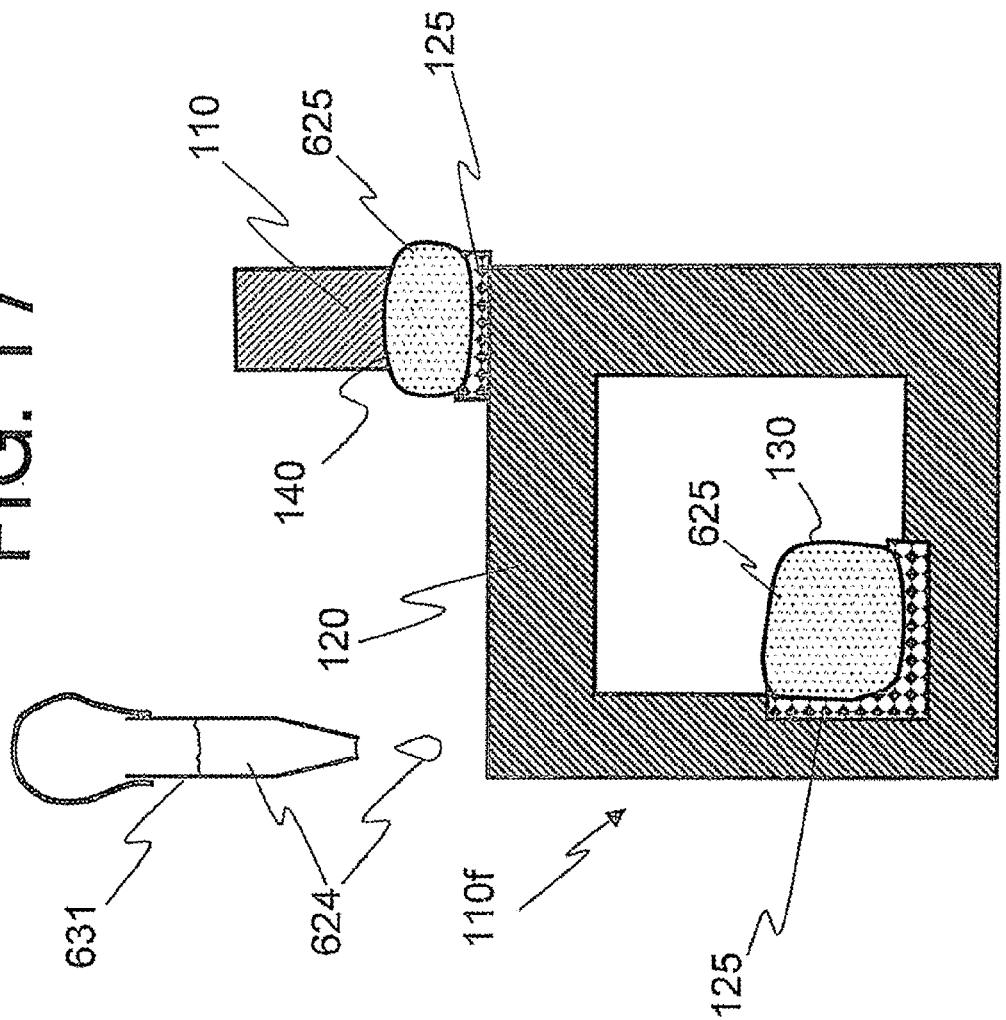
FIG. 17 is an explanatory diagram of the production process of the capacitive element.

Then, as shown in FIG. 17, an ethanol solution including a 10% by mass ethylenedioxythiophene (a monomer solution 624) falls in drops from a pipette 631 to the surface of the dielectric layer 120 of the structure $110f$, and is left in air for 30 minutes to polymerize polyethylenedioxythiophene. Therefore, a structure $110g$ on which the conductive polymer 112 is formed is obtained.

[Cleaning Process (Step P8)]

Figure 18:
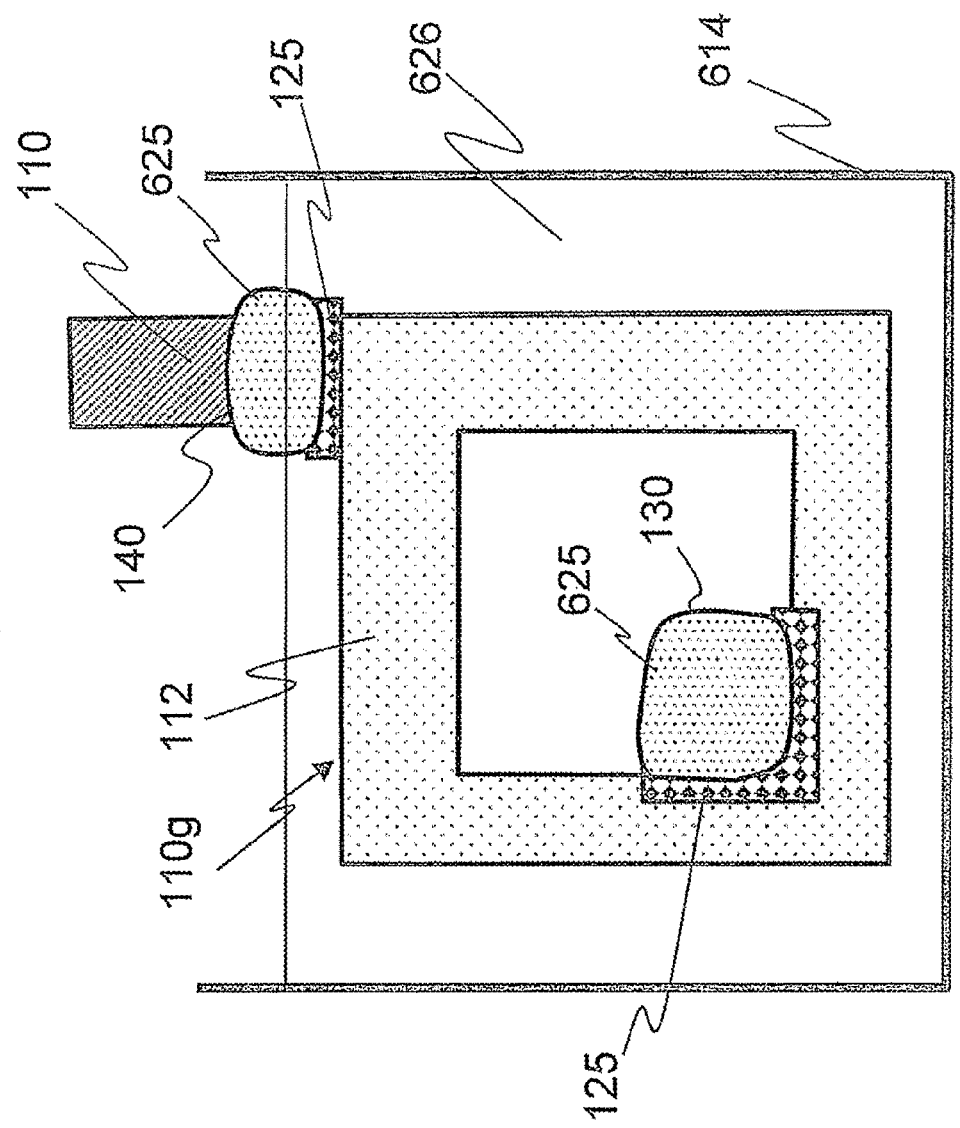
FIG. 18 is an explanatory diagram of the production process of the capacitive element.

As shown in FIG. 18, the structure $110g$ is put in a container 614 filled with a cleaning fluid 626 whose main compound is ethanol to wash away the unpolymerized substances. Incidentally, the cleaning fluid 626 is not limited to ethanol and can be anything as long as the unpolymerized substances and other by-product materials can be removed.

[Drying Process (Step P9)]

Figure 19:
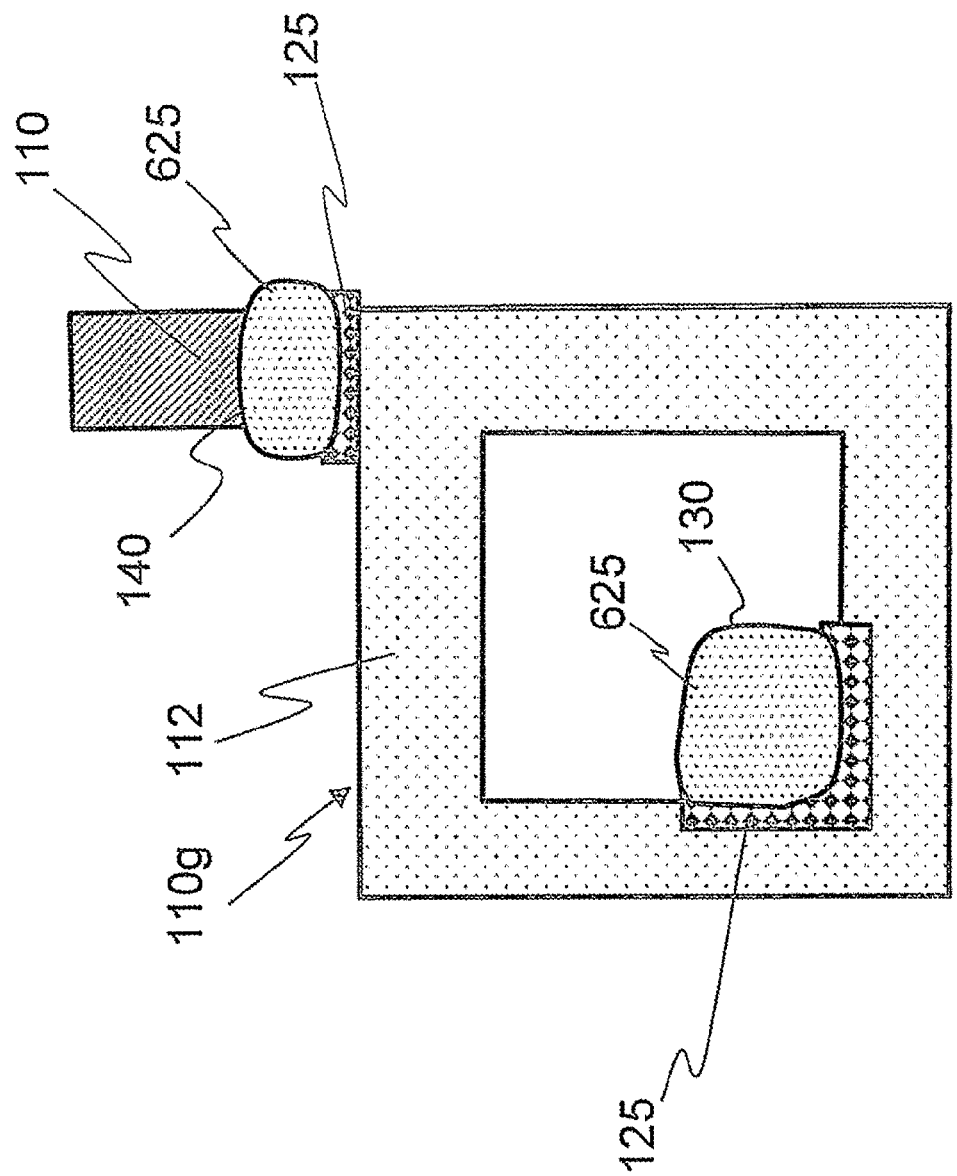
FIG. 19 is an explanatory diagram of the production process of the capacitive element.

A dry oven whose temperature is set at 80 degrees Celsius is used to evaporate the cleaning fluid. As shown in FIG. 10, until the conductive polymer 112 is sufficiently formed, the operation of the steps from P6 to P9 is repeated four times in order to cover the dielectric layer 120 with the conductive polymer. FIG. 19 shows a structure $110g$ on which the conductive polymer 112 is formed. Even though the operation is repeated four times according to the present embodiment, the number of repetition is not limited to four. However, if the number of repetition is too small, a portion where the conductive polymer is not formed may be left. If a pinhole appears at the portion of the dielectric layer, malfunction or an increase in leakage current could occur due to short circuits between the electrode and the opposite electrode. If the operation is repeated four times, malfunction arising from short circuits does not occur, and the leakage current can be reduced to a tolerable degree. However, depending on the material of the conductive polymer and the production conditions, the number of repetition varies; the operation should be repeated appropriately to prevent products from malfunctioning due to short circuits.

According to the present embodiment, the formed conductive polymer has a function to insulate a high current path by generating heat when a high current flows. That is, the formed conductive polymer has a defect repairing function and a short-circuit prevention function. Therefore, the capacitive formation portion 100 having a layer of the conductive polymer 112 with no defect in the insulating layer is obtained.

[Carbon Paste Application Process (Step P10)]

Figure 20:
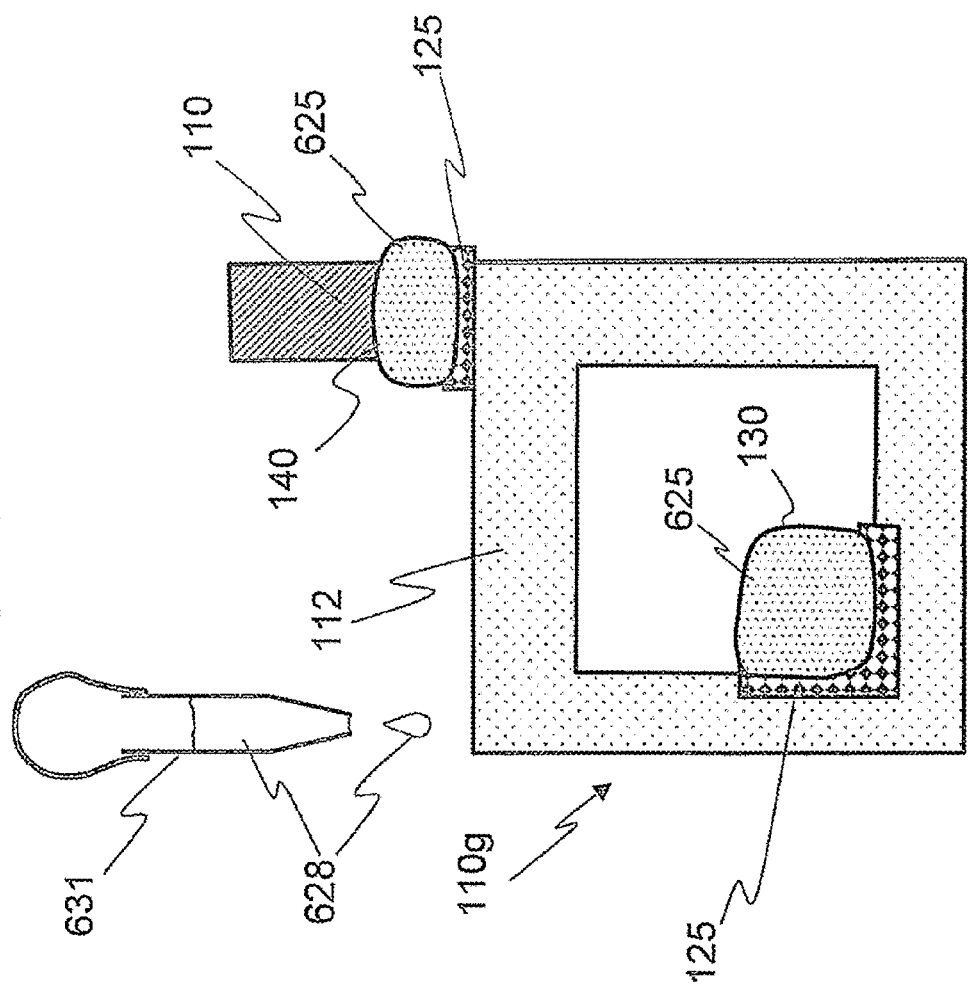
FIG. 20 is an explanatory diagram of the production process of the capacitive element.

To the capacitive formation portion 100 (the formation portion of the conductive polymer 112) of the structure $110g$ on which the conductive polymer 112 is formed, as shown in FIG. 20, a carbon paste 628 containing carbon graphite is applied, and is dried at ambient temperature. Therefore, a structure $110j$ to the surface of which the carbon graphite 113 is applied is obtained.

[Silver Paste Application Process (Step P11)]

Figure 21:
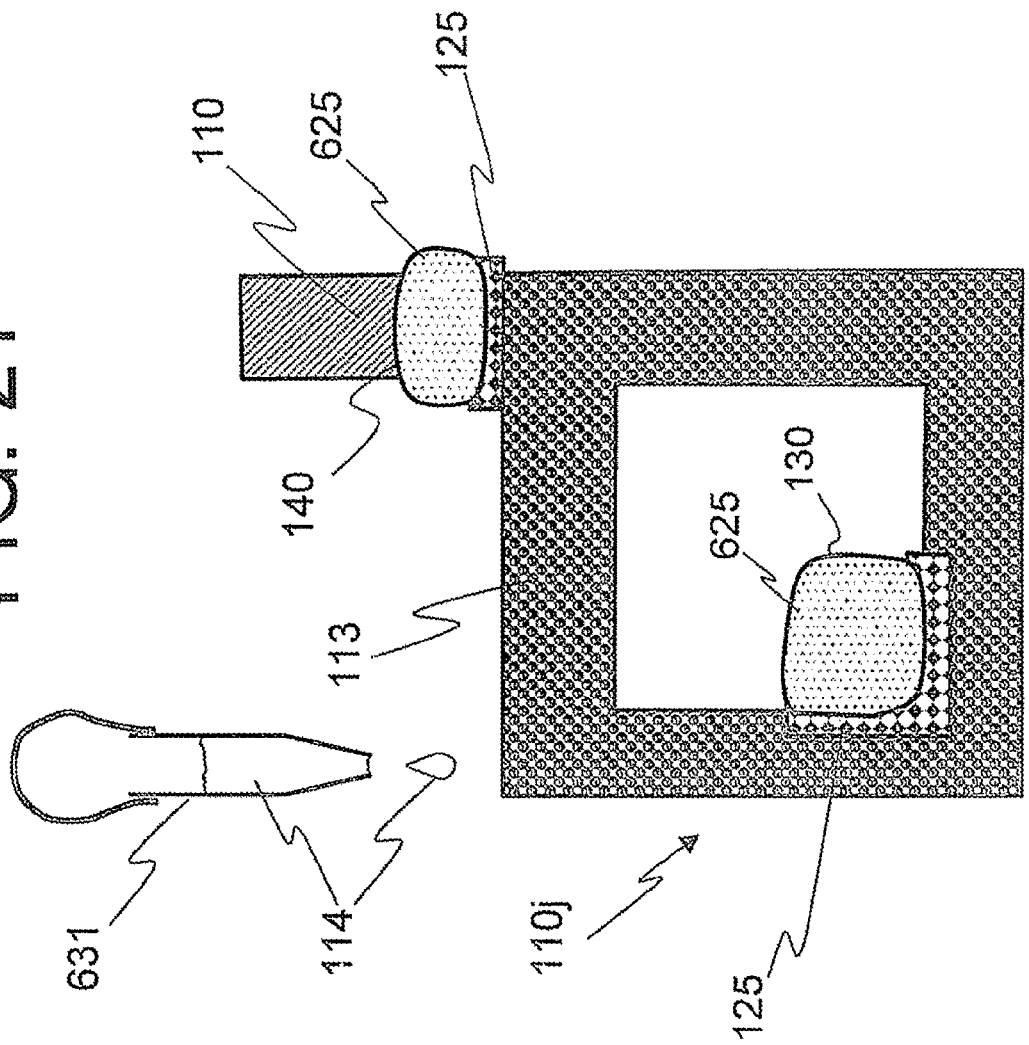
FIG. 21 is an explanatory diagram of the production process of the capacitive element.

As shown in FIG. 21, a silver paste 114 is applied to the structure $110j$ (Silver Paste Application).

[Drying Process (Step P12)]

Figure 22:
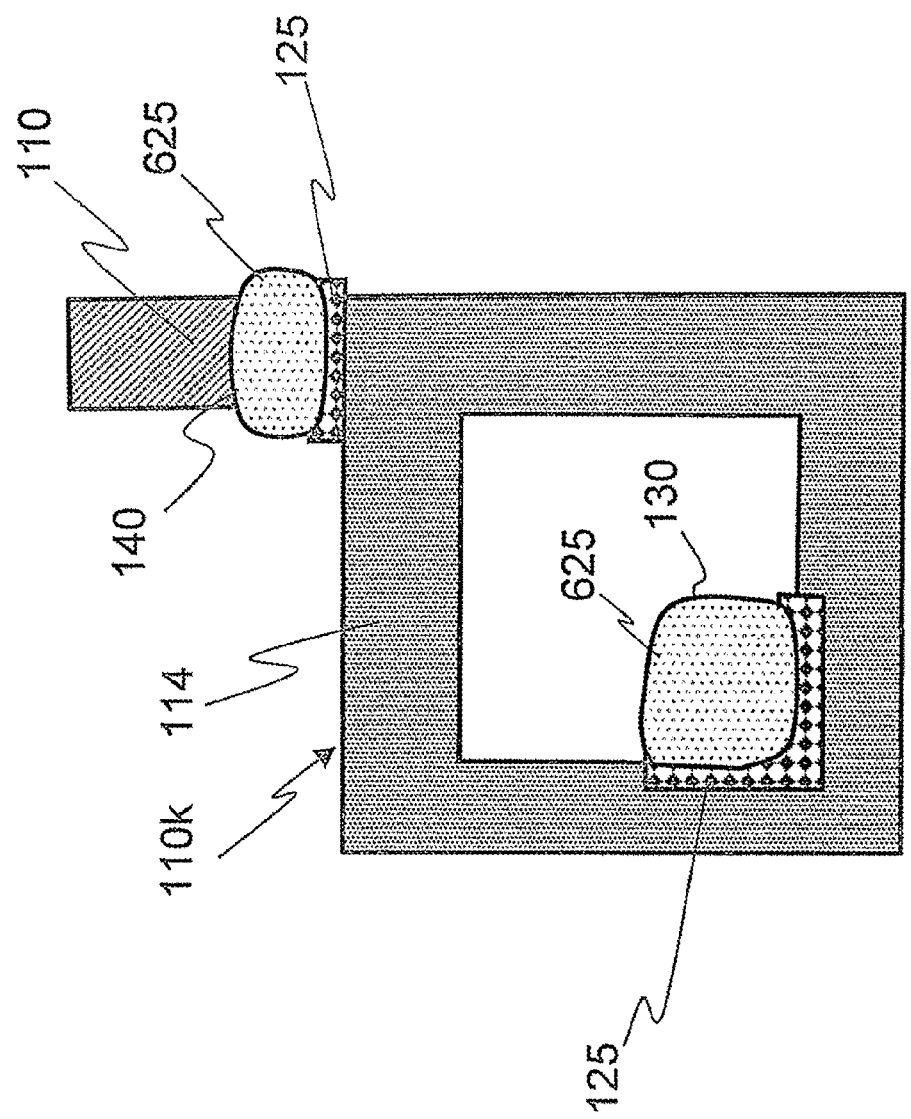
FIG. 22 is an explanatory diagram of the production process of the capacitive element.

Then, the structure $110j$ is dried at 60 degrees Celsius for 15 minutes, and is left at ambient temperature for 24 hours. As a result of the above procedures, obtained is a structure $110k$ having the dielectric layer 120 on which the conductive polymer 112 and the opposite electrode 111 including the carbon graphite 113 and the silver paste 114 are formed. FIG. 22 shows the structure $110k$ on the surface of which the silver paste 114 is formed as a result of the drying process.

[Re-chemical Conversion (Dielectric Layer Repairing) Process (Step S13)]

Figure 23:
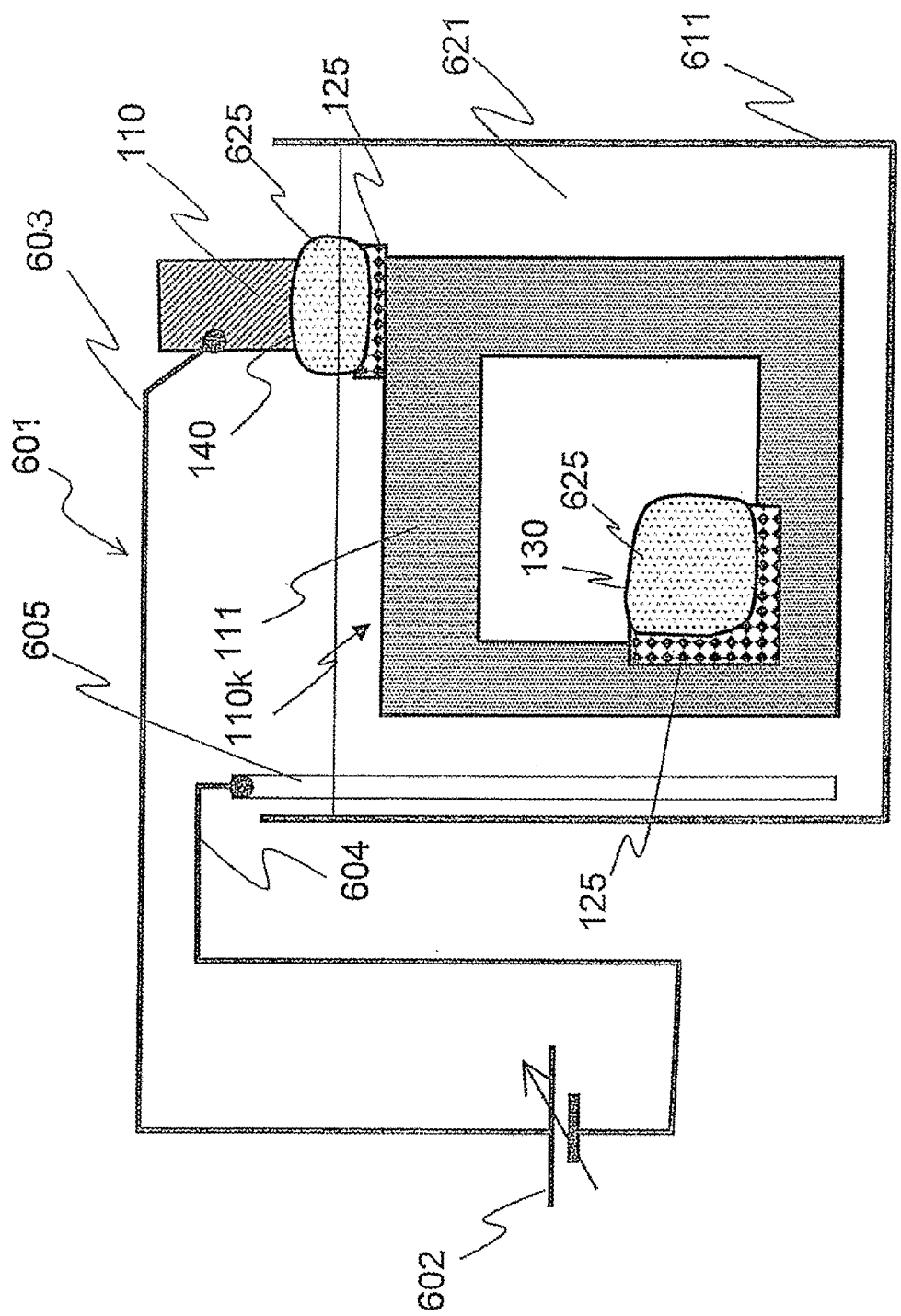
FIG. 23 is an explanatory diagram of the production process of the capacitive element.

In order to repair the damaged dielectric layer 120, as shown in FIG. 23, the structure $110k$ is put in the same chemical conversion tank 601 as the one used at Step P3. In a similar way to Step P3, the applied voltage gradually increases, and finally reaches 4V.

[Cleaning Process (Step P14)]

Figure 24:
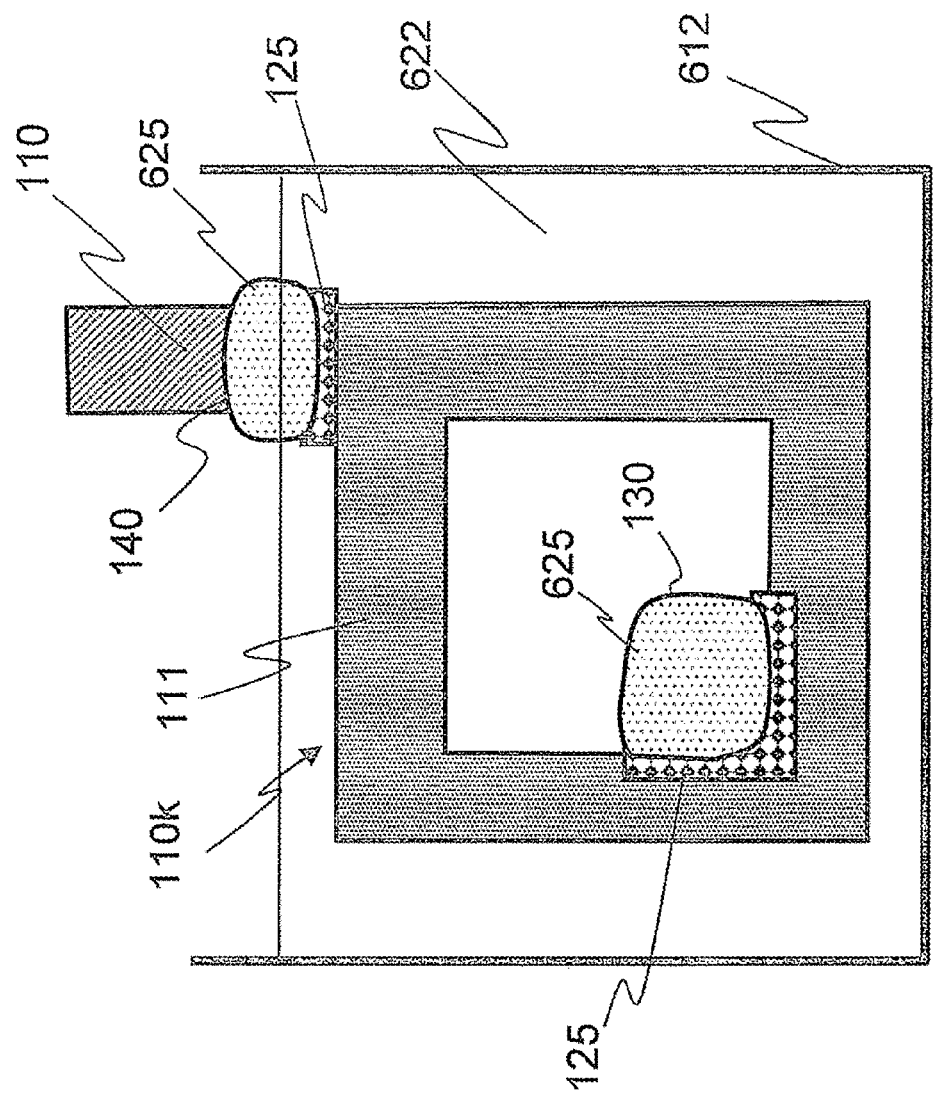
FIG. 24 is an explanatory diagram of the production process of the capacitive element.

As shown in FIG. 24, in a similar way to Step S4, the chemical conversion solution 621 adhering to the structure $110k$ is washed away by the cleaning fluid 622.

[Drying Process (Step P15)]

Figure 25:
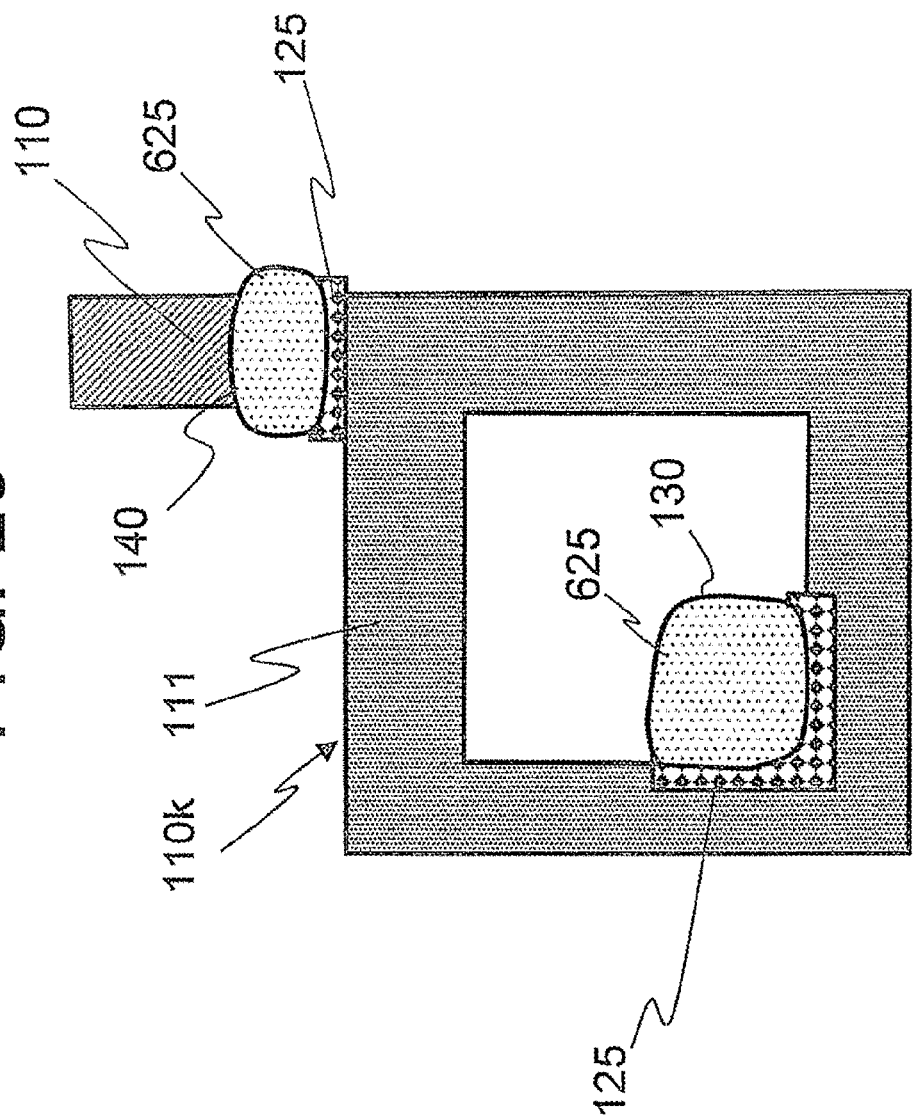
FIG. 25 is an explanatory diagram of the production process of the capacitive element.

As shown in FIG. 25, in a similar way to Step P5, the cleaning fluid 622 adhering to the cleaned structure $110k$ is evaporated.

[Mask Resin Removal Process (Step P16)]

Figure 26:
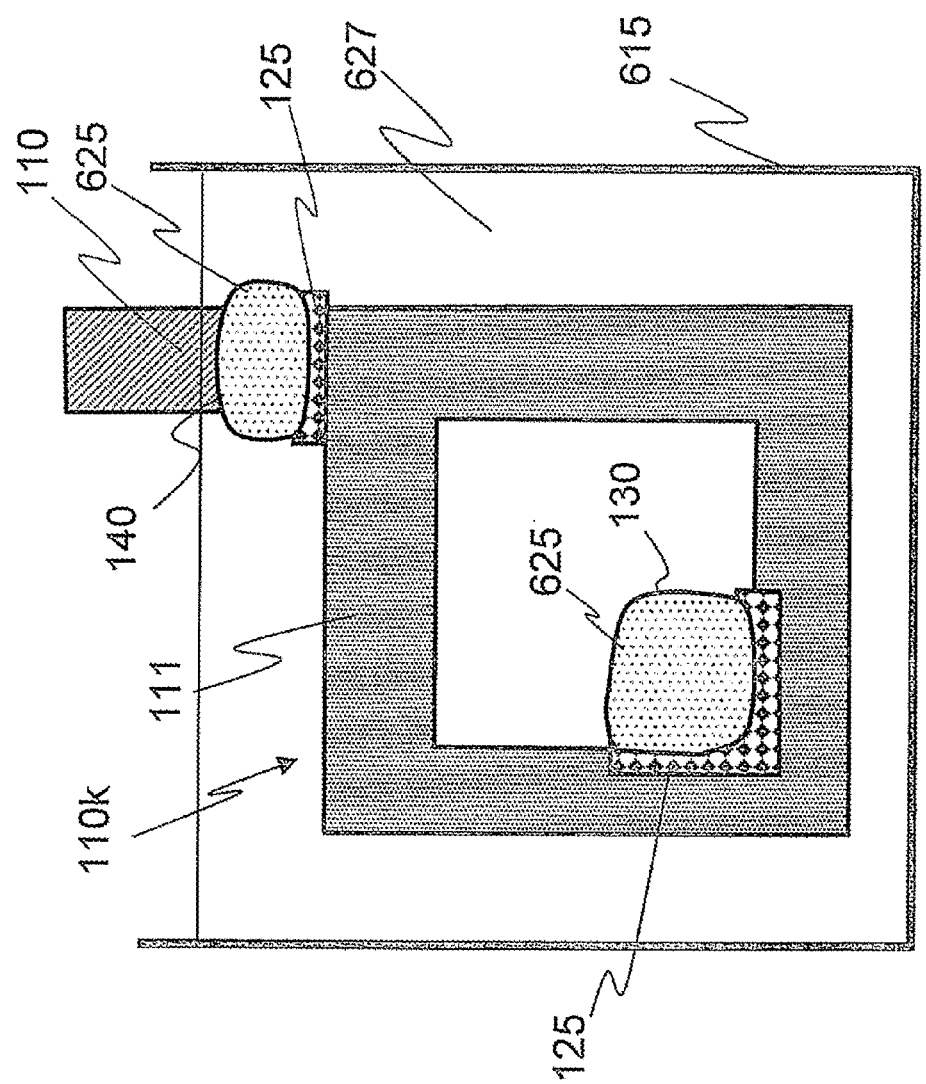
FIG. 26 is an explanatory diagram of the production process of the capacitive element.

As shown in FIG. 26, the structure 110k is dipped in a removal fluid 627, or tetrahydrofuran, in a container 615 to cause the mask resin 625, or hexafluoropropylene, to dissolve, exposing the electrode 110, the internal circumference outgoing terminal 130, and the outer circumference outgoing terminal 140. The conductive polymer 112, the carbon graphite 113, and the silver paste 114 that are adhering to the surface of the mask resin 625 are removed along with the mask resin 625.

[Electrode Unnecessary Portion Cutting Process (Step P17)]

Figure 27:
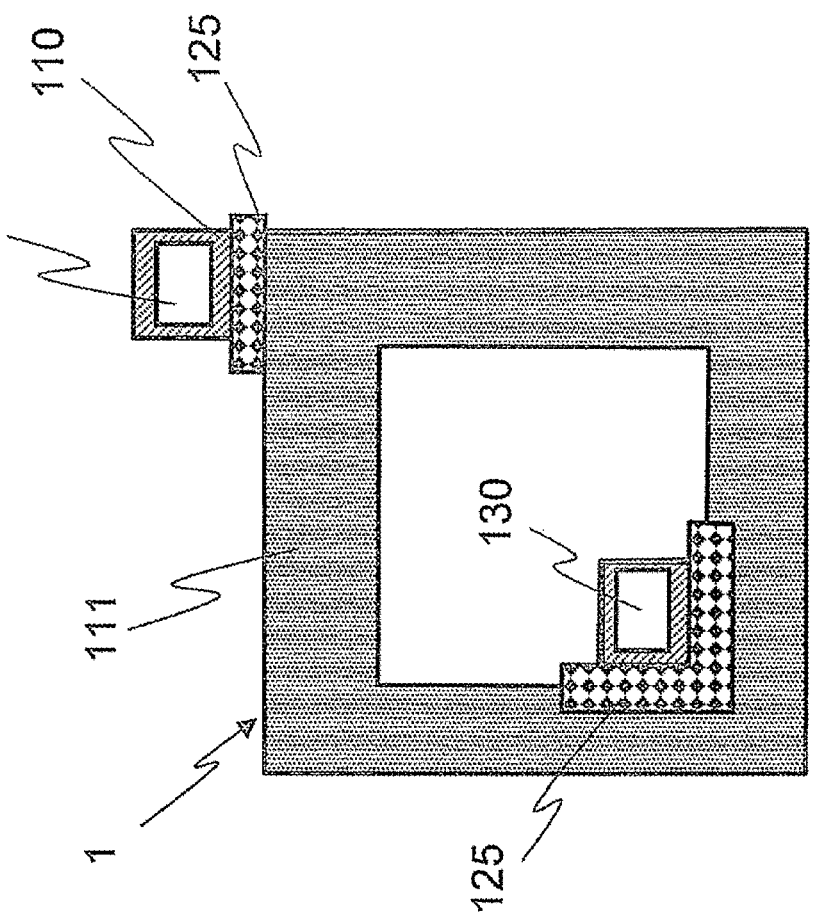
FIG. 27 is an explanatory diagram of the production process of the capacitive element.

Finally, as shown in FIG. 27, the electrode 110 that remains uncut is cut off, and the capacitive element 1 is obtained.

Incidentally, according to the present embodiment, the capacitance of the test-manufactured capacitive element 1 is about 500 microfarads.

Here, the dielectric layer may be an insulating dielectric layer made of resin instead of a metal oxide film, and is not limited to a specific material. The electrode 110 is a metal (aluminum) having a valve action in order to obtain a metal oxide film. However, depending of the dielectric layer selected, a metal not having a valve action or a conductive substance may be used. Here, valve action means that a dielectric withstanding voltage is there when a voltage is applied in one direction, while the dielectric withstanding voltage is lost when the voltage is applied in the opposite direction. The metal having a valve action is a metal by which a metal oxide film having a valve action can be formed. The materials to be used, other than a metal having a valve action, include copper, iron, brass, and the like. In this case, copper is formed as the electrode, and copper oxide is formed on the surface of the electrode as a dielectric material. Moreover, the electrode may be copper, iron, or brass, while the dielectric material may be a tartaric-acid ferroelectric material, a phosphate ferroelectric material, or a titanate ferroelectric material. As to the titanate ferroelectric material, barium titanate, barium titanate ceramics, barium titanate solid solution ceramics (such as strontium titanate "$SrTiO_3$" and barium titanate "$BaTiO_3$") demonstrate good characteristics as dielectric materials.

Moreover, if the defect of the dielectric layer 120 is permissible, the opposite electrode 111 just needs to have conductivity, and the material having the defect repairing function or the short-circuit prevention function does not have to be selected. The conductive polymer is not limited to polyethylenedioxythiophene but may be one or more chemical compounds selected from a group including polypyrrole, polythiophene, and polyaniline, or may be dielectric materials of the chemical compounds. The opposite electrode 111 and the electrode 110 may be made from a plurality of conductive materials. Like the present embodiment, the opposite electrode 111 may be a multi-layer structure including a conductive polymer, carbon graphite, and a silver paste. Needless to say, the opposite electrode 111 may be made from one material. The electrode 110, for example, may be an electrode having a two-layer structure whose core is copper with the core's surface covered with aluminum. If the metal having a valve action is a metal selected from a group including aluminum, tantalum, niobium, and titanium, the metal is industrially stable. However, other metals having a valve action can be used because the electrical characteristics can be obtained. The mask resin and the resin for masking can be made from any material as long as the mask resin and the resin for masking can provide electrical isolation and protect the surface of the electrode against chemicals and the material satisfies mechanical and thermal conditions. Moreover, the internal circumference outgoing terminal 130 and the outer circumference outgoing terminal 140 do not have to be added as new components. Part of the surface of the electrode 110 can be substituted for the internal circumference outgoing terminal 130 and the outer circumference outgoing terminal 140. According to the present embodiment, an aluminum plate to which an etching process was applied is used as the electrode 110. Thanks to the etching process, the surface of the aluminum plate was roughened, and there are tiny concavities and convexities in countless numbers which can not be seen with the naked eye. In the diagram, in order to make the structure easy to understand, detailed drawings are omitted, and a simple plate is shown. Accordingly, as to the shape of the electrode 110, it is effective to have, rather than a plate having the smooth surface, a plate having tiny concavities and convexities, a plate having large concavities and convexities which can be seen with the naked eye, a corrugated plate, or a combination of the plates, in order to create more surface area.

FIG. 28 shows a characteristic curve 501 of the capacitive element according to the first embodiment of the present invention, a characteristic curve 502 of a shield-strip-line-type element, and a characteristic curve 503 of a conventional dual-terminal ceramic capacitor (0.1 microfarads). Here, each sample is mounted on a line having a characteristic impedance of 50 ohms, and the characteristic curve is obtained from electric transmission characteristics. The shield-strip-line-type element with the characteristic curve 502 was made on a trial basis according to the method disclosed in Patent Document 1: An aluminum foil of an expansion magnification of surface area of about 200 was used in the capacitive formation portion of 4-mm wide and 5-mm long. The capacitance was 56 microfarads. The conventional dual-terminal ceramic capacitor was a 1608-type chip ceramic capacitor, 1.6 mm×0.8 mm, whose capacitance was 0.1 microfarads. The capacitive element of the first embodiment and the shield-strip-line-type element were inserted into the middle of the 50-ohm line for measuring. The two terminals of the ceramic capacitor were connected to a signal line of the 50-ohm line and the ground, respectively, and were electrically connected in parallel for measuring. The horizontal axis of the characteristic curves represents frequency, with mega hertz (MHz) as a log scale. The vertical axis represents suppression in decibel (dB) as an ability to reduce the high-frequency power (noise): The figure is the inverse of an electric transmission value (S21) of a scattering parameter, and the suppression ability is higher as the figure increases. As to the characteristic curves 502 and 501, a copper plate with thickness of 0.2 mm was used as the ground plate of a measurement system. The negative electrode of the element (the opposite electrode in the present embodiment) was bonded to the ground plate with the silver paste. According to the present embodiment, evaluation was carried out with the electrode 110 to which the signal line extending from a measuring instrument was connected by the silver paste. It is considered that the deterioration of characteristics in high frequencies was caused by the formation of a bypass which was caused by the excitation of the entire measurement substrate mounted: The excitation was attributable to the occurrence of differential-mode-commono-mode conversion arising from the characteristic impedance discontinuity of the high-frequency signal line in a state where the substrate was mounted. In the actual substrate, high frequencies get around a decoupling element according to the same mechanism. Therefore, the above measurement can carry out characteristic evaluation in high frequencies.

The capability of the ceramic capacitor peaks at several dozen MHz and deteriorates in a high-frequency range 513.

As to the characteristic curve 502, the characteristic deteriorates in a high-frequency range 512. Meanwhile, as to the characteristic curve 501 of the capacitive element of the present embodiment, the characteristic deteriorates in a high-frequency range 511. However, compared with the characteristic curves 502 and 503, the characteristic curve 501 demonstrates exceptional characteristics.

Since the ceramic capacitor has a dual-terminal structure, inductance components become dominant in the high-frequency range 513 because the impedance of the terminal becomes lager as the frequency becomes higher. On the other hand, as to the shield-strip-line-type element, the cause is that a path (spatial coupling) bypassing the element cannot be ignored. On the contrary, according to the present embodiment, since the opposite electrode 111 is connected to the ground, a shield wall is formed. Therefore, it is considered that the high performance is maintained even in the high frequency 511.

Incidentally, an error (such as noise figure) arising from the measurement system is also considered a remote cause of the deterioration of characteristics in the high frequency 511. There is a possibility that the capability of the present embodiment is also demonstrated even in high frequencies. It is obvious from FIG. 28 that in high-frequency power of 100 kHz to several MHz, the capacitive element of the present embodiment demonstrated the effect that was substantially equal to that of the shield-strip-line-type element and superior to that of the conventional dual-terminal ceramic capacitor, and the exceptional effect was confirmed in high-frequency power of from 10 MHz to several GHz. Moreover, the capability was also demonstrated even at several dozen GHz. Since there are regulations related to unwanted electromagnetic waves of electronics devices, the use of high-frequency power that is conducted through a cable such as a power line is regulated within a range of 150 kHz to 30 MHz. The high-frequency power emitted from electronics devices is regulated within a range of 30 MHz to 1 GHz in Japan, and a range of 30 MHz to 40 GHz in the United States. Moreover, considering the fact that the high-frequency power of several dozen GHz, like a millimeter wave radar, is also subject to the regulations, it is possible to suppress the high-frequency power of 10 kHz to about 100 GHz using the capacitive element of the present embodiment. Since the basic configuration is the same for second to fifth embodiments described below, the second to fifth embodiments have the same effect in the same frequency range. From the characteristics curves, in the conventional capacitor or strip-line-type element, it was confirmed that since there was a bypass of the high-frequency power (electromagnetic waves) due to the inductance arising from the structure of the terminal or the structure made without consideration for shielding, the performance of suppressing the high-frequency power in a high frequency range of several hundred MHz from more than several GHz decreases. Since the capacitive element of the present embodiment surrounds a circuit generating the high-frequency power, the capacitive element can prevent the high-frequency power from going outside. Moreover, since the capacitive element of the present embodiment surrounds a circuit that needs to be protected from the high-frequency power, the capacitive element can prevent the high-frequency power from being input from the outside. The capacitive element of the present embodiment is expected to demonstrate the effect especially in the case where the high-frequency power should be prevented from going outside a generation circuit when a printed wiring board or electronics device having the generation circuit generating the high-frequency power of several hundred MHz to more than several GHz is particularly used, or in the case where the high-frequency power should be prevented from entering a delicate circuit whose function should not be damaged by disturbance. The same effect can be obtained even when the capacitive elements of the second to fifth embodiments, described later, are used.

For example, as shown in FIG. 29, when the capacitive element 1 of the present invention is applied to CPU 903 of a mother board 902 of a notebook personal computer 901, the capacitive element 1 is inserted midway between a power wiring (+) and a power wiring (−) of the CPU 903 and a board power supply 904. FIG. 30 shows a block diagram of this case. Here, the power wiring (−) is placed on the ground. The CPU 903 is disposed inside an opening of the capacitive element 1 (an opening of the capacitive formation portion). The internal circumference outgoing terminal 130 of the capacitive element and the CPU 903 are connected via the power wiring (+). Then, the outer circumference outgoing terminal 140 of the capacitive element 1 and the board power supply 904 are connected via the power wiring (+). Since the capacitive element 1 is between the CPU 903 and the board power supply 904 to suppress the high-frequency power generated at the CPU 903, the propagation of the high-frequency power toward the board power supply 904 is effectively suppressed.

Moreover, FIG. 31 shows an example of the case where the capacitive element 1 is applied to a cellular phone. On a printed board 912 of a cellular phone 911, an audio processing circuit 913, a board power supply 914, and a transmitting circuit 915 are mounted. When power is commonly supplied from the board power supply 914 to the audio processing circuit 913 and the transmitting circuit 915, the high-frequency power (noise) generated at the transmitting circuit 915 that carries out transmission to an antenna 916 using a large amount of power is at several GHz today. There is a possibility that the propagation of the high-frequency power through the power wiring hampers the function of the audio processing circuit 913. Therefore, the audio processing circuit 913 is disposed inside the opening of the capacitive element 1 (the opening of the capacitive formation portion), and the internal circumference outgoing terminal 130 of the capacitive element and the audio processing circuit 913 are connected via the power wiring. Then, the outer circumference outgoing terminal 140 of the capacitive element 1 and the transmitting circuit 915 are connected via the power wiring. Therefore, it is possible for the capacitive element 1 to effectively protect the audio processing circuit against disturbance arising from the transmitting circuit 915.

Second Embodiment

In the above-mentioned embodiment, one first projecting portion and one internal circumference outgoing terminal 130 are provided at the inner circumference of the capacitive formation portion, and one second projecting portion and one outer circumference outgoing terminal 140 are provided at the outer circumference of the capacitive formation portion. However, there may be a plurality of the first projecting portions, a plurality of the internal circumference outgoing terminals 130, a plurality of the second projecting portions, and a plurality of the outer circumference outgoing terminals 140.

The present embodiment shows the case where four first projecting portions of the electrode 110 and four internal circumference outgoing terminals 130 are provided at the inner circumference of the capacitive formation portion 100, and four second projecting portions of the electrode 110 and four outer circumference outgoing terminals 140 are provided at the outer circumference of the capacitive formation portion 100.

Figure 32:
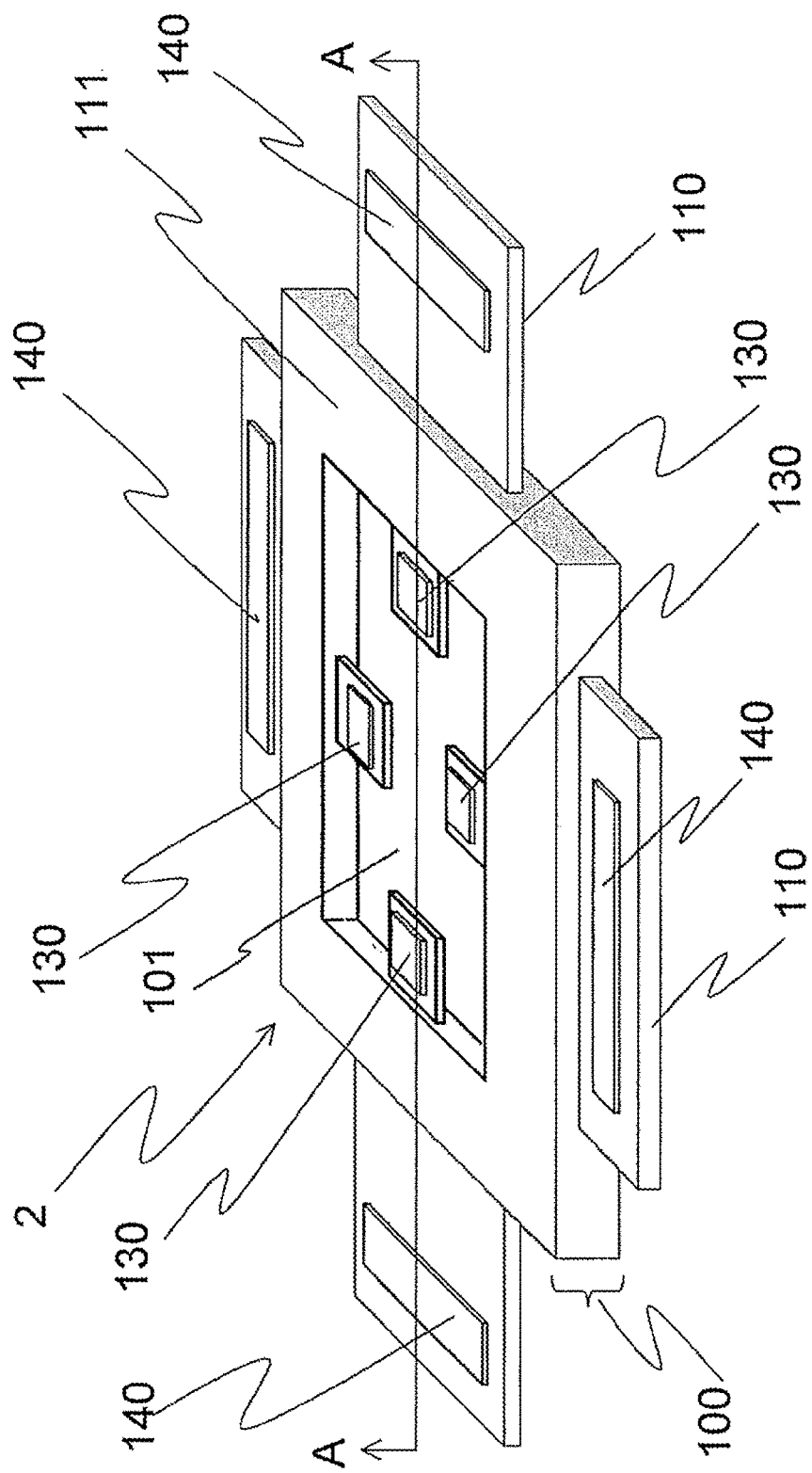
FIG. 32 is a perspective view of a capacitive element according to a second embodiment of the present invention.
Figure 33:
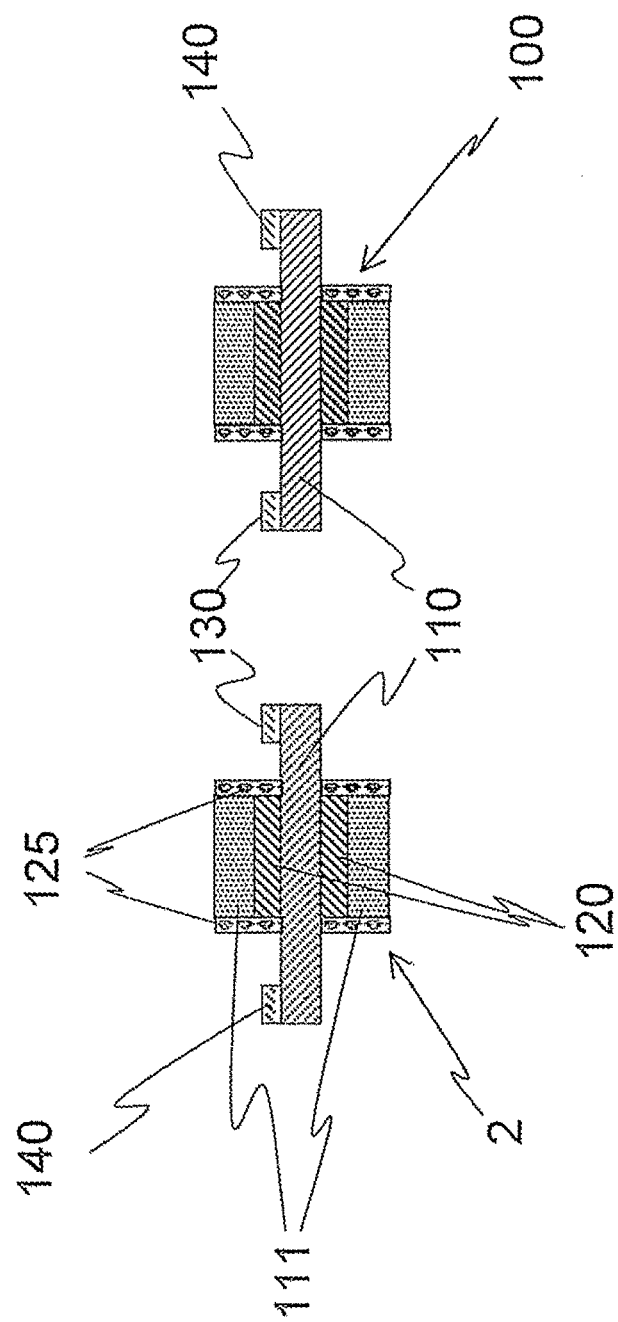
FIG. 33 is a cross-sectional view of FIG. 32 taken along the line A-A.
Figure 34:
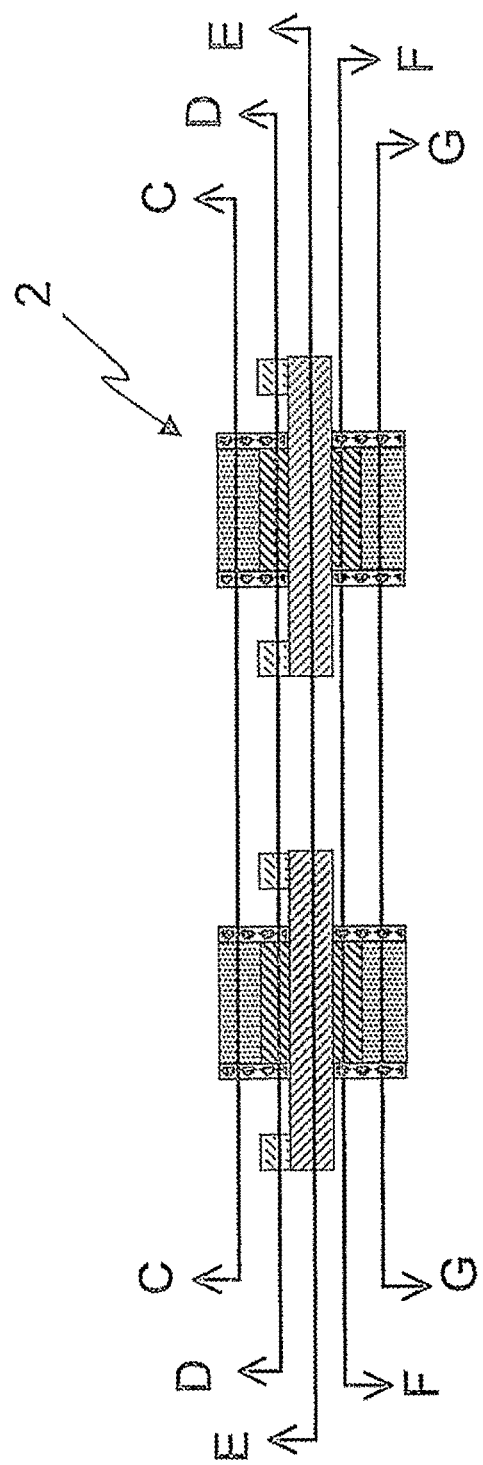
FIG. 34 is a cross-sectional view of FIG. 32 taken along the line A-A to illustrate the positional correlation in transverse section of each layer.
Figure 35:
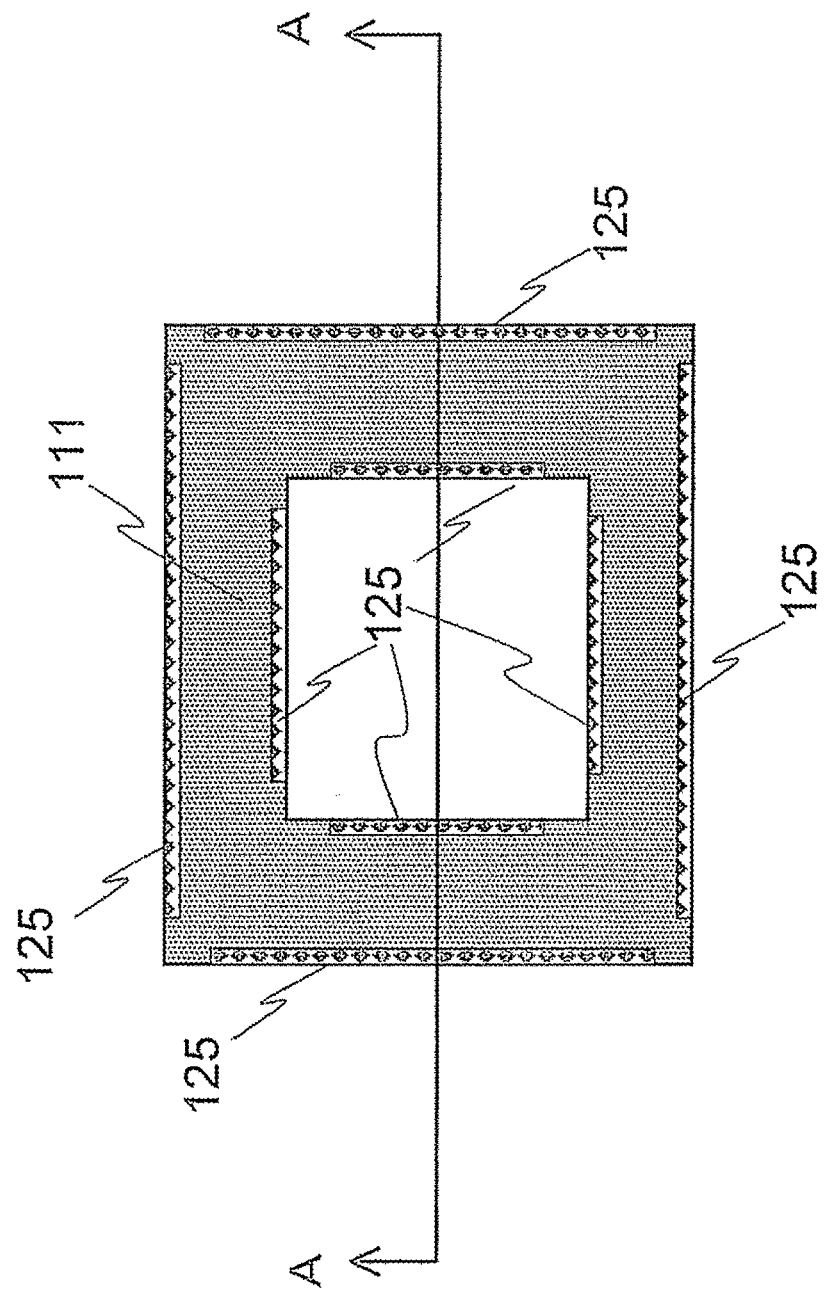
FIG. 35 is a cross-sectional view of FIG. 34 taken along the line C-C.
Figure 36:
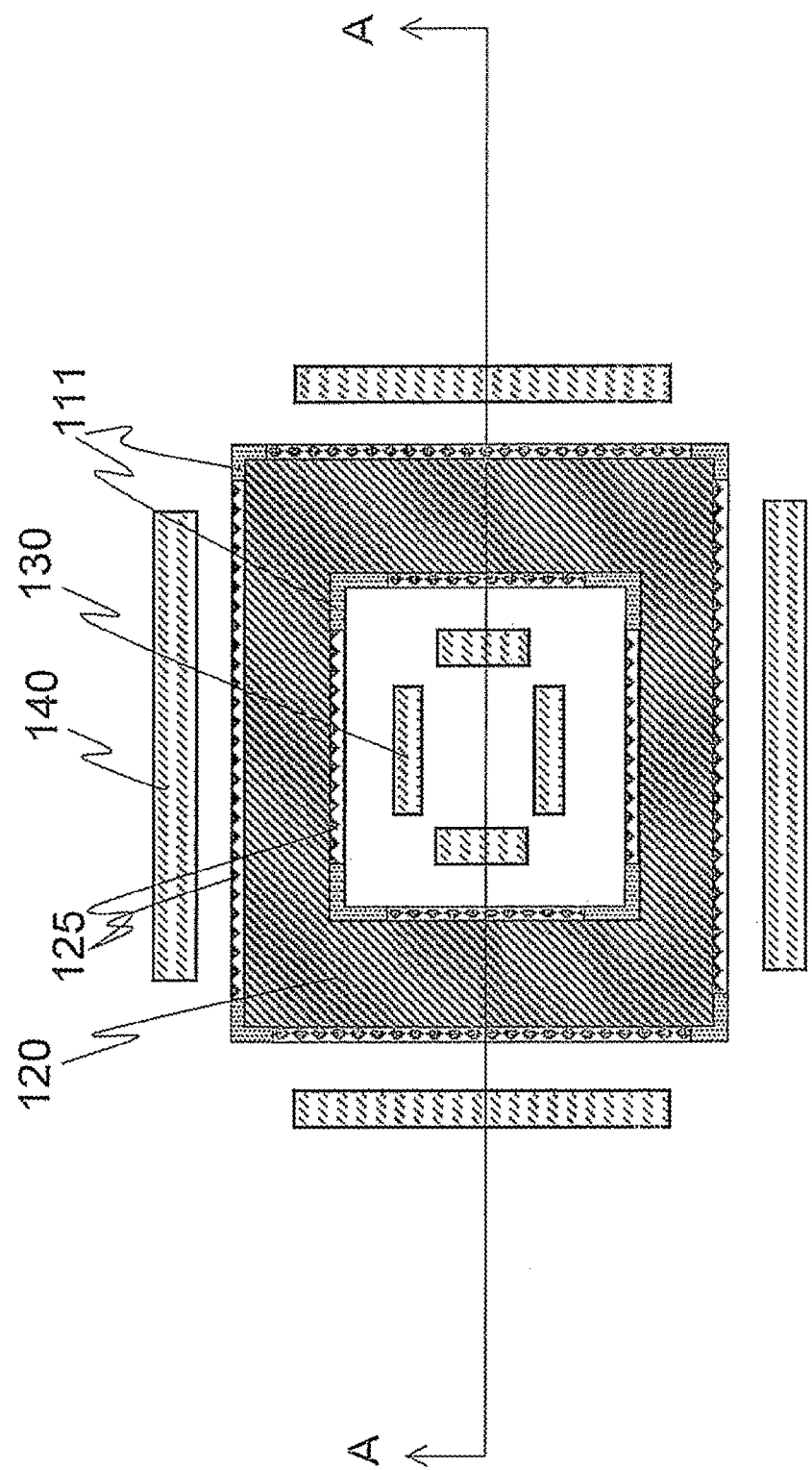
FIG. 36 is a cross-sectional view of FIG. 34 taken along the line D-D.
Figure 37:
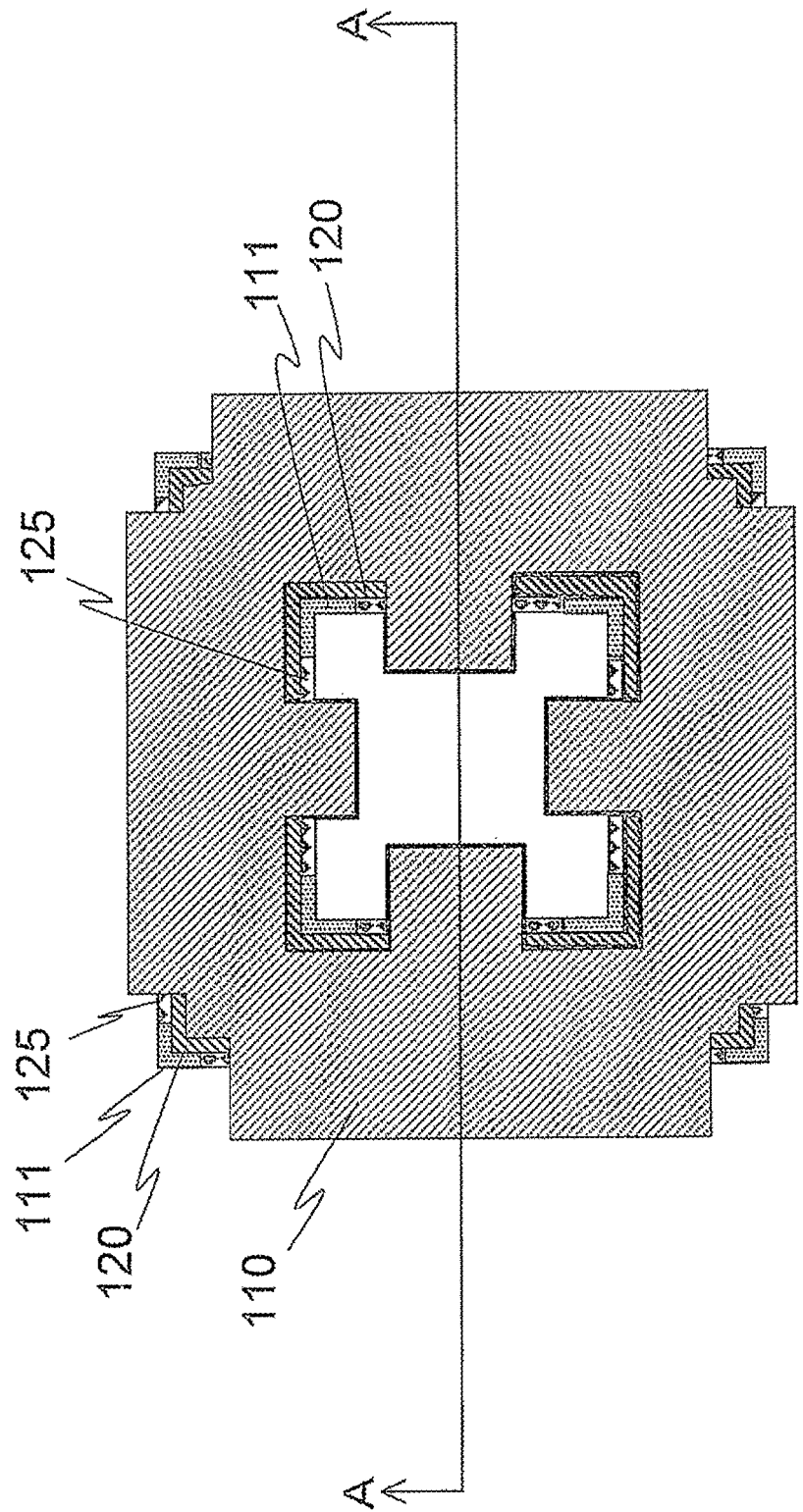
FIG. 37 is a cross-sectional view of FIG. 34 taken along the line E-E.
Figure 38:
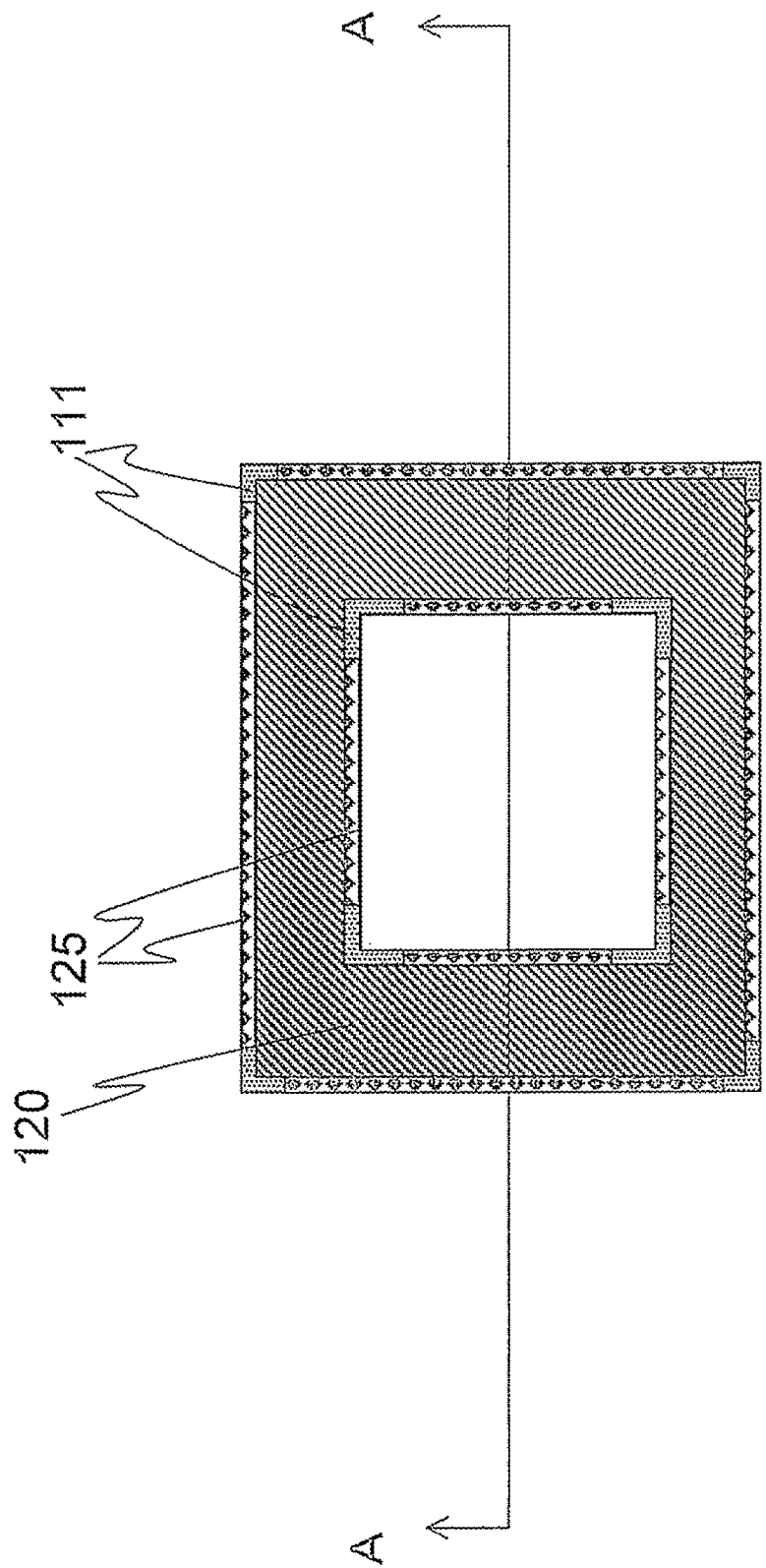
FIG. 38 is a cross-sectional view of FIG. 34 taken along the line F-F.
Figure 39:
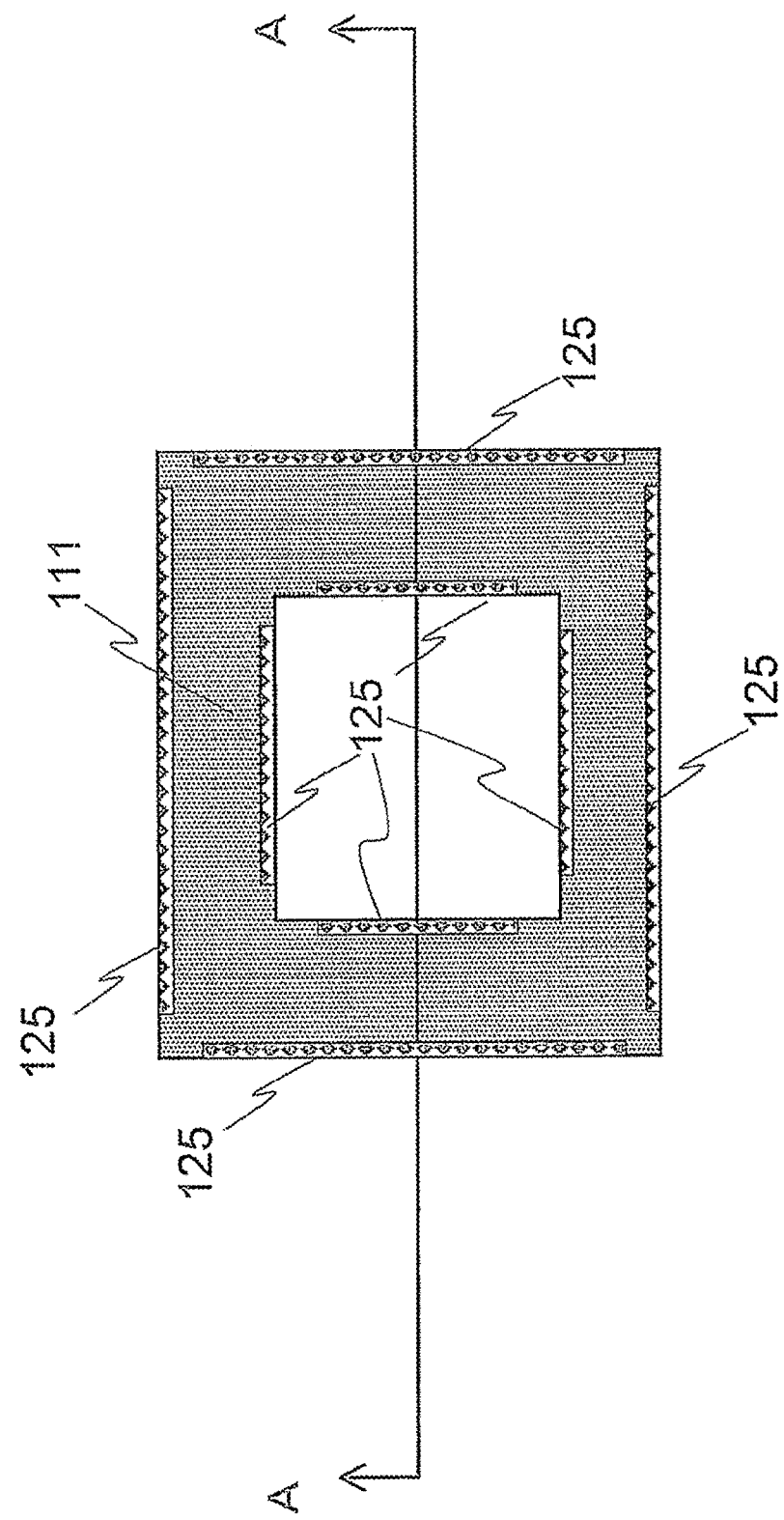
FIG. 39 is a cross-sectional view of FIG. 34 taken along the line G-G.
Figure 76:
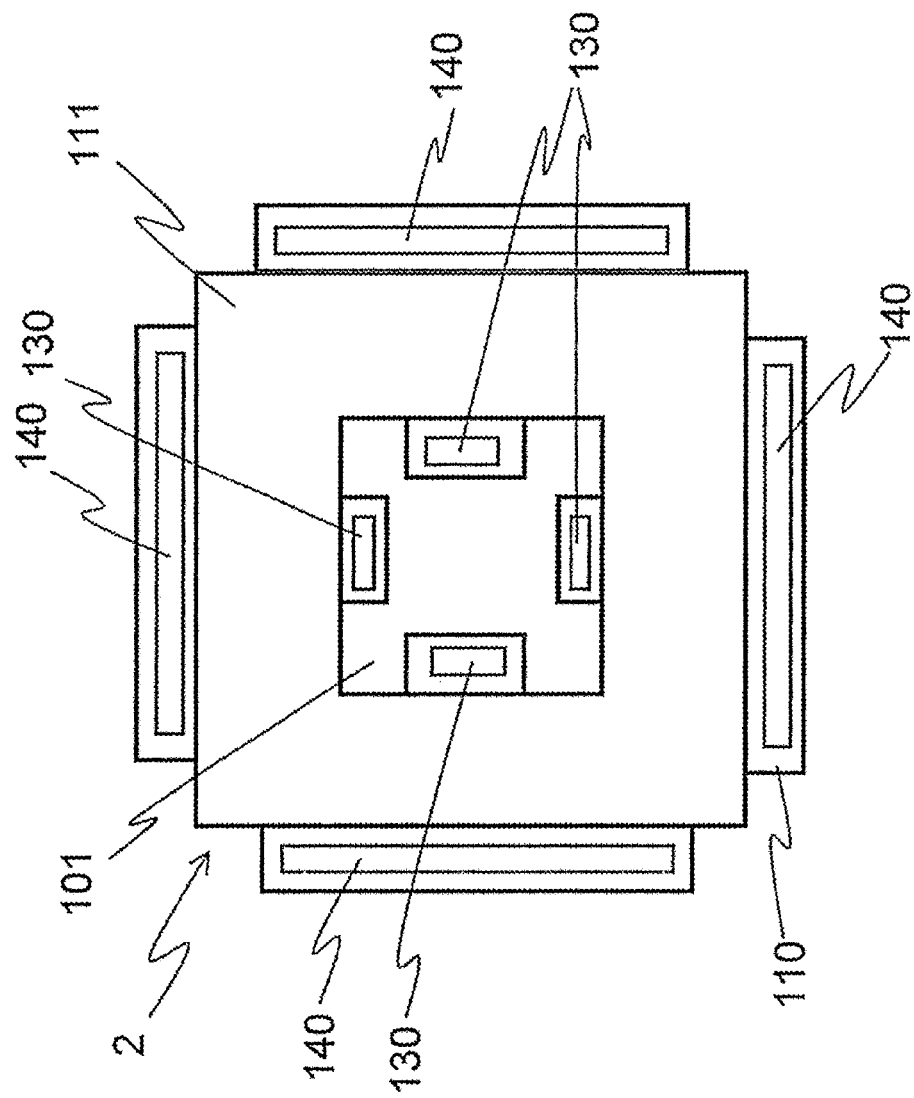
FIG. 76 is a top view of the second embodiment.

FIG. 32 is a perspective view of a capacitive element according to a second embodiment of the present invention as the configuration for realizing the above. FIG. 76 is a top view of the capacitive element. FIG. 33 is a cross-sectional view of FIG. 32 taken along the line A-A. FIG. 34 is a cross-sectional view of FIG. 32 taken along the line A-A to illustrate the positional correlation in transverse portion of each layer. FIG. 35 is a cross-sectional view of FIG. 34 taken along the line C-C. FIG. 36 is a cross-sectional view of FIG. 34 taken along the line D-D. FIG. 37 is a cross-sectional view of FIG. 34 taken along the line E-E. FIG. 38 is a cross-sectional view of FIG. 34 taken along the line F-F. FIG. 39 is a cross-sectional view of FIG. 34 taken along the line G-G. The production method is the same as that of the first embodiment except that the shape of the electrode 110 and the application position of the insulating resin 125 and the mask resin 625 are different.

With reference to FIG. 32, there are four internal circumference outgoing terminals 130 at the inner circumference of the capacitive formation portion 100. Each internal circumference outgoing terminal 130 is positioned around the middle of the straight side of the capacitive formation portion 100. There are four outer circumference outgoing terminals 140 at the outer circumference of the capacitive formation portion 100. Each outer circumference outgoing terminal 140 is positioned around the middle of the straight side of the capacitive formation portion 100. Most of the capacitive formation portion 100 is covered with the opposite electrode 111.

As shown in FIGS. 32 and 33, the internal circumference outgoing terminal 130 is provided on the first projecting portion of the electrode 110 at the inner circumference of the capacitive formation portion 100. The outer circumference outgoing terminal 140 is provided on the second projecting portion of the electrode 110 at the outer circumference of the capacitive formation portion 100. The insulating resin 125 is positioned at the edge of the capacitive formation portion 110 in order to prevent short circuits between the opposite electrode 111 and the electrode 110. The upper and under sides of the electrode 110 positioned in the capacitive formation portion 100 are covered with the dielectric layers 120. On the other sides of the dielectric layers 120, there are the opposite electrodes 111.

FIGS. 35 to 39 show a capacitive element 2 cut in the horizontal direction at the position shown in FIG. 34 as viewed from the ceiling. It is confirmed by FIG. 35 that the insulating resin 125 is linearly applied. It is confirmed by FIG. 36 that the internal circumference outgoing terminal 130 and the outer circumference outgoing terminal 140 are linearly formed. It is confirmed by FIG. 37 that the insulating resin 125 is applied so as to stick out from the electrode 110. The same things can be confirmed by FIGS. 38 and 39.

Moreover, it is confirmed by FIGS. 33 to 39 that the opposite electrode 111 in cross section along the line C-C and the opposite electrode 111 in cross section along the line G-G are connected by the opposition electrodes 111 at four corners. Thanks to the above configuration, the electrode 110 is covered with the opposite electrode 111, and the capacitive formation portion 100 has a strip-line structure.

According to the present embodiment, the internal circumference outgoing terminal 130 and the outer circumference outgoing terminal 140 are provided around the middle of the straight side of the capacitive formation portion 100. However, the internal circumference outgoing terminal 130 and the outer circumference outgoing terminal 140 may not be provided around the middle but provided around the corners as described in the first embodiment.

According to the second embodiment, there are four internal circumference outgoing terminals 130 and four outer circumference outgoing terminals 140. Therefore, the impedance with the power layer or with the ground layer of the printed wiring board connected to the internal circumference outgoing terminals 130 and the outer circumference outgoing terminals 140 can be made small. Therefore, the exceptional effect can be demonstrated in supplying high-frequency power to a target circuit as a capacitive functional element.

Furthermore, according to the present embodiment, the number and position of the internal circumference outgoing terminals 130 and the outer circumference outgoing terminals 140 can be varied according to the target circuit and the shape of the printed wiring board to be mounted. The number of the internal circumference outgoing terminals 130 may be different from the number of the outer circumference outgoing terminals 140. Moreover, there may be a plurality of internal circumference outgoing terminals 130 with one outer circumference outgoing terminal 140, or there may be a plurality of the outer circumference outgoing terminals 140 with one internal circumference outgoing terminal 130.

Third Embodiment

Figure 40:
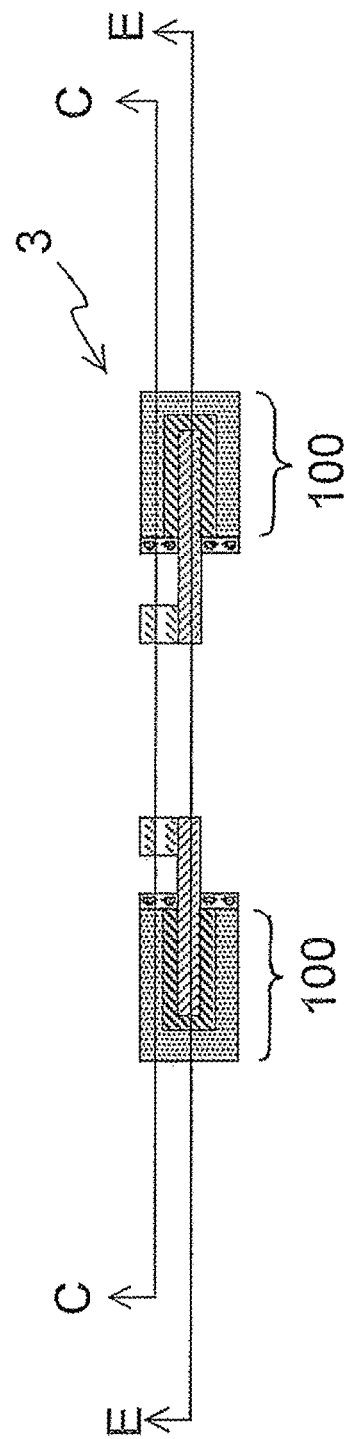
FIG. 40 is a cross-sectional view of a capacitive element according to a third embodiment of the present invention.
Figure 41:
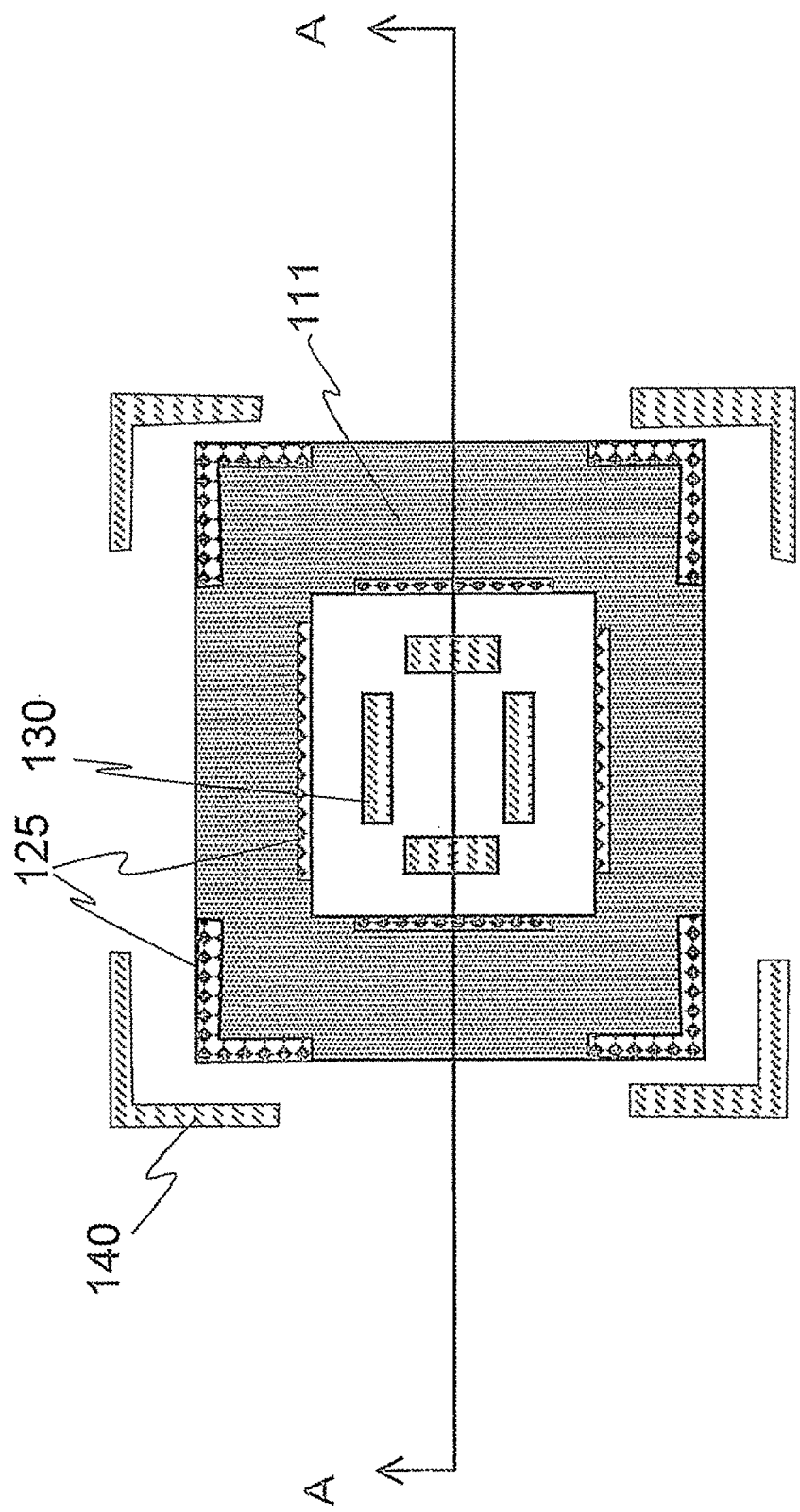
FIG. 41 is a cross-sectional view of FIG. 40 taken along the line C-C.
Figure 42:
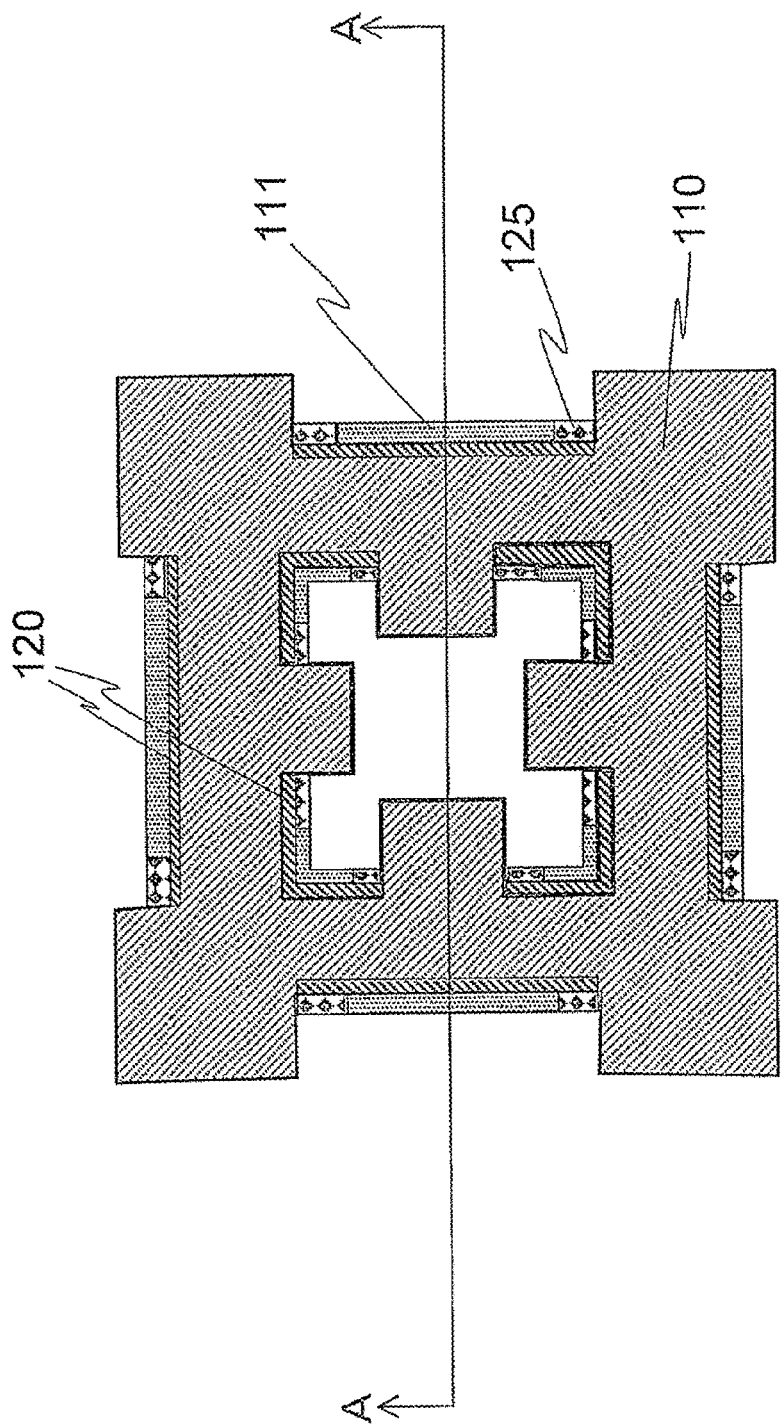
FIG. 42 is a cross-sectional view of FIG. 40 taken along the line E-E.
Figure 77:
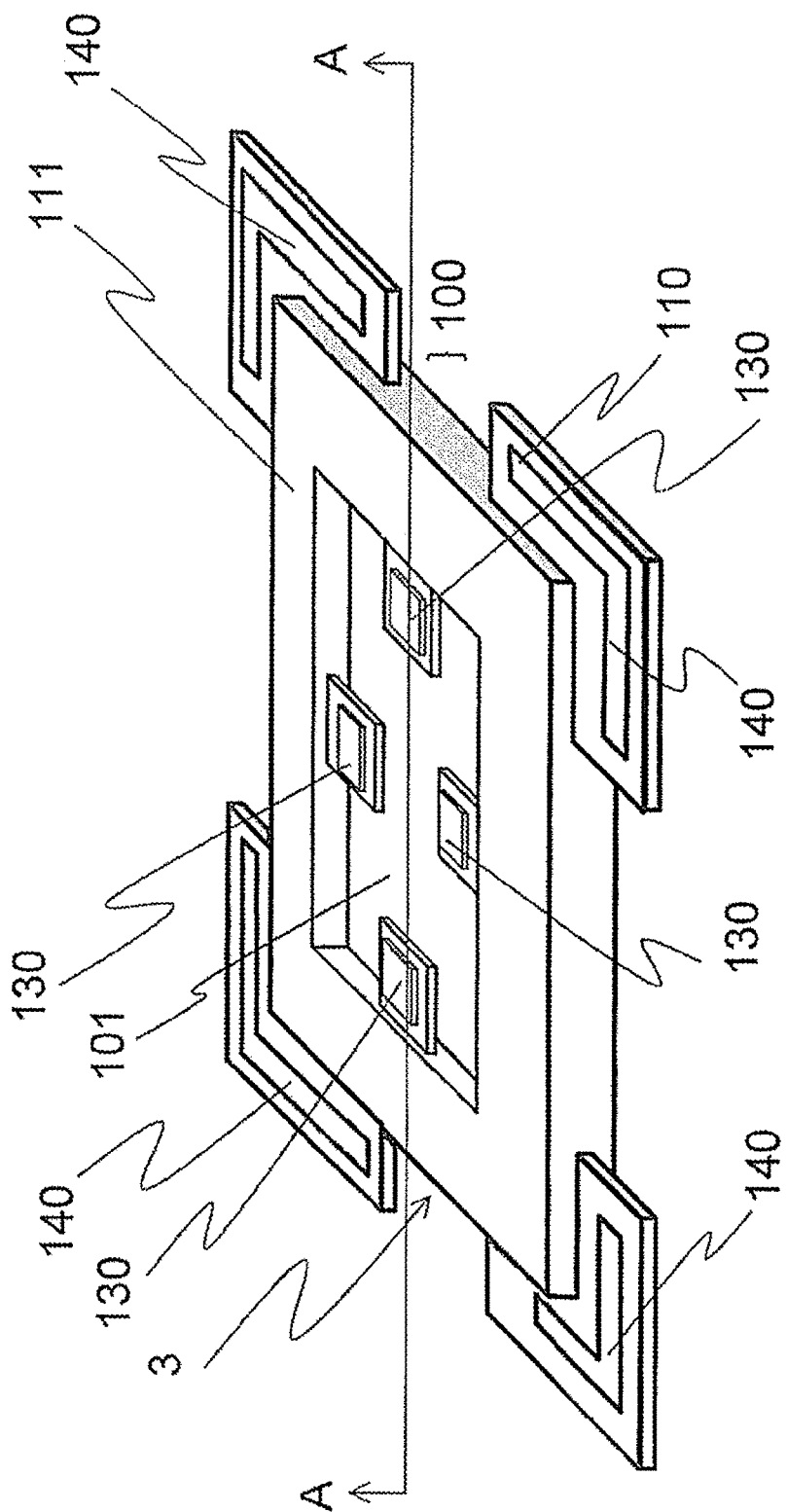
FIG. 77 is a perspective view of the third embodiment.
Figure 78:
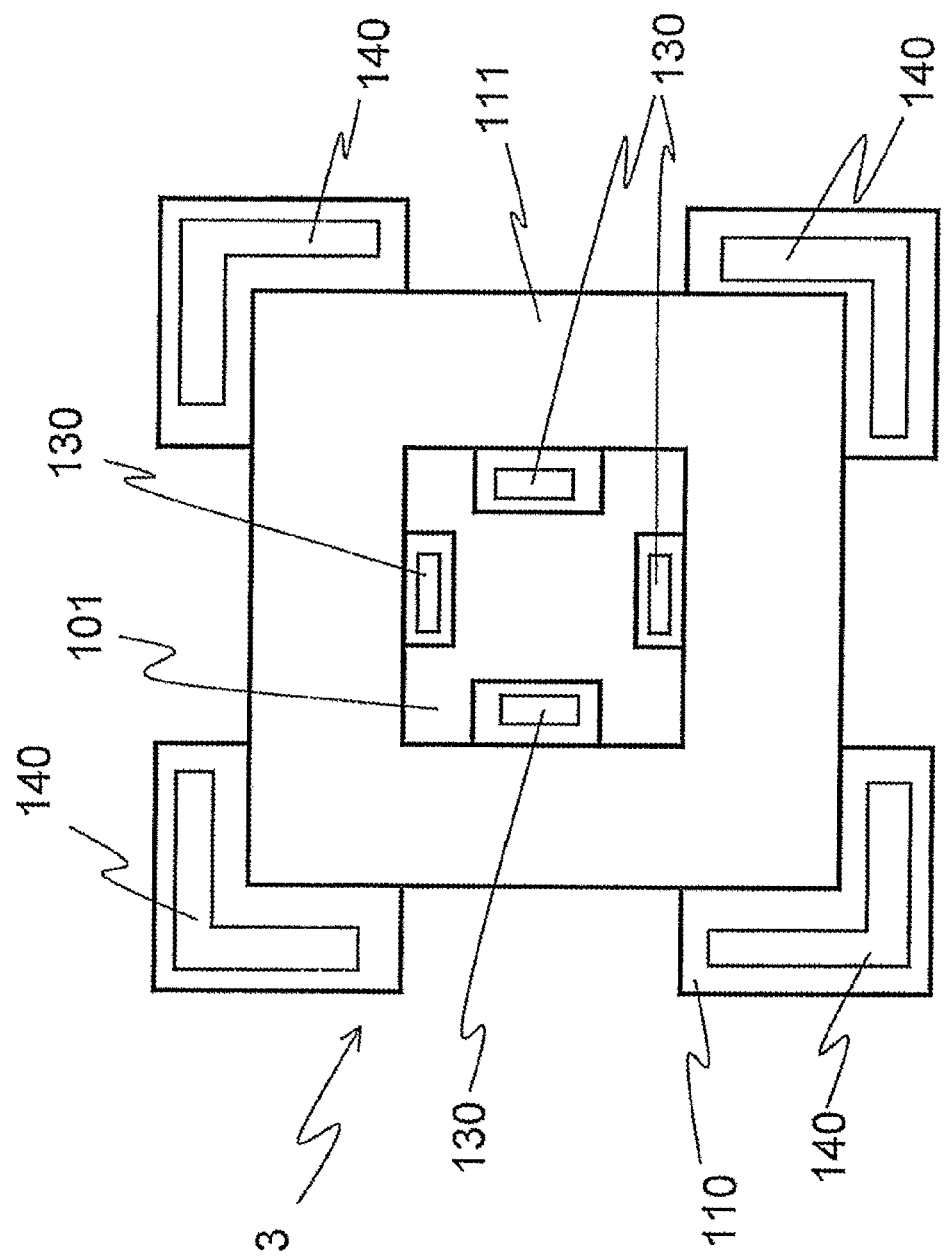
FIG. 78 is a top view of the third embodiment.

FIGS. 40 to 42, 77 and 78 show the outer circumference outgoing terminals 140 disposed at four corners according to a third embodiment of the present invention. FIG. 77 is a perspective view of a capacitive element according to the third embodiment of the present invention. FIG. 78 is a top view of the capacitive element according to the third embodiment of the present invention. FIG. 40 is a cross-sectional view of FIG. 77 taken along the line A-A. FIG. 41 is a cross-sectional view of FIG. 40 taken along the line C-C. FIG. 42 is a cross-sectional view of FIG. 40 taken along the line E-E. Incidentally, the cross-section surface of FIG. 40 corresponds to the cross-section surface along the line A-A of FIGS. 41 and 42. According to the present embodiment, like the second embodiment, the shape of the electrode 110 is changed. Accordingly, the position and shape of the outer circumference outgoing terminals 140 are changed. As shown in FIG. 42, the first projecting portions disposed at the inner circumference of the square, frame-shaped capacitive formation portion 100 and those of the second embodiment are substantially the same in position and shape. However, the second projecting portions disposed at the outer circumference are disposed at four corners of the square, frame-shaped capacitive formation portion at the outer circumference. In this case, the second projecting portions are projecting at the four corners of the capacitive formation portion so as to take the shape of "L." However, like the first embodiment, the second projecting portion may be provided so as to stick out in the direction perpendicular to one side of the square, frame-shaped capacitive formation portion at the corner.

It is confirmed by FIG. 41 that the internal circumference outgoing terminal 130 provided at the first projecting portion is linearly formed. However, the outer circumference outgoing terminal 140 provided at the second projecting portion and the insulating resin 125 positioned near the outer circumference outgoing terminal 140 are not formed as one line but in the shape of "L." Even though processing becomes increasingly difficult, the internal circumference outgoing terminal 130 is separated from the outer circumference outgoing terminal 140. Therefore, the high-frequency power takes a longer distance to pass through the capacitive formation portion 100. Thus, the third embodiment is better at suppressing the high-frequency power than the second embodiment.

Fourth Embodiment

Figure 43:
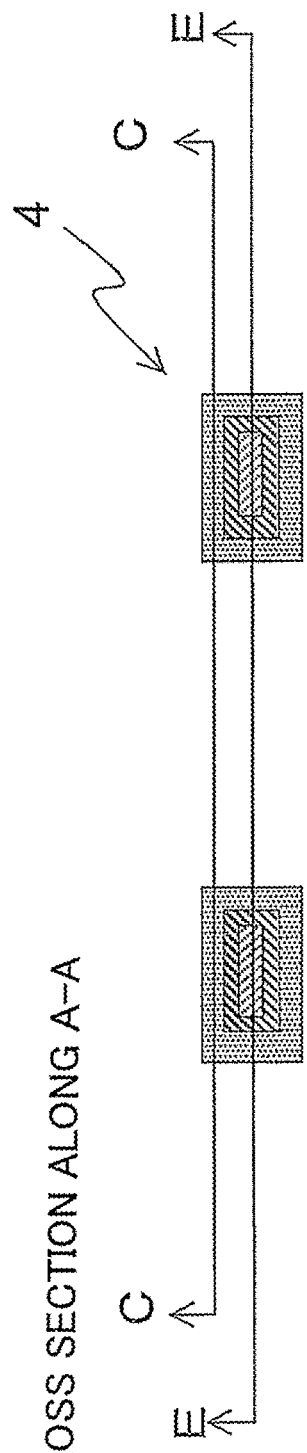
FIG. 43 is a cross-sectional view of a capacitive element according to a fourth embodiment of the present invention.
Figure 44:
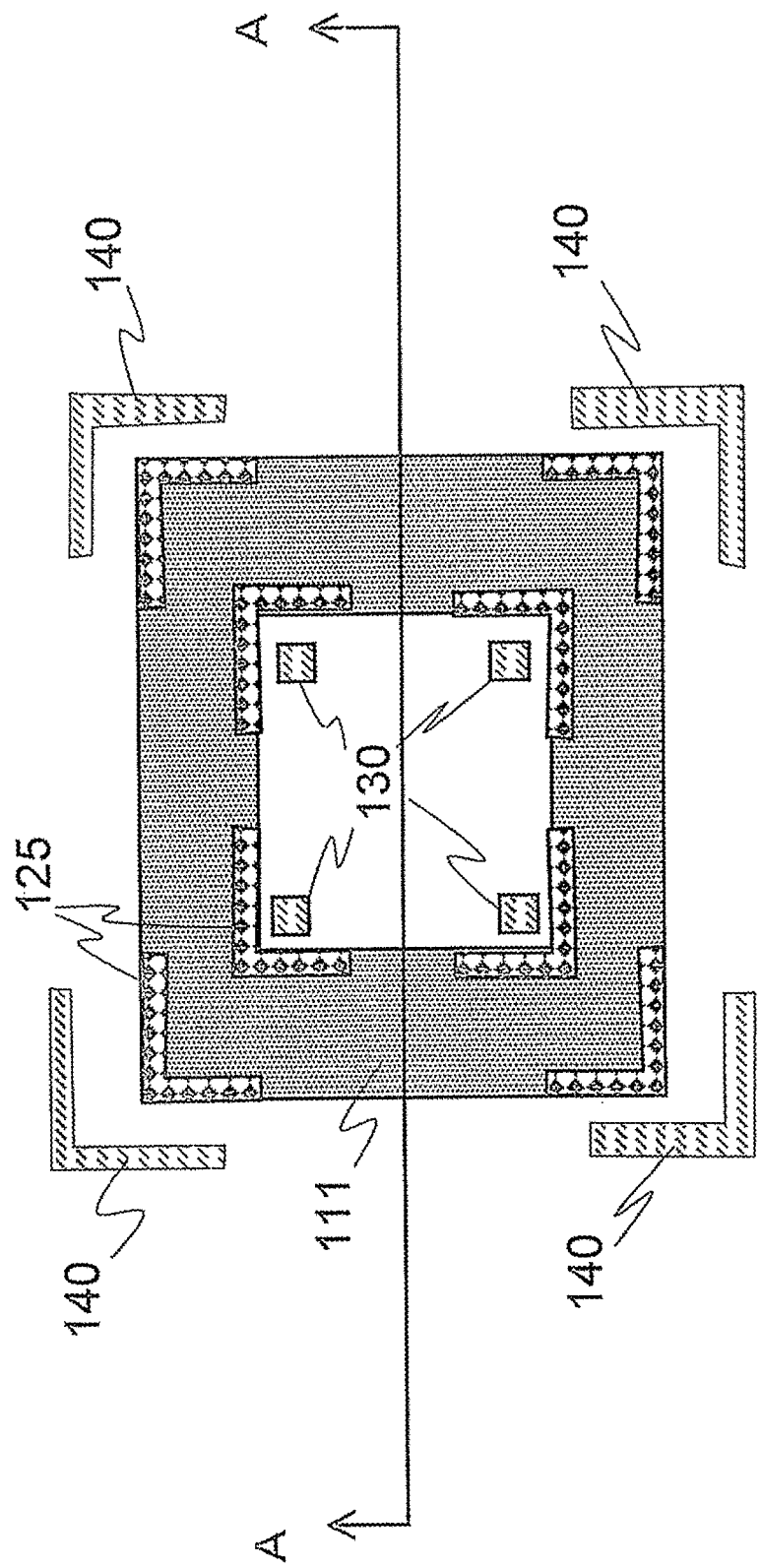
FIG. 44 is a cross-sectional view of FIG. 43 taken along the line C-C.
Figure 45:
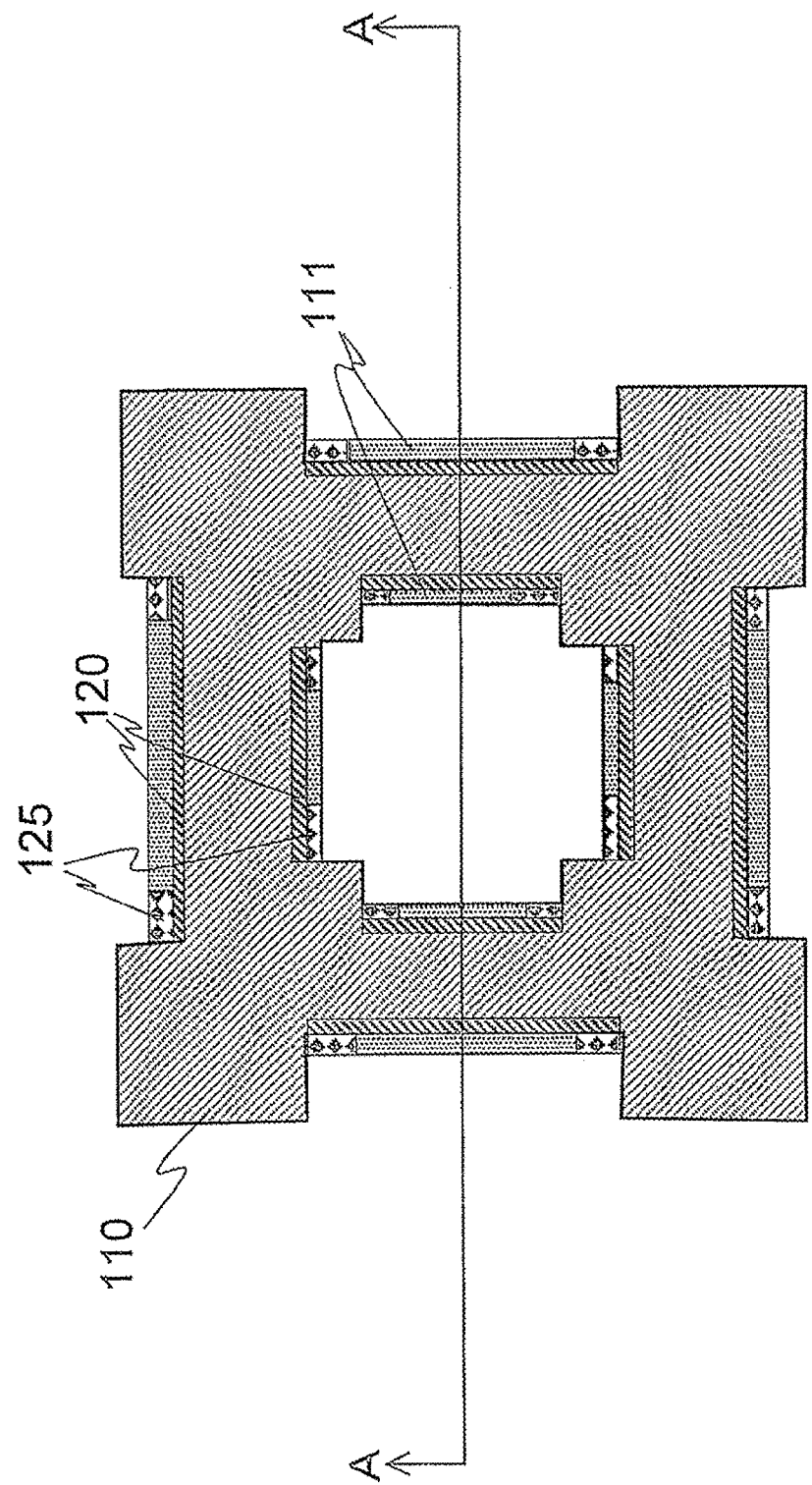
FIG. 45 is a cross-sectional view of FIG. 43 taken along the line E-E.
Figure 79:
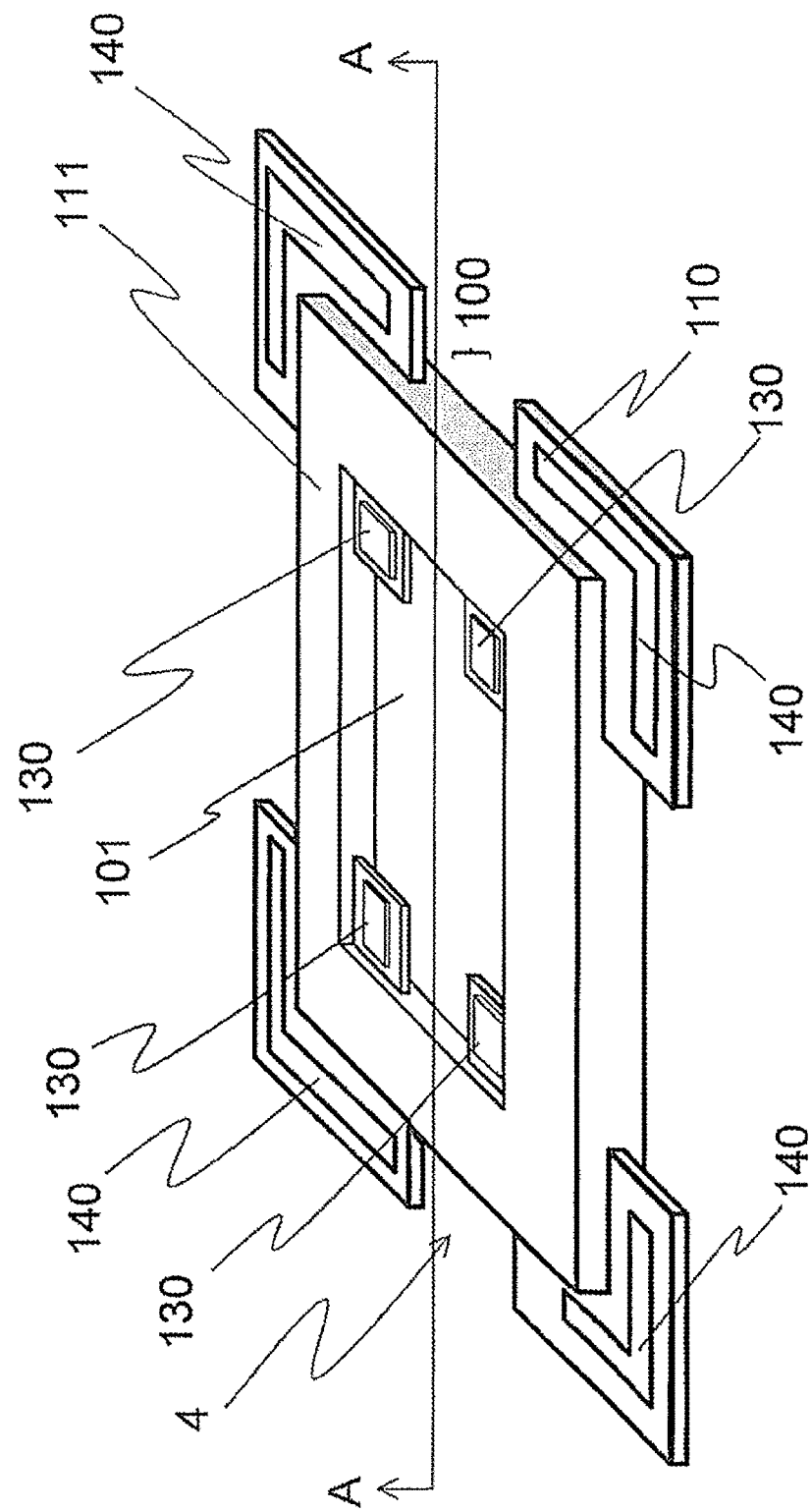
FIG. 79 is a perspective view of the fourth embodiment.
Figure 80:
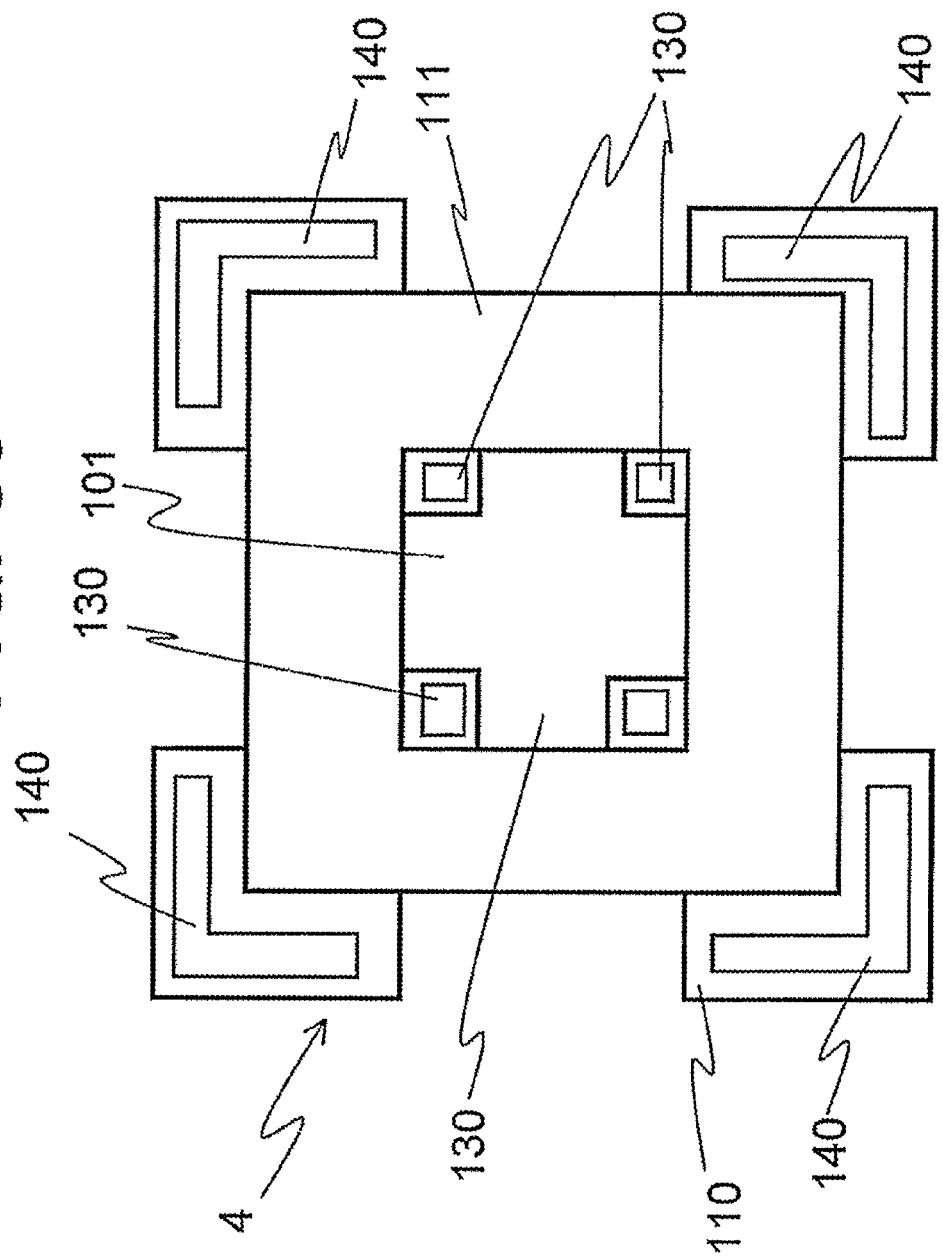
FIG. 80 is a top view of the fourth embodiment.

Then, FIGS. 43 to 45, 79 and 80 show the internal circumference outgoing terminals 130 and the outer circumference outgoing terminals 140 according to a fourth embodiment of the present invention: The internal circumference outgoing terminals 130 and the outer circumference outgoing terminals 140 are disposed at four corners. FIG. 79 is a perspective view of a capacitive element according to the fourth embodiment of the present invention. FIG. 80 is a top view of the capacitive element according to the fourth embodiment of the present invention. FIG. 43 is a cross-sectional view of FIG. 79 taken along the line A-A. FIG. 44 is a cross-sectional view of FIG. 43 taken along the line C-C. FIG. 45 is a cross-sectional view of FIG. 43 taken along the line E-E. Incidentally, the cross-section surface of FIG. 43 corresponds to the cross-section surface along the line A-A in FIGS. 44 and 45. According to the present embodiment, the same change as that of the third embodiment is made. In addition, the internal circumference outgoing terminals 130 are disposed at four corners at the inner circumference of the capacitive formation portion. The internal circumference outgoing terminal 130 and the outer circumference outgoing terminal 140 face each other across the corner portion of the capacitive formation portion. Since the shape of the electrode 110 is changed, the position and shape of the internal circumference outgoing terminal 130 are changed accordingly. With reference to FIG. 45, the internal circumference outgoing terminals 130 are disposed at four corners. Therefore, the size of a hole 101, which serves as an opening, becomes larger compared with the capacitive element 3 of the third embodiment.

Fifth Embodiment

Figure 46:
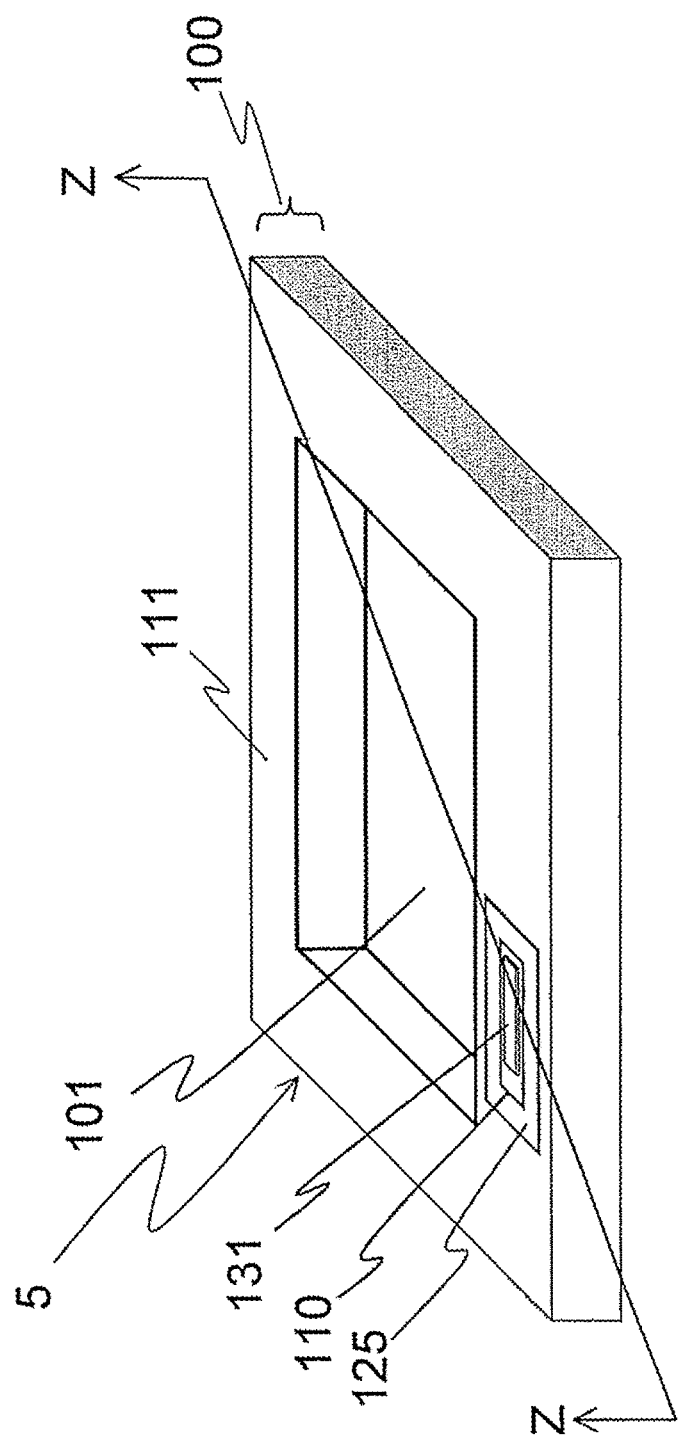
FIG. 46 is a perspective view of a capacitive element according to a fifth embodiment of the present invention.
Figure 47:
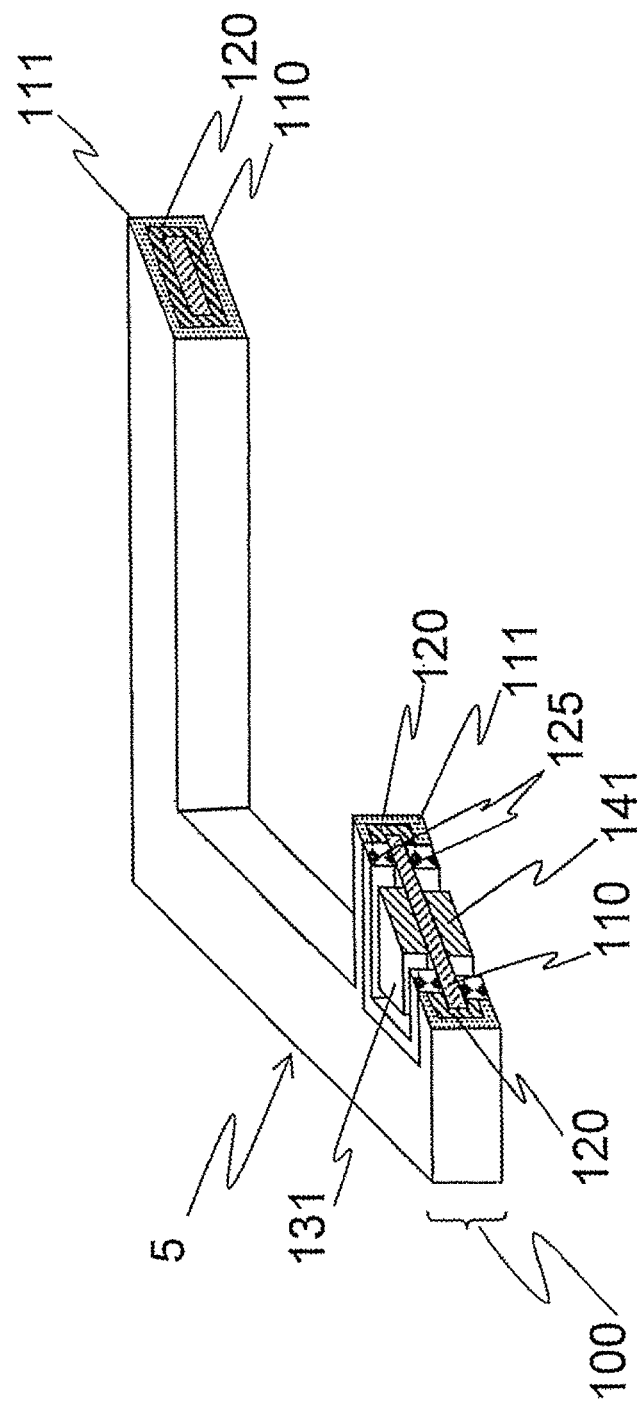
FIG. 47 is a perspective view of FIG. 46 cut off along the line Z-Z.
Figure 48:
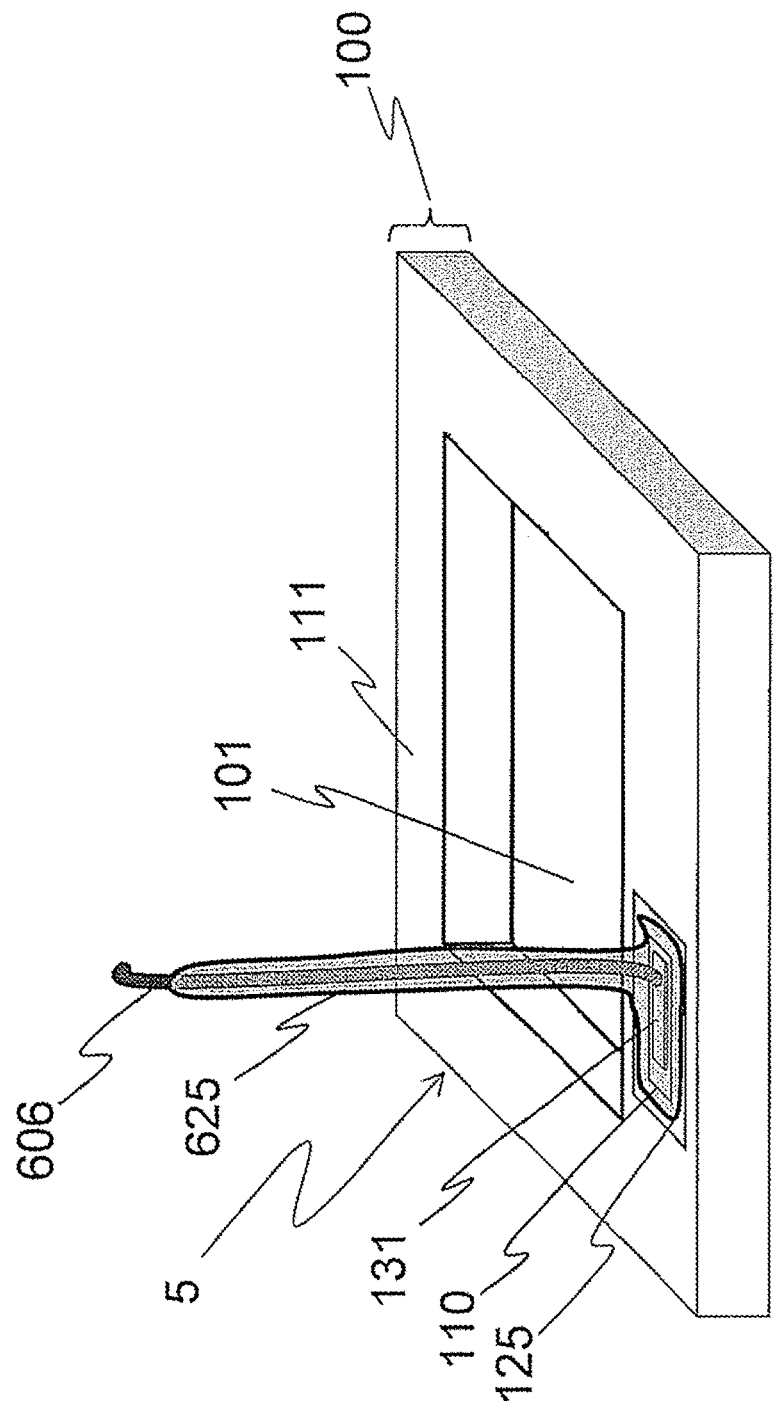
FIG. 48 is a perspective view illustrating the case where an outgoing line for chemical conversion is connected.

FIGS. 46 to 48 show the internal circumference outgoing terminals 130 and the outer circumference outgoing terminals 140 which are respectively moved from the locations of the first embodiment to the ceiling plane and the bottom plane of the capacitive formation portion 100, according to a fifth embodiment of the present invention. FIG. 46 is a perspective view illustrating the fifth embodiment of the present invention. FIG. 47 is a perspective view of FIG. 46 cut off along the line Z-Z. FIG. 48 is a perspective view illustrating the case where an outgoing line for chemical conversion is connected.

The present embodiment is different from the first embodiment in the following point: instead of the internal circumference outgoing terminal 130 and the outer circumference outgoing terminal 140, the dielectric layer and the opposite electrode are opened to expose the electrode, and an upper-portion outgoing terminal 131 and a lower-portion outgoing terminal 141 are provided. In this case, one upper-portion outgoing terminal 131 and one lower-portion outgoing terminal 141 are provided at two locations. However, two or more upper-portion outgoing terminals 131 and two or more lower-portion outgoing terminals 141 may be provided when necessary.

In FIG. 46, at the side faces of the inner and outer circumferences of the capacitive formation portion 100, the electrode 110 is not exposed. On the upper surface of the capacitive formation portion 100, there are the electrode 110 surrounded by the insulating resin 125 and the upper-portion outgoing terminal 131. In FIG. 47, on the lower surface of the capacitive formation portion 100, the exposure of the electrode 110 surrounded by the insulating resin 125 and the lower-portion outgoing terminal 141 are shown.

According to the first to fourth embodiments, when the electrode 110 is set in the chemical conversion tank 601, the long electrode 110, which remains left after cutting, is exposed out of the chemical conversion solution 621, and the positive electrode wiring 603 can be connected to the electrode 110. However, it is difficult to do so according to the present embodiment. Therefore, as shown in FIG. 48, a chemical-conversion outgoing line 606 is welded to the upper-portion outgoing terminal 131. The exposed portion of the electrode 110, the upper-portion outgoing terminal 131, the lower-portion outgoing terminal 141, and the chemical-conversion outgoing line 606 are covered with the mask resin 625. Therefore, a capacitive element 5 sinks in the chemical conversion solution 621 of the chemical conversion tank 601, and the positive electrode wiring 603 is connected to the end of the chemical-conversion outgoing line 606. As a result, it is possible to carry out the chemical conversion (dielectric layer formation) process (Step P3) and the re-chemical conversion (dielectric layer repairing) process (Step P13) as illustrated in FIG. 10.

Incidentally, according to the present embodiment, for ease of welding, the upper-portion outgoing terminal 131 and the lower-portion outgoing terminal 141 are positioned at the same place on the perspective chart viewed from the ceiling but may not be positioned at the same place. According to the present embodiment, unlike the first through fourth embodiments, when the capacitive element is formed, for example, inside the printed wiring board, the first and second projecting portions need not be provided. Since the connection is possible via the upper-portion outgoing terminal 131 and the lower-portion outgoing terminal 141, the configuration can be further simplified.

As described above, according to the first through fourth embodiments, the number of the internal circumference outgoing terminals 130 is one or four, and the number of the outer circumference outgoing terminals 140 is one or four. However, at least one internal circumference outgoing terminal 130 and one outer circumference outgoing terminal 140 are enough to provide the function. Furthermore, like the fifth embodiment, the ongoing terminals may be provided on the upper or lower surface. Accordingly, it is clear that there are a variety of combinations in position and the number.

Figure 73:
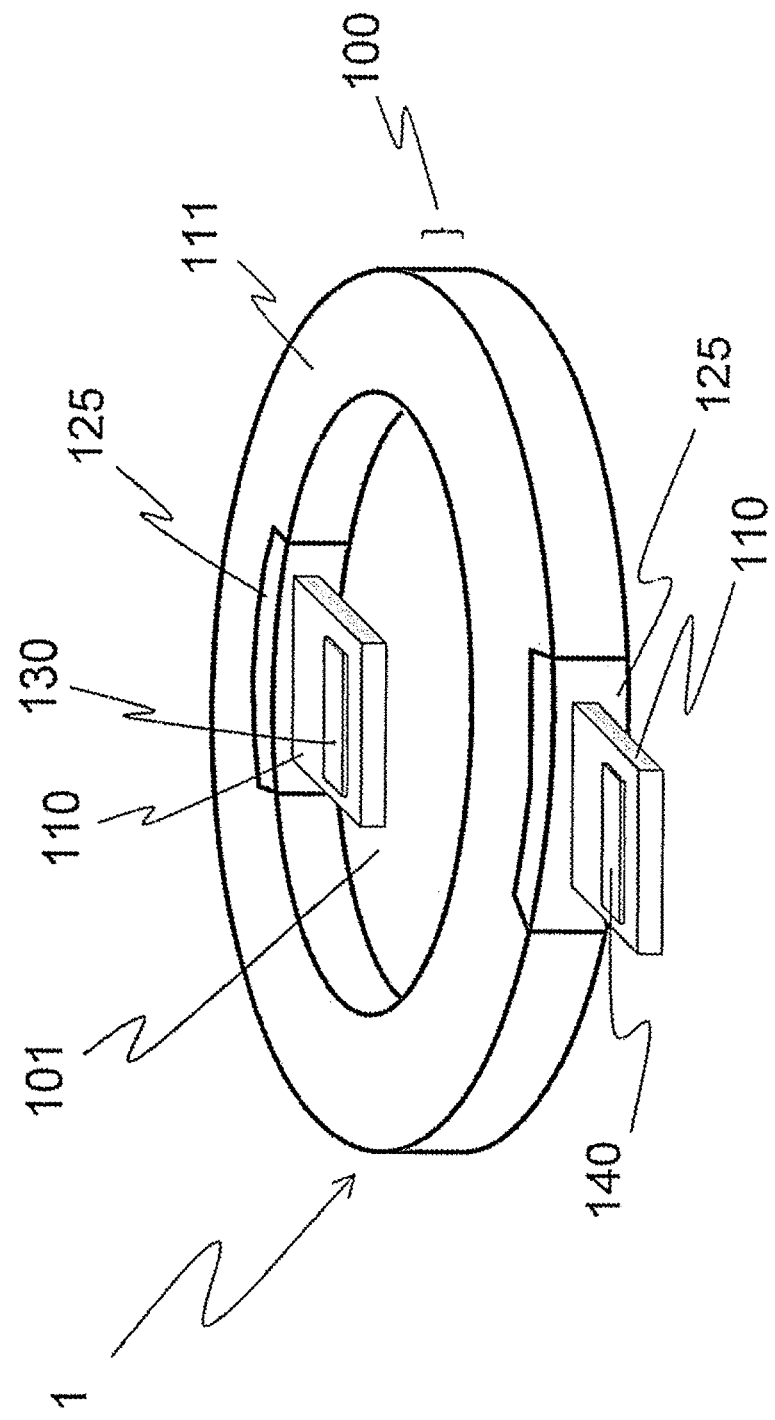
FIG. 73 is a diagram illustrating a modification of the first embodiment.
Figure 74:
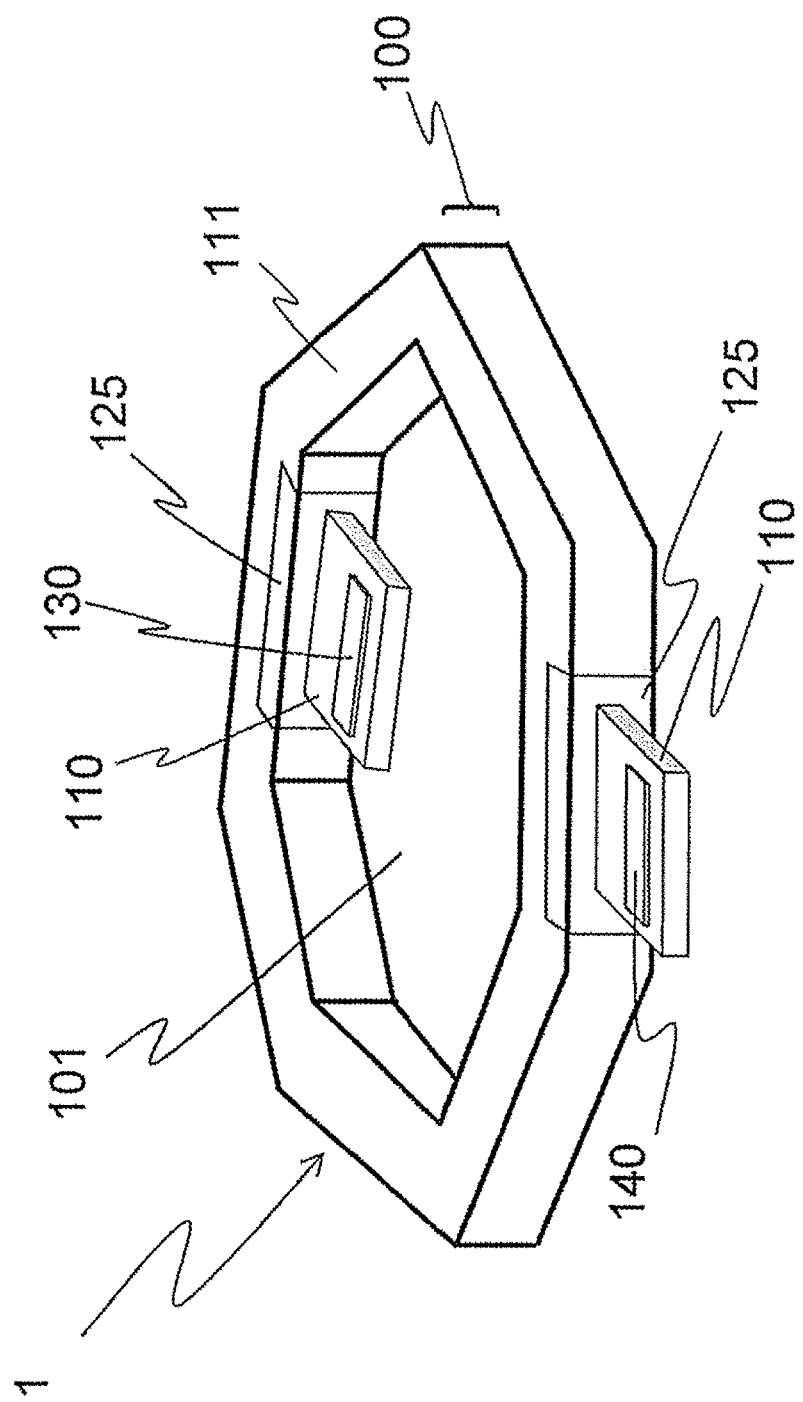
FIG. 74 is a diagram illustrating a modification of the first embodiment.

Moreover, according to the first to fifth embodiments, the capacitive formation portion takes the shape of a square frame but does not limited to the shape of a square frame. As long as the circuit can be disposed inside the capacitive formation portion, the capacitive formation portion may be formed in the shape of a ring as shown in FIG. 73 or a polygonal frame that is a pentagon or the one having more than five inside angles as shown in FIG. 74, not limited to the shape of a square frame.

Figure 75:
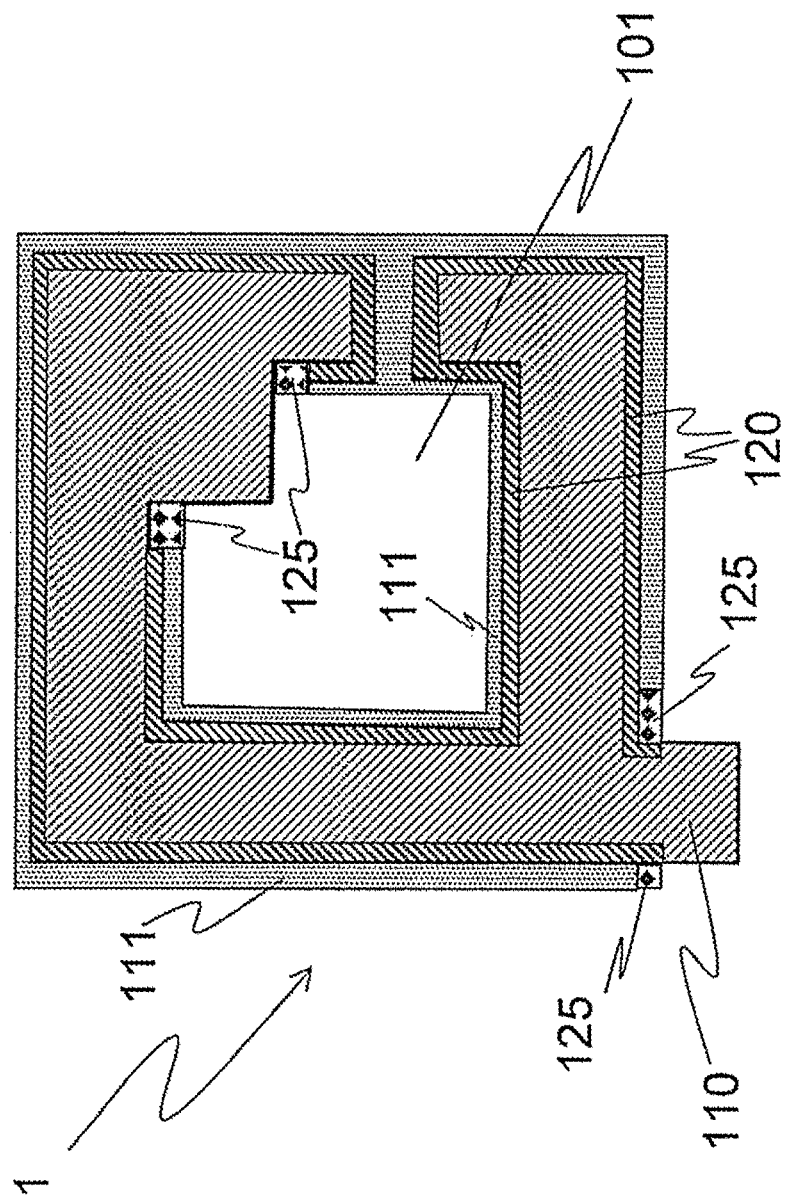
FIG. 75 is a diagram illustrating a modification of the first embodiment.

Furthermore, the shape of the capacitive formation portion is not limited to a specific one as long as the capacitive formation portion can surround a circuit that generates high-frequency power or a circuit that needs to be protected from high-frequency power. The capacitive formation portion 100 at least needs to be closed by the opposite electrode 111 as if forming a closed curve. Meanwhile, it is desirable that the electrode 110 of the capacitive formation portion be similarly closed as if forming a closed curve. However, as shown in FIG. 75, part of the electrode 110 may be divided by the dielectric layer 120 or by the dielectric layer 120 and the opposite electrode 111. Incidentally, it is desirable that the separation distance be less than one-twentieth of the upper-limit wavelength of a target frequency, and the separation distance needs to be less than one-half of the wavelength. FIGS. 73 to 75 show a modification of the first embodiment. Similarly, in the second to fifth embodiments, the capacitive formation portion may take the shape of a ring or a polygonal frame that is a pentagon or the one having more than five inside angles, and part of the electrode 110 may be divided.

According to the first to fifth embodiments, the internal circumference outgoing terminal and the outer circumference outgoing terminal (or the upper-portion outgoing terminal and the lower-portion outgoing terminal) are provided. However, since the material of the electrode 110 is aluminum, it is difficult to put a wiring such as a copper wiring and to perform soldering. That is why a metal plate such as a copper plate with thickness of 0.1 mm is provided as the outgoing terminal. Therefore, it is not necessary to provide the outgoing terminals. Like the sixth and eleventh embodiments described later, a conductive adhesive can be used to connect with the electrode 110.

Sixth Embodiment

Figure 49:
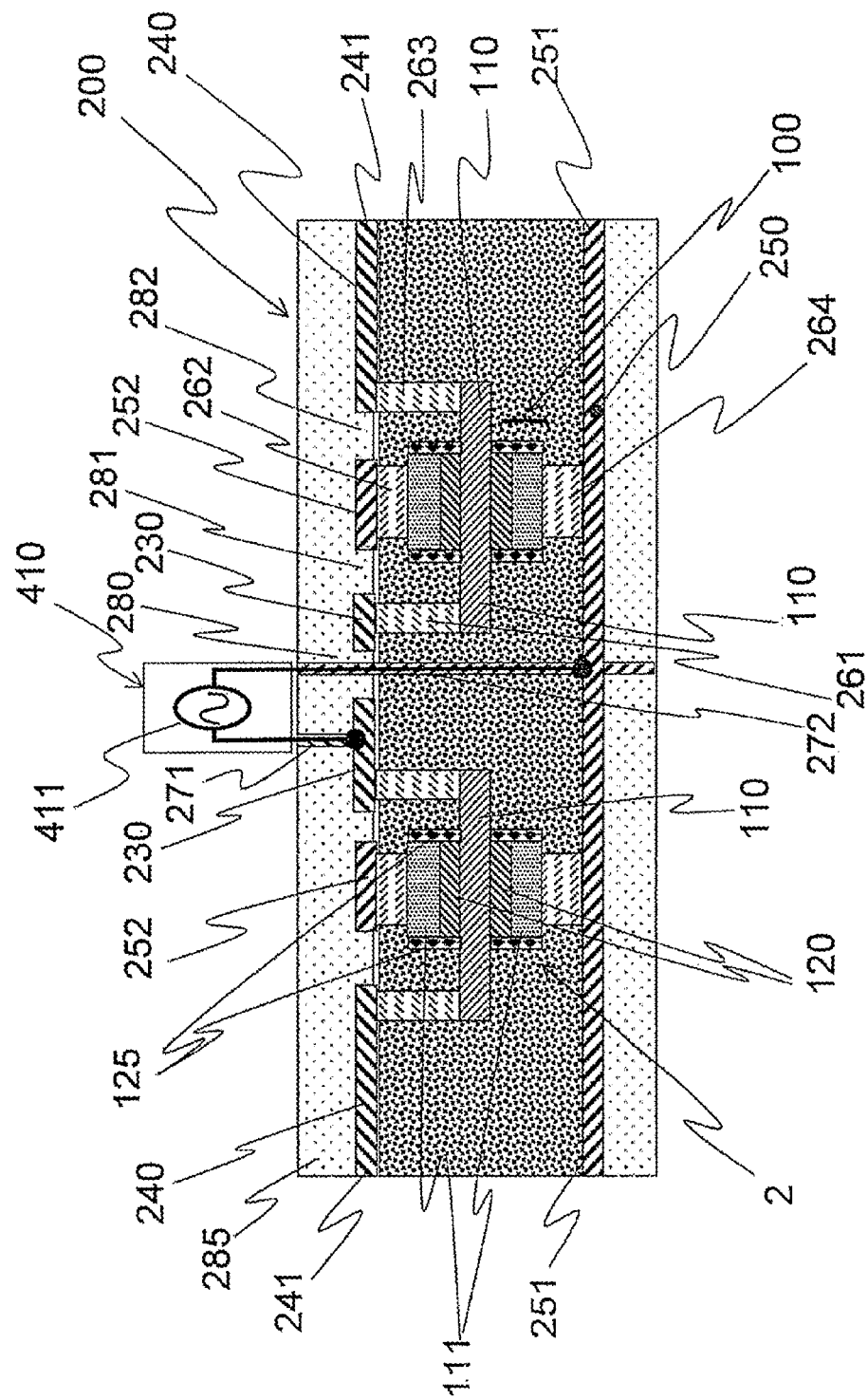
FIG. 49 is a cross-sectional view of a printed wiring board according to a sixth embodiment of the present invention.

Then, FIGS. 49 to 65 show the capacitive element 2 of the present invention provided inside a printed wiring board 200 according to a sixth embodiment of the present invention. FIG. 49 is a cross-sectional view illustrating the sixth embodiment, showing the cross-section surface of the printed wiring board 200 so that the cross-section surface of the printed wiring board 200 corresponds to the cross-section surface of the capacitive element 2 which extends along the line A-A in FIG. 32. Production processes will be described with reference to FIGS. 50 to 53.

Figure 50:
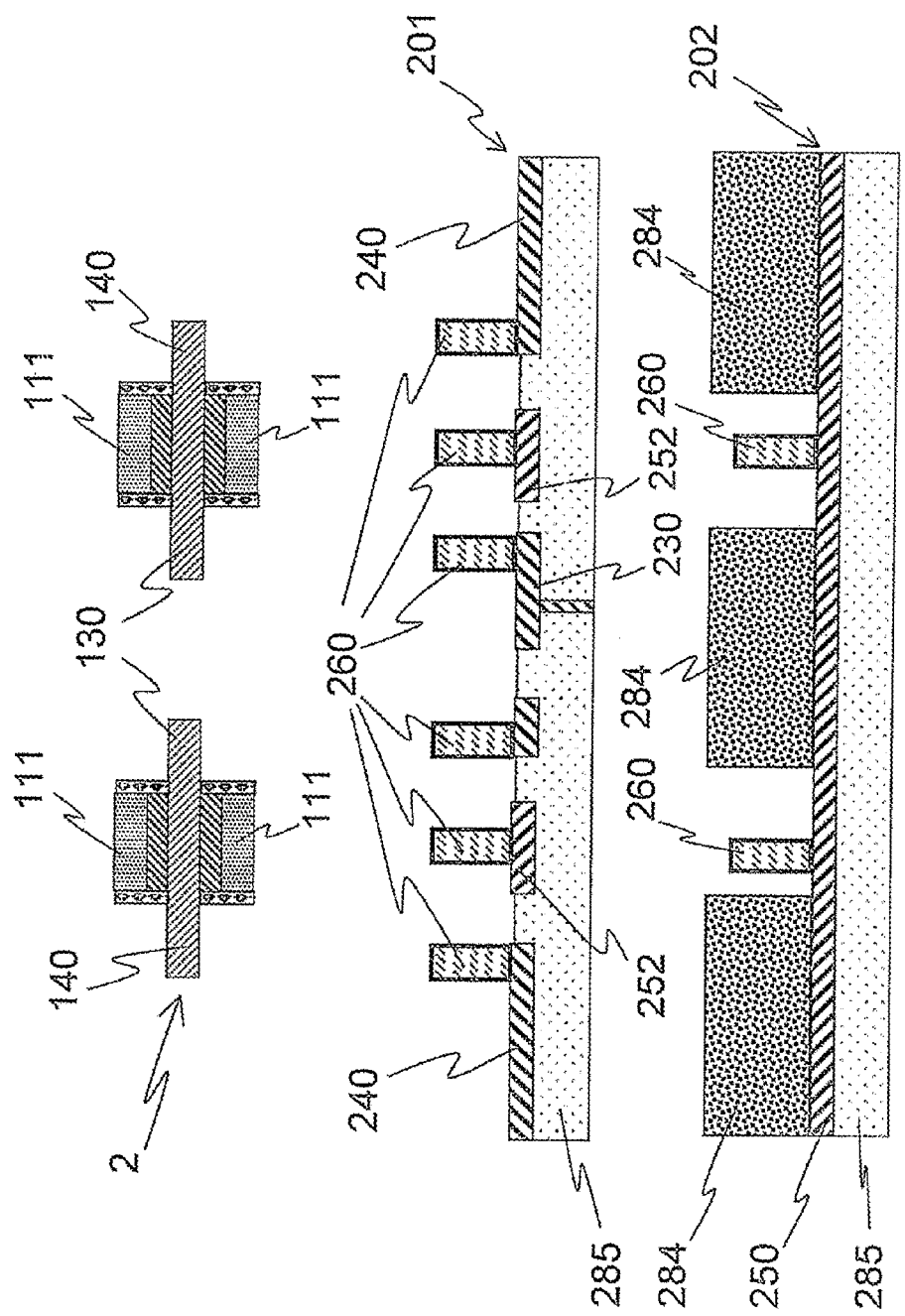
FIG. 50 is an explanatory diagram of a production process of the printed wiring board.

As shown in FIG. 50, provided are the capacitive element 2, which is obtained in the second embodiment of the present invention; a double-side board 201 including a power wiring (target circuit portion) 230, a power wiring (board power supply portion) 240, and the ground (fixed voltage line) 252 inside a power wiring layer; and a double-side board 202 including the ground (fixed potential layer) 250. The double-side boards 201 and 202 contain an insulating resin 285 and a copper wiring. The grounds 252 and 250 are not necessarily the ground (GND) as long as the potential is fixed. As to the double-side boards 201 and 202, wirings on the surface not facing the capacitive element 2 are mainly signal wirings, and therefore omitted in the drawings. First, a conductive adhesive 260 is applied to the power wirings 230 and 240 of the double-side board 201 and the ground 252 inside the power wiring layer. The conductive adhesive 260 and a thermosetting insulating resin 284 are applied to the ground 250 of the double-side board 202. The capacitive element 2 is placed on the double-side board 201, and is put in an oven whose temperature is adjusted at 120 degrees Celsius for about an hour to solidify the conductive adhesive 260.

Figure 51:
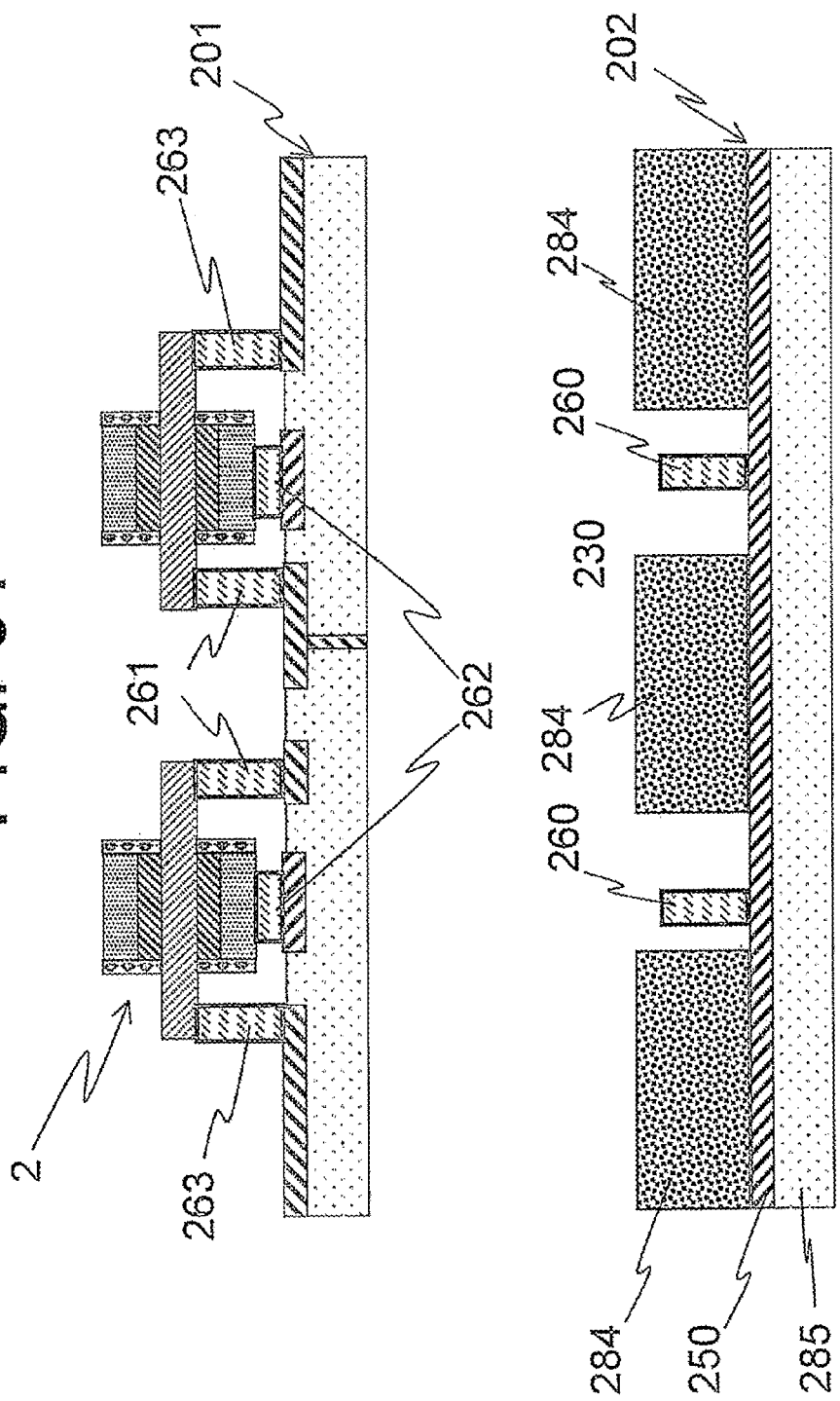
FIG. 51 is an explanatory diagram of a production process of the printed wiring board.
Figure 52:
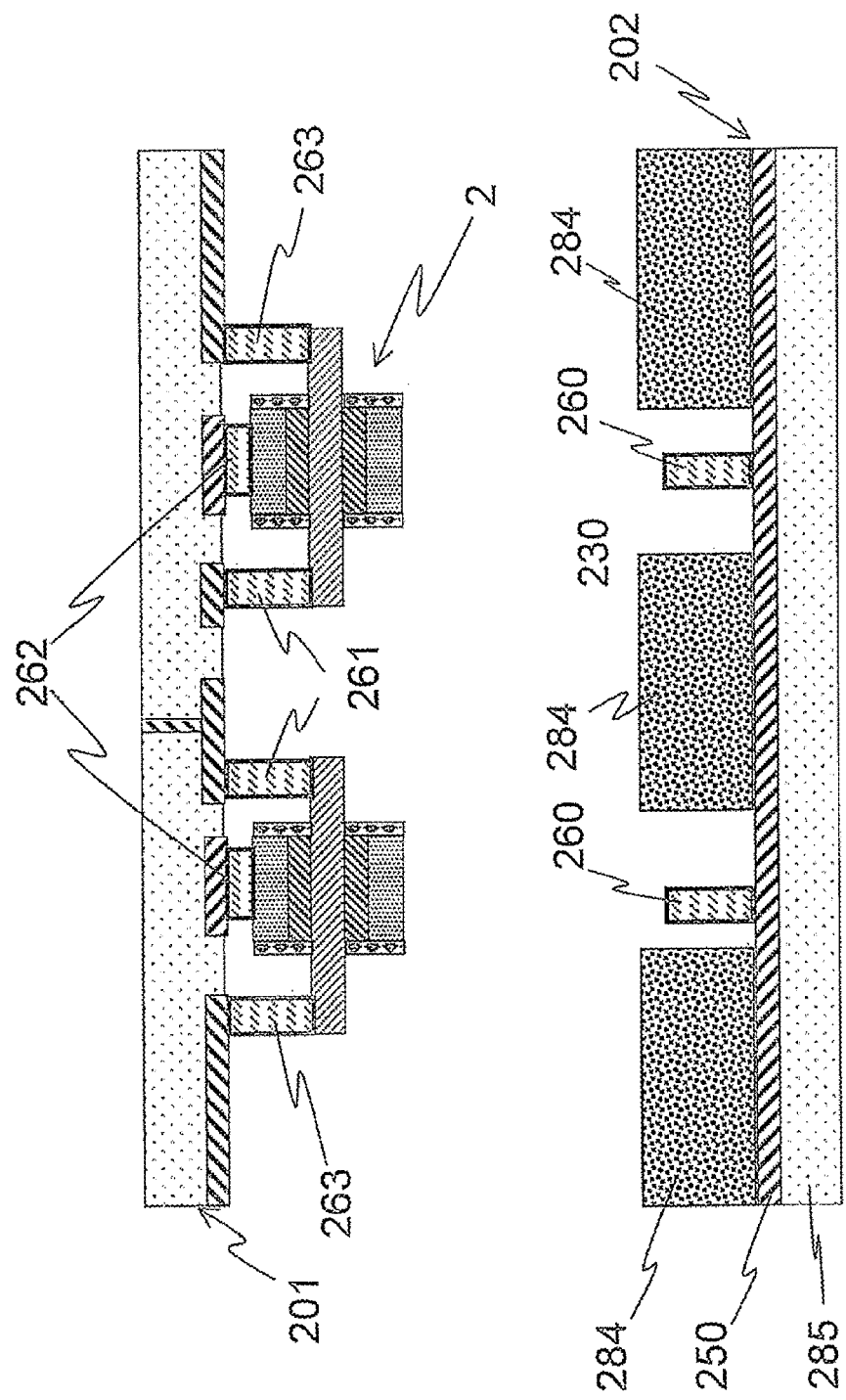
FIG. 52 is an explanatory diagram of a production process of the printed wiring board.
Figure 53:
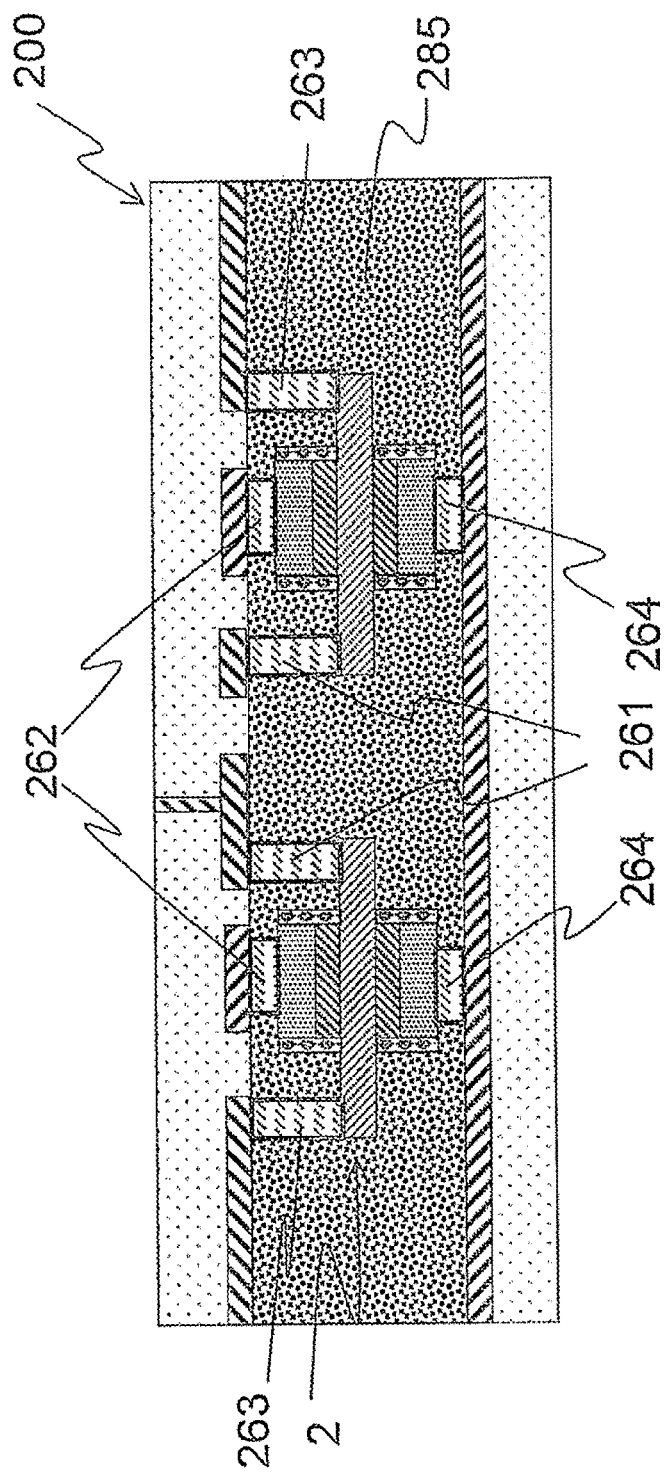
FIG. 53 is an explanatory diagram of a production process of the printed wiring board.

Accordingly, the double-side board 201 on which the capacitive element 2 is mounted is obtained as shown in FIG. 51. As shown in FIG. 52, the double-side board is turned upside down, fixed on the double-side board 202, and similarly put in an oven whose temperature is adjusted at 120 degrees Celsius for about an hour. As shown in FIG. 53, the thermosetting insulating resin 284 is cured to be an insulating resin 285, and one printed wiring board 200 is obtained with the double-side boards 201 and 202 and the capacitive element 2 included.

Figure 54:
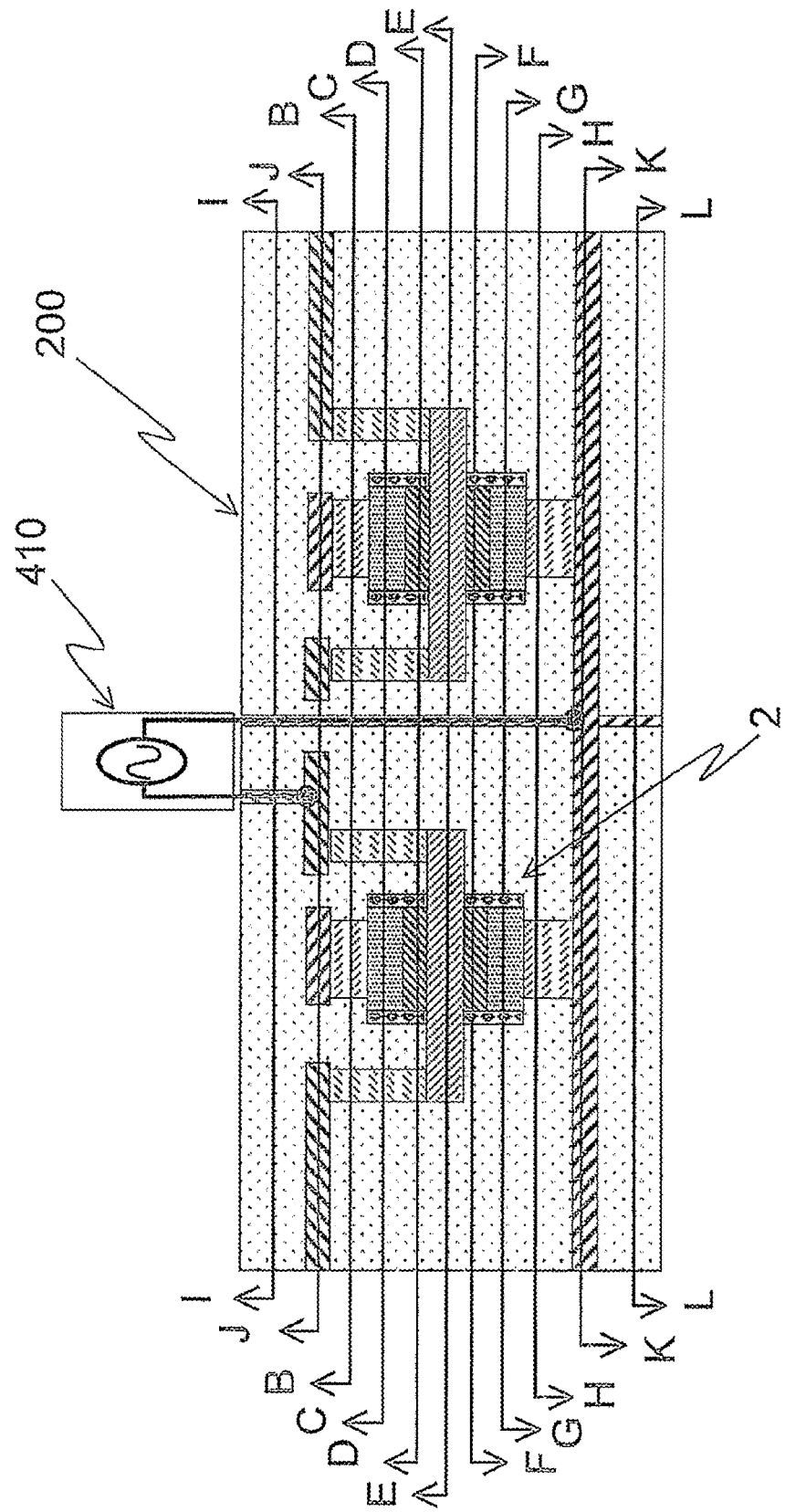
FIG. 54 is an explanatory diagram illustrating the positional correlation of each layer of a printed wiring board 200 according to the sixth embodiment.
Figure 55:
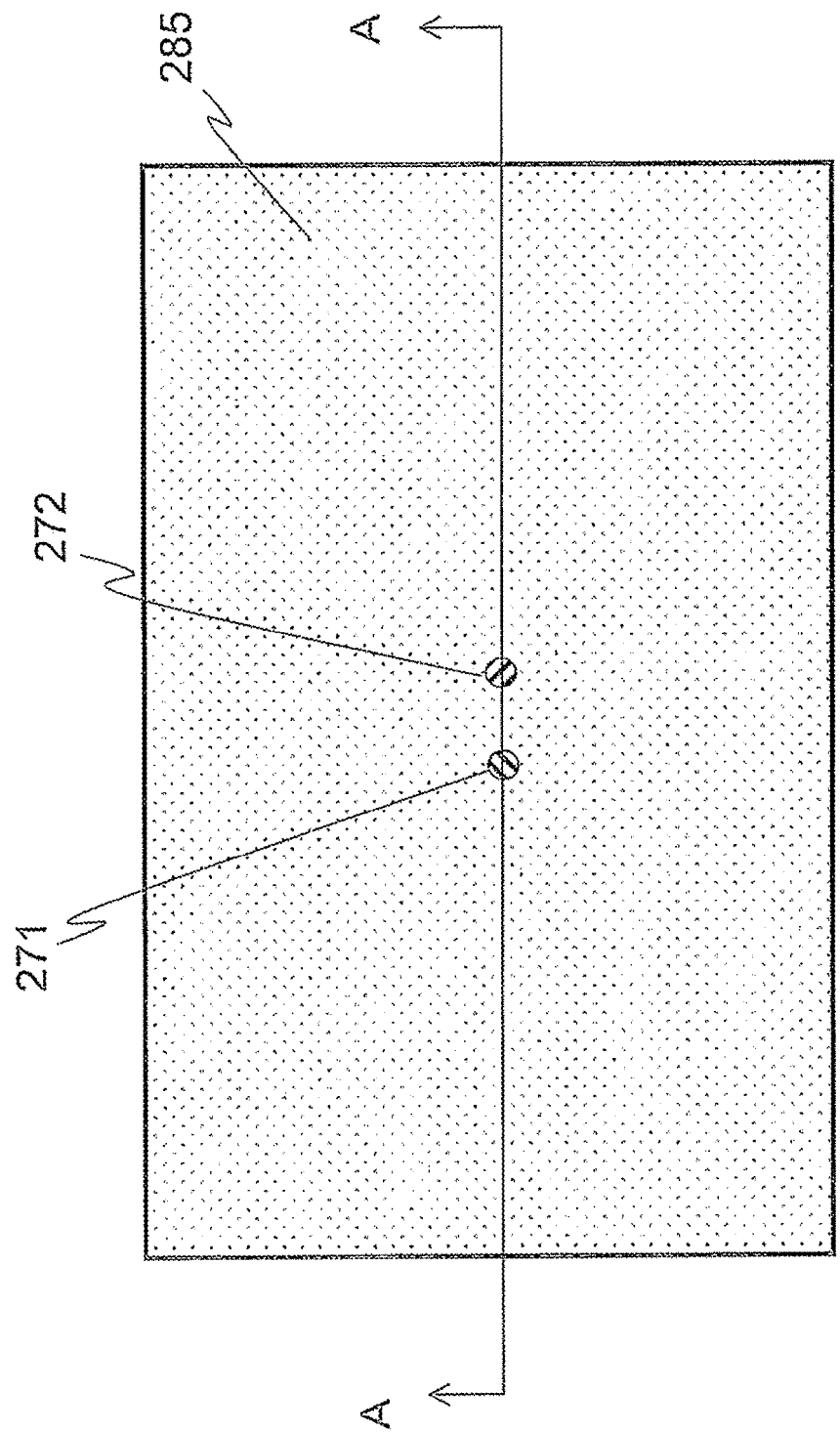
FIG. 55 is a cross-sectional view of FIG. 54 taken along the line I-I.
Figure 56:
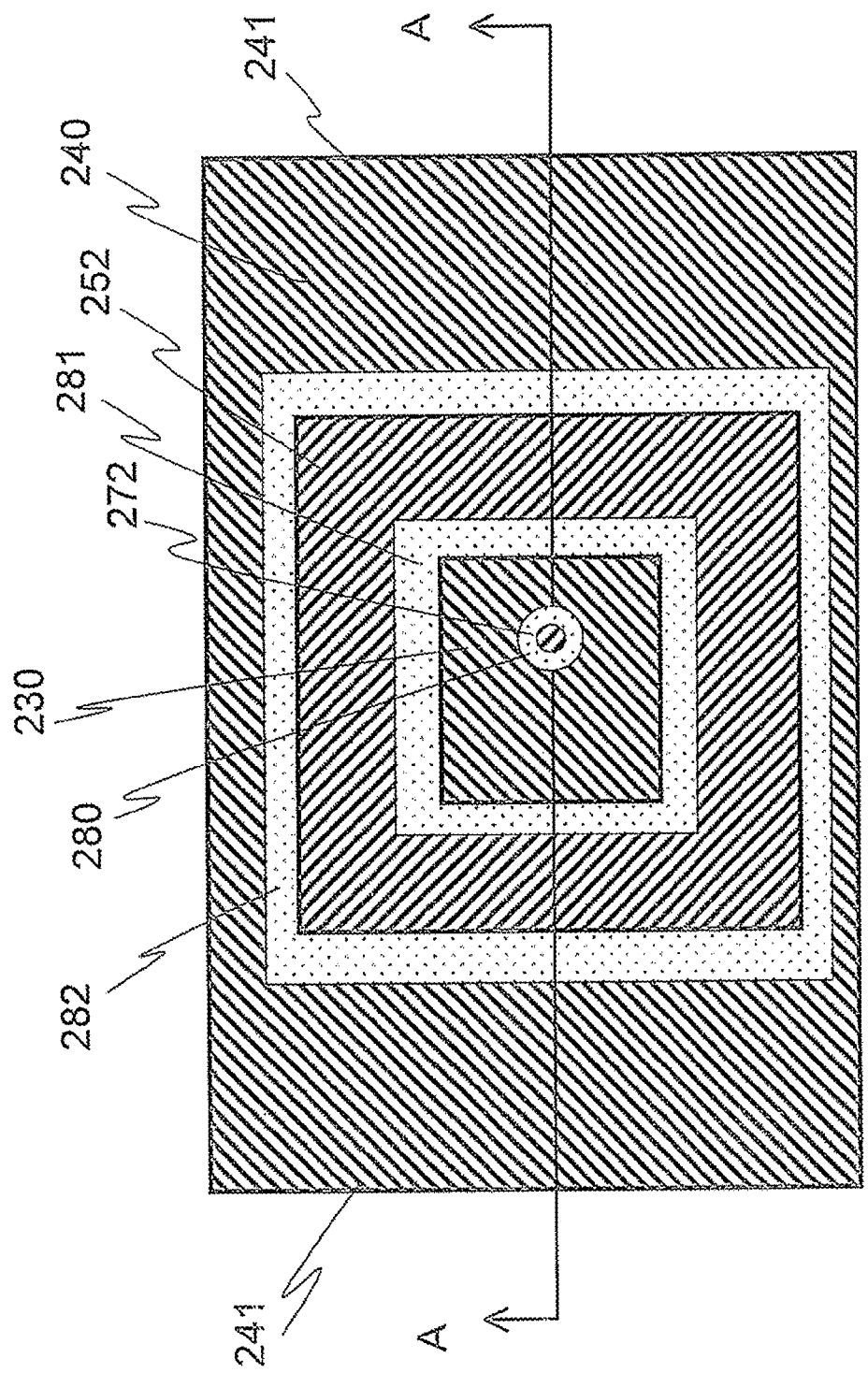
FIG. 56 is a cross-sectional view of FIG. 54 taken along the line J-J.

FIG. 54 is an explanatory diagram illustrating the positional correlation of each layer of the printed wiring board 200 according to the sixth embodiment. A ceiling perspective chart at a horizontal position along the line shown in FIG. 54 will be shown below. FIG. 55 is a cross-sectional view of FIG. 54 taken along the line I-I. On the insulating resin 285, there are vias 271 and 272 for being connected to an LSI 410. FIG. 56 is a cross-sectional view of FIG. 54 taken along the line J-J. There is a through hole 280 around the via 272. Moreover, the power wiring (target circuit portion) 230, a slit 281, the ground 252 inside the power wiring layer, a slit 282, and the power wiring (board power supply portion) 240 spread concentrically. The board power supply is supplied from a power wiring end portion 241.

Figure 57:
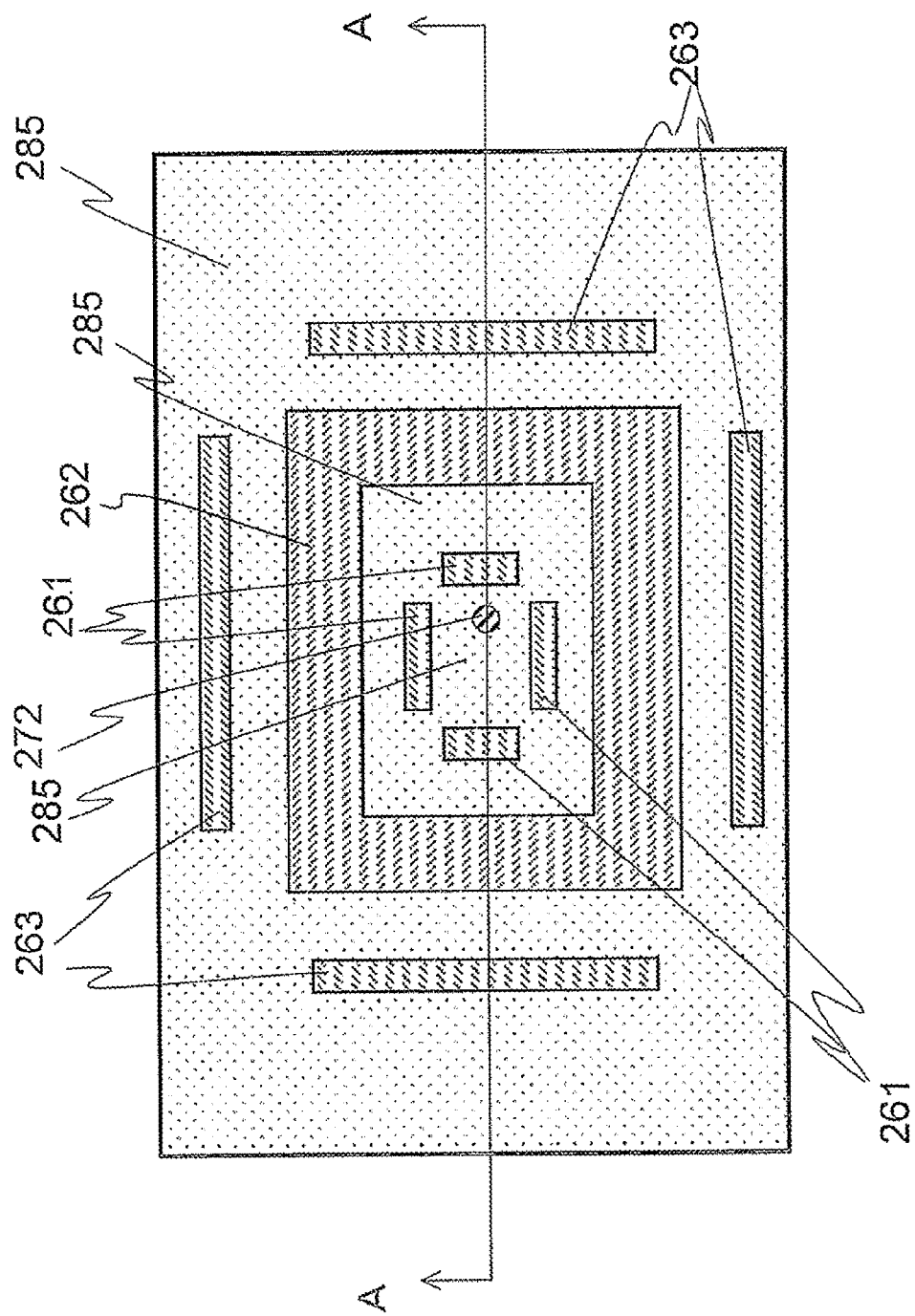
FIG. 57 is a cross-sectional view of FIG. 54 taken along the line B-B.
Figure 58:
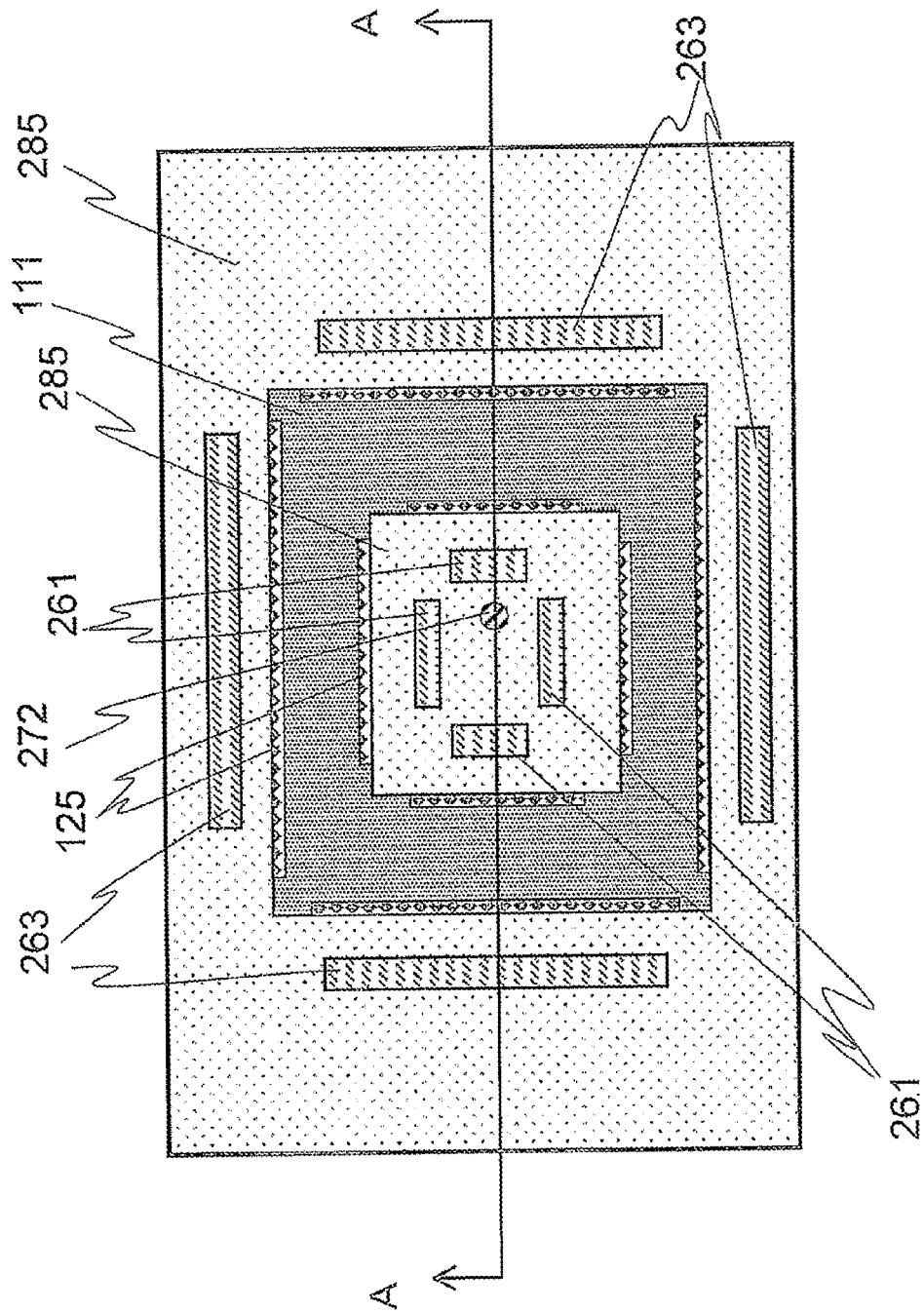
FIG. 58 is a cross-sectional view of FIG. 54 taken along the line C-C.
Figure 59:
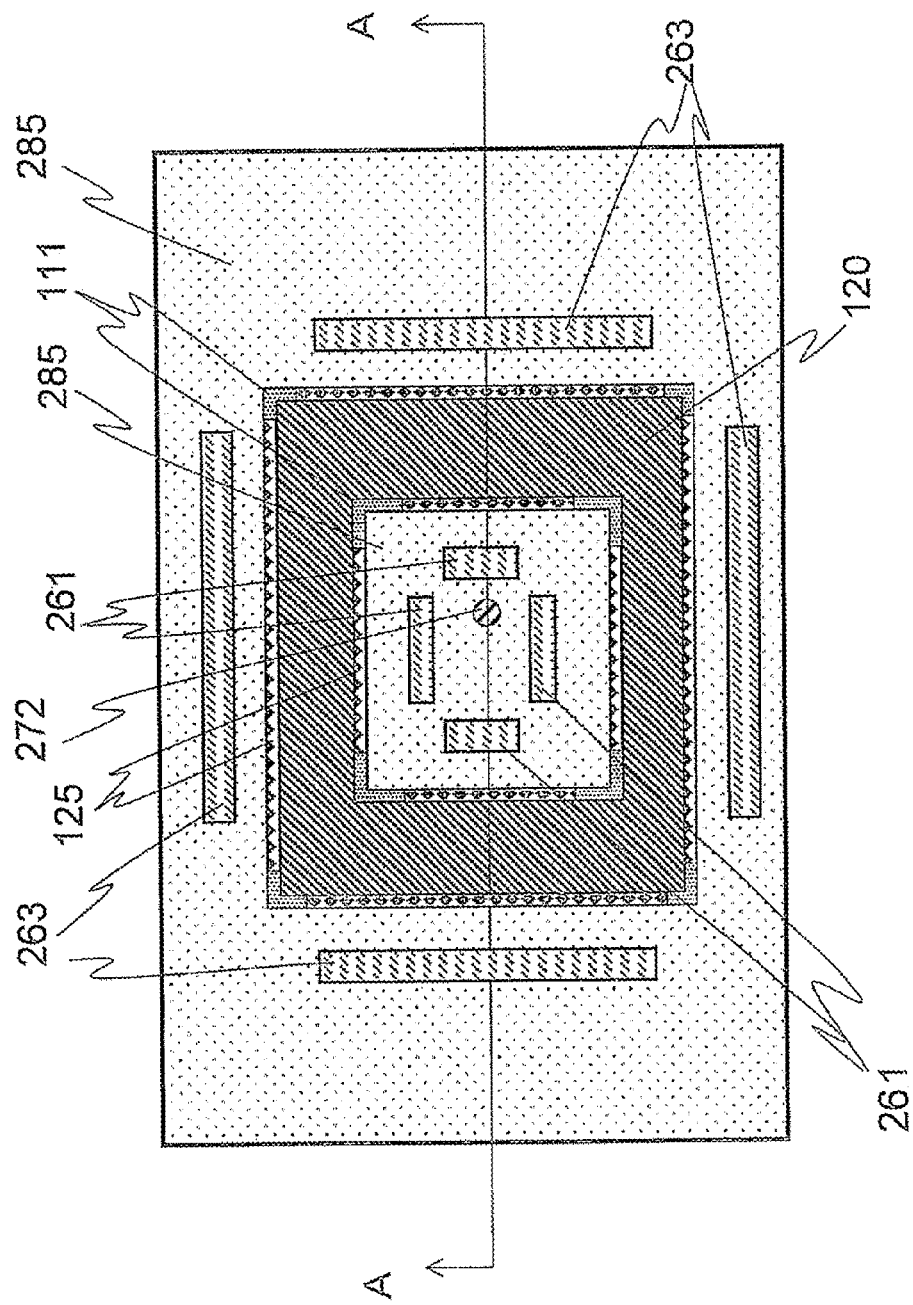
FIG. 59 is a cross-sectional view of FIG. 54 taken along the line D-D.
Figure 60:
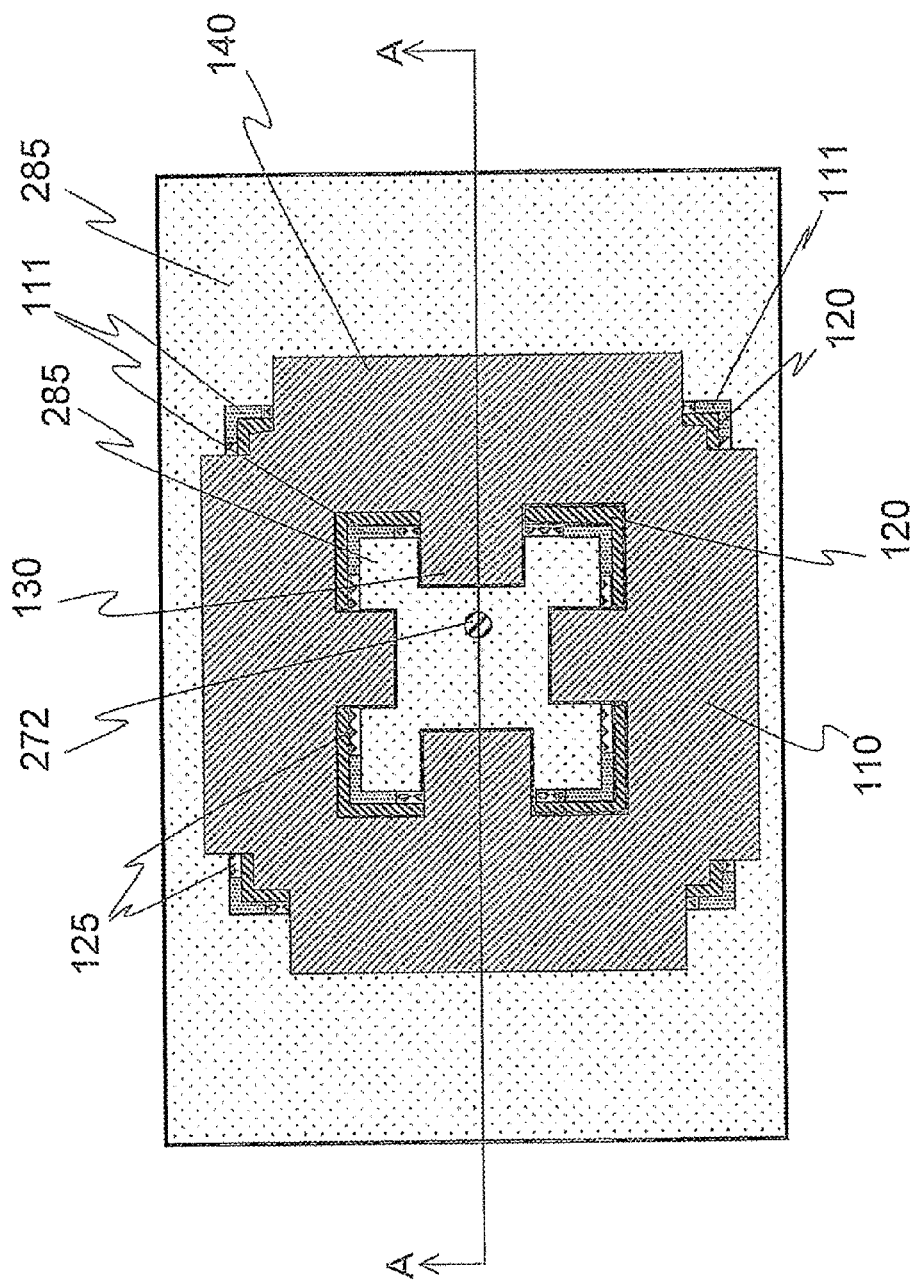
FIG. 60 is a cross-sectional view of FIG. 54 taken along the line E-E.
Figure 61:
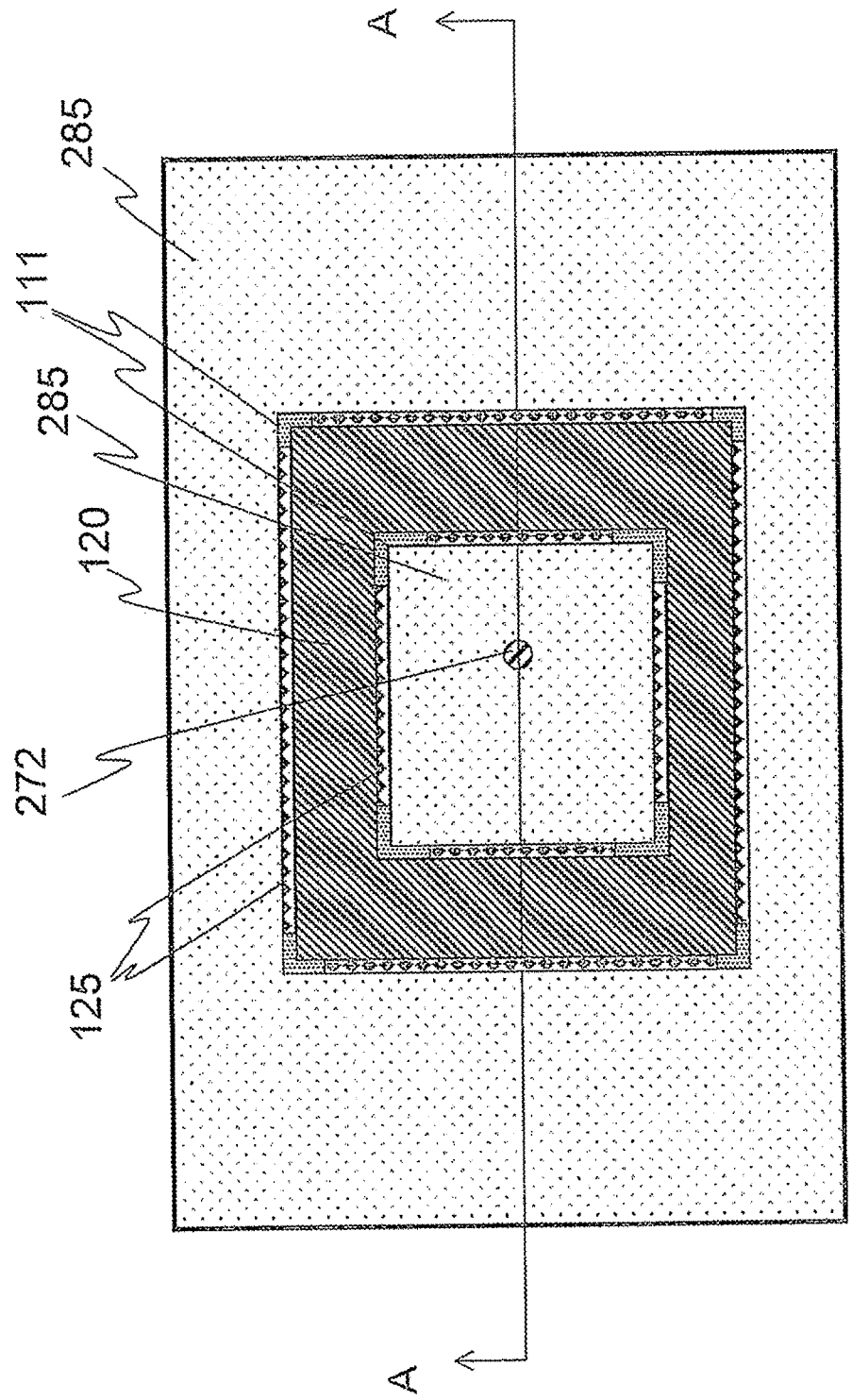
FIG. 61 is a cross-sectional view of FIG. 54 taken along the line F-F.
Figure 62:
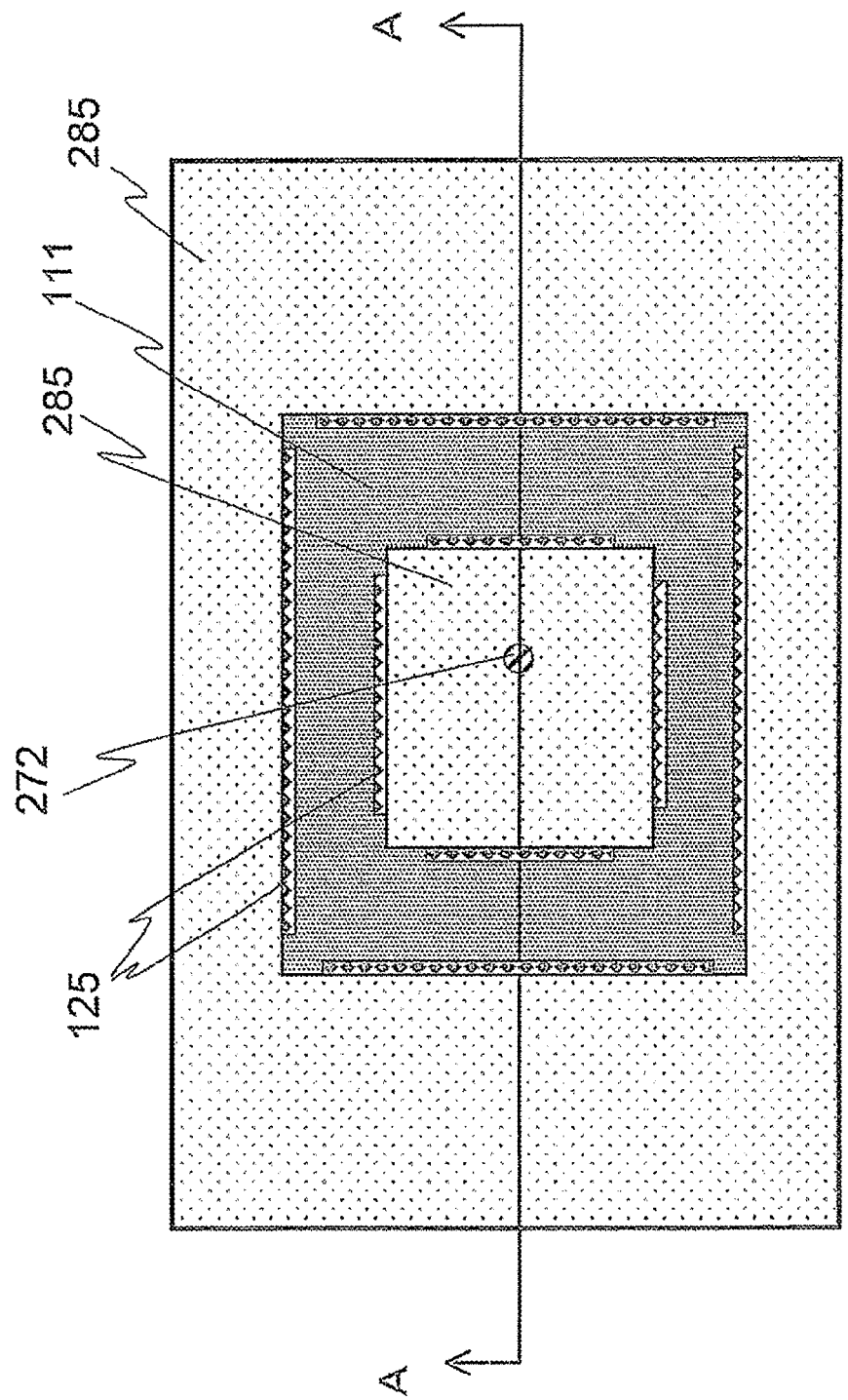
FIG. 62 is a cross-sectional view of FIG. 54 taken along the line G-G.
Figure 63:
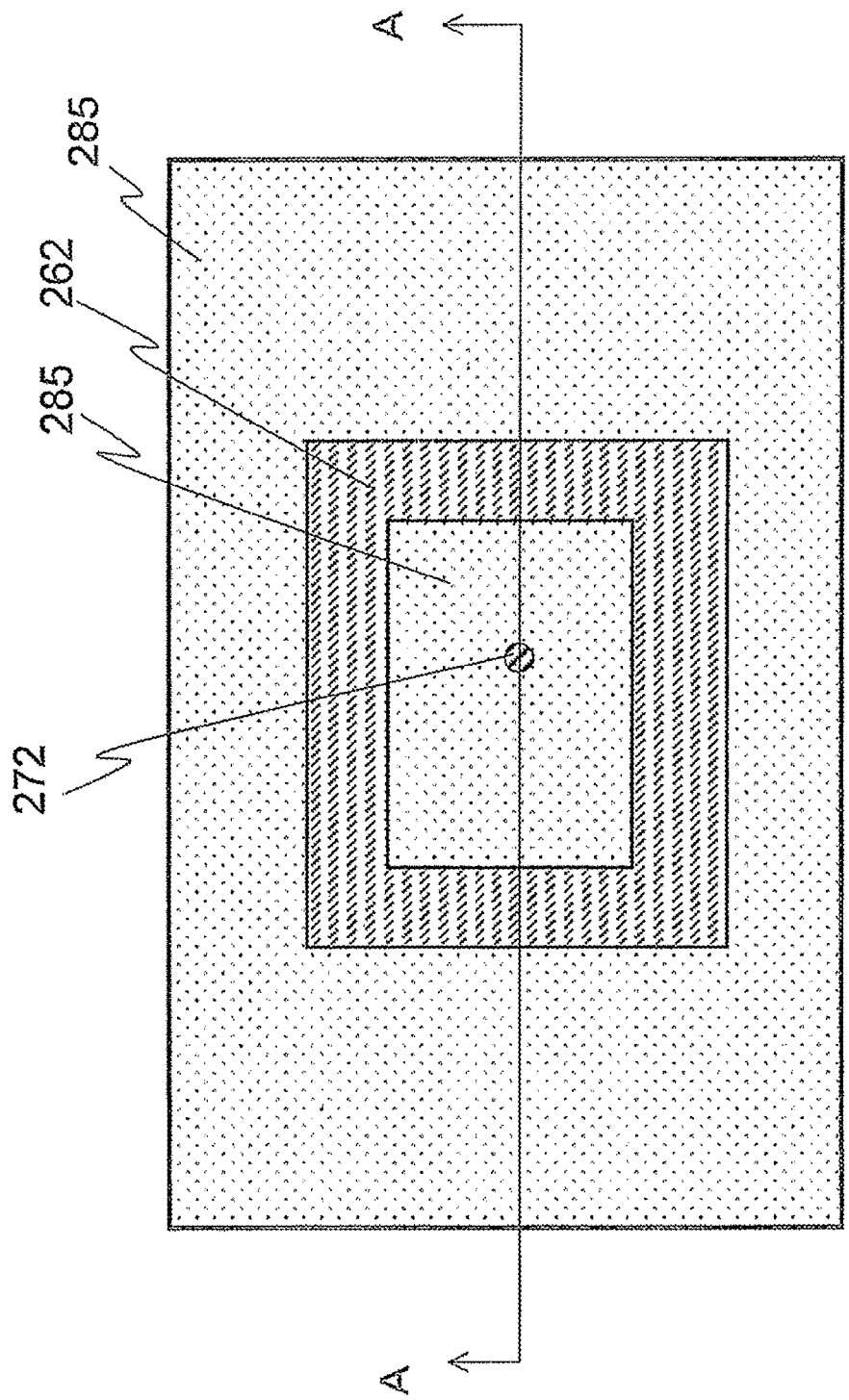
FIG. 63 is a cross-sectional view of FIG. 54 taken along the line H-H.
Figure 64:
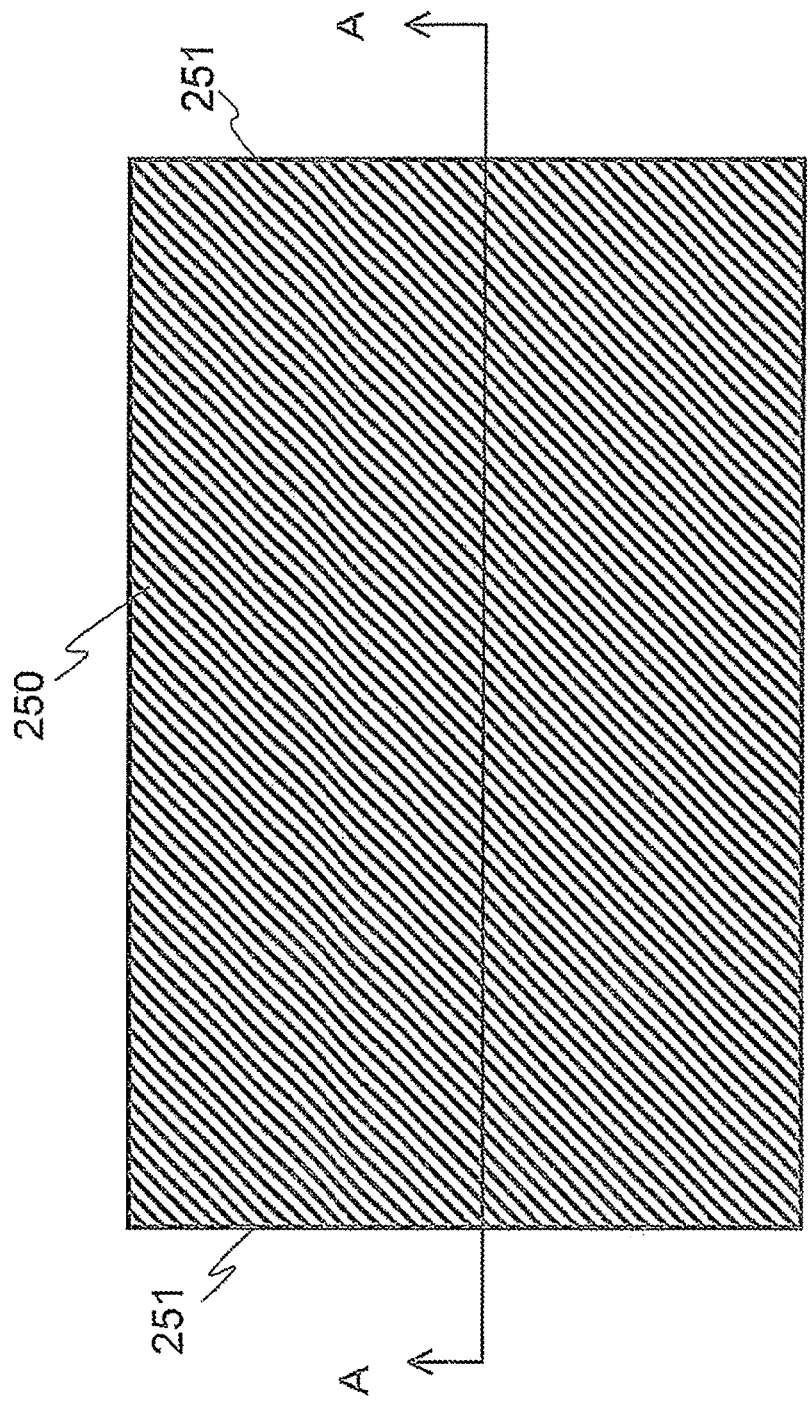
FIG. 64 is a cross-sectional view of FIG. 54 taken along the line K-K.

FIG. 57 is a cross-sectional view of FIG. 54 taken along the line B-B. There are the insulating resin 285, conductive adhesives 261, 262 and 263, and the via 272. It can be confirmed that the conductive adhesive 262 that adheres to the ground 252 inside the power wiring layer is closed. FIG. 58 is a cross-sectional view of FIG. 54 taken along the line C-C, showing the insulating resin 125 of the capacitive element 2, the opposite electrode 111, the conductive adhesives 261 and 263, and the via 272. FIG. 59 is a cross-sectional view of FIG. 54 taken along the line D-D, showing that the opposite electrodes 111 are connected to the lower layer at the four corners of the capacitive element 2. FIG. 60 is a cross-sectional view of FIG. 54 taken along the line E-E. There are four first projecting portions of the electrode 110 at the inner circumference of the capacitive formation portion; there are four second projecting portions at the outer circumference of the capacitive formation portion. FIG. 61 is a cross-sectional view of FIG. 54 taken along the line F-F. FIG. 62 is a cross-sectional view of FIG. 54 taken along the line G-G. FIG. 63 is a cross-sectional view of FIG. 54 taken along the line H-H. FIG. 64 is a cross-sectional view of FIG. 54 taken along the line K-K. It is obvious from FIGS. 61 to 64 that the opposite electrode 111 of the capacitive element 2 is connected to the ground 250 without any space therebetween. Incidentally, the opposite electrode 111 may have the fixed potential other than the ground (GND), and, as described above, the ground 250 may have the fixed potential other than the ground.

Figure 65:
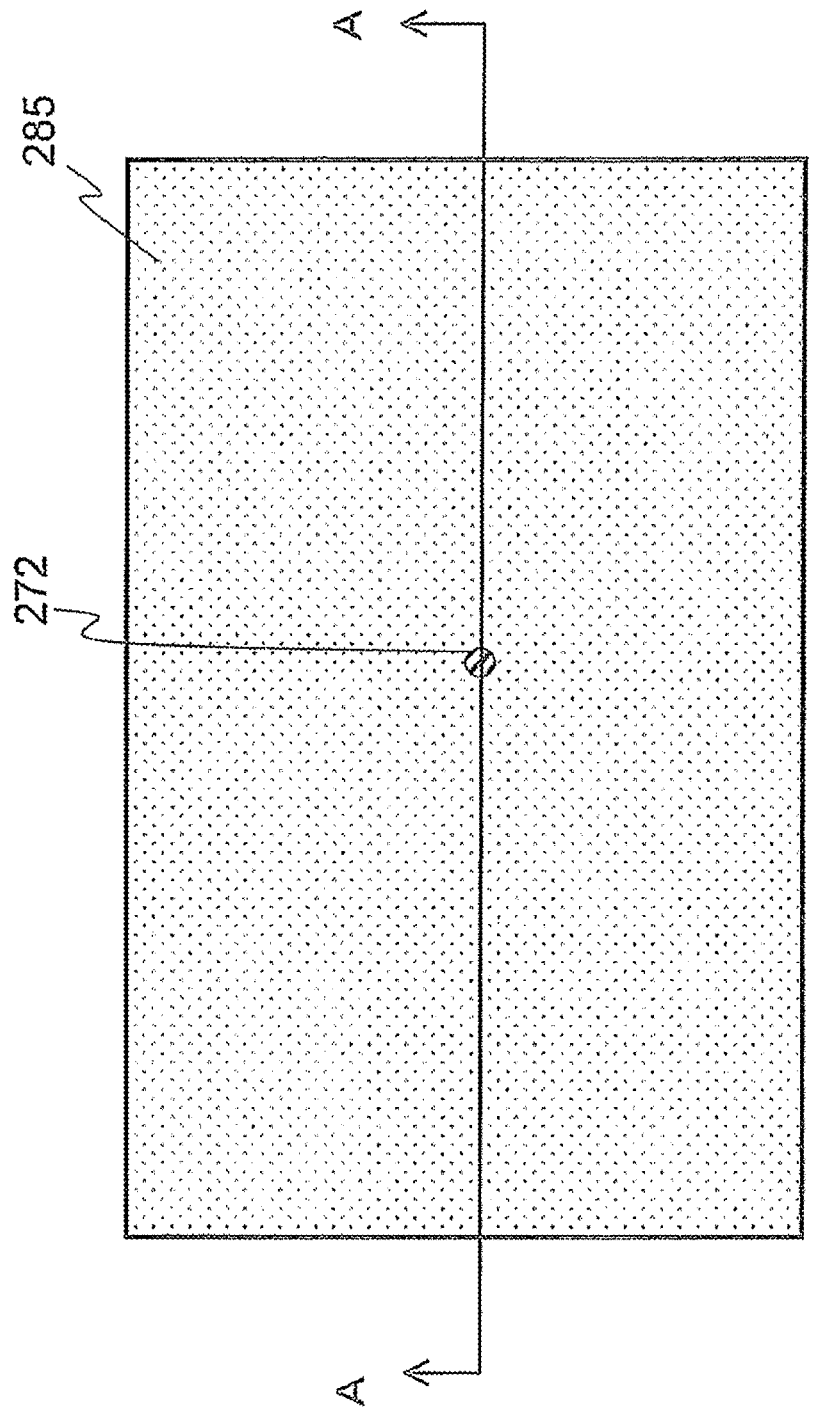
FIG. 65 is a cross-sectional view of FIG. 54 taken along the line L-L.

FIG. 65 is a cross-sectional view of FIG. 54 taken along the line L-L, showing the insulating resin 285 and the via 272. The via 272 pierces through all the layers because the via 272 is formed as a through via after the double-side board 202 is glued together in FIG. 53.

The LSI 410 is mounted, and the power wiring end portion 241 and a ground end portion 251 are connected to a power supply that supplies power to the printed wiring board. In this case, high-frequency power is generated at a noise source 411 inside the LSI 410 due to the operation of the LSI 410. Since the opposite electrode 111 of the capacitive element 2 is connected to the ground 250 and the ground 252 inside the power wiring layer, the high-frequency power generated at the noise source 411 is efficiently blocked when propagating between the layers of the power wirings 230 and 240 and the ground 250.

The high-frequency power generated at the noise source 411 propagates through the insulating layer 285 sandwiched between the power wiring 230 and the ground 250. The propagation of the high-frequency power is considered a pointing vector (energy flowing in the cross product of the magnetic field generated by the electric field produced at the power wiring 230 and the ground 250, and the current flowing in the power wiring 230 and the ground 250). Here, when the pointing vector is transmitted from the area of the power wiring 230 to the area of the power wiring 240, the pointing vector needs to be transmitted through the internal portion of the element of the present embodiment because the power wiring 230 is surrounded by the capacitive formation portion 100 and because the ground 250 and the opposite electrode 111 are connected. However, the capacitive element of the present embodiment can efficiently reduce the pointing vector entering the area of the power wiring 240.

Seventh Embodiment

Figure 66:
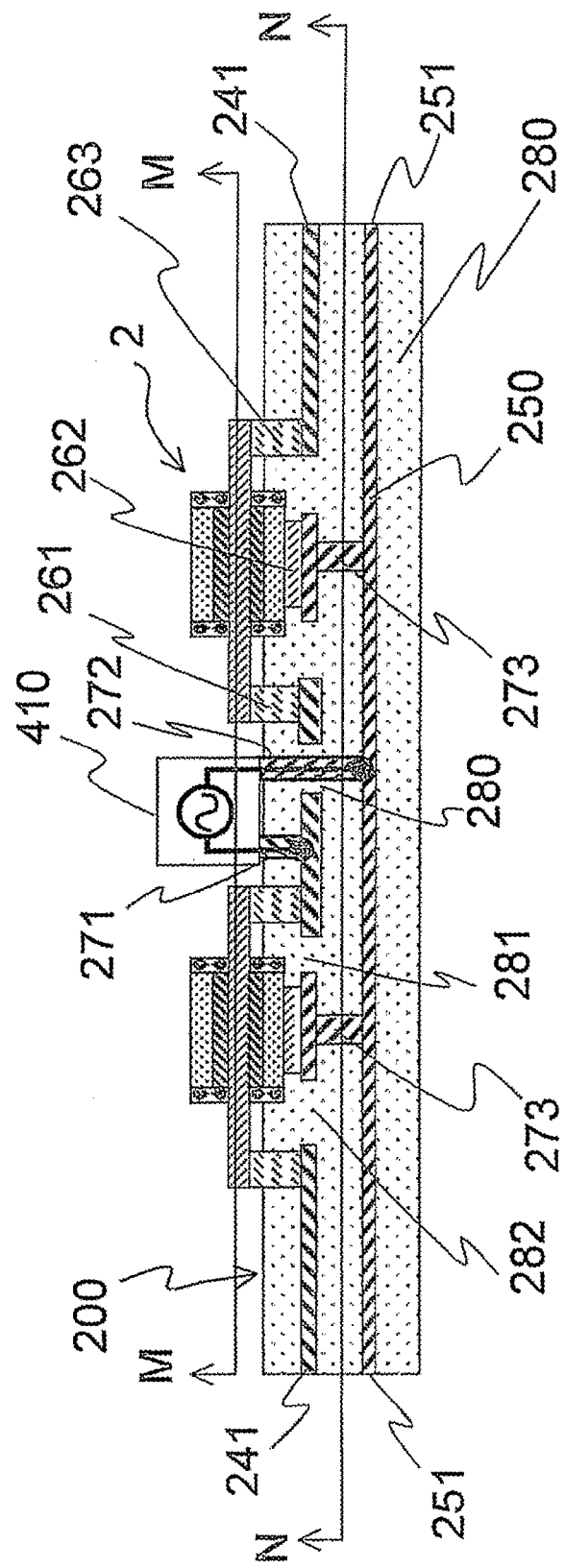
FIG. 66 is a cross-sectional view of a printed wiring board according to a seventh embodiment of the present invention.
Figure 67:
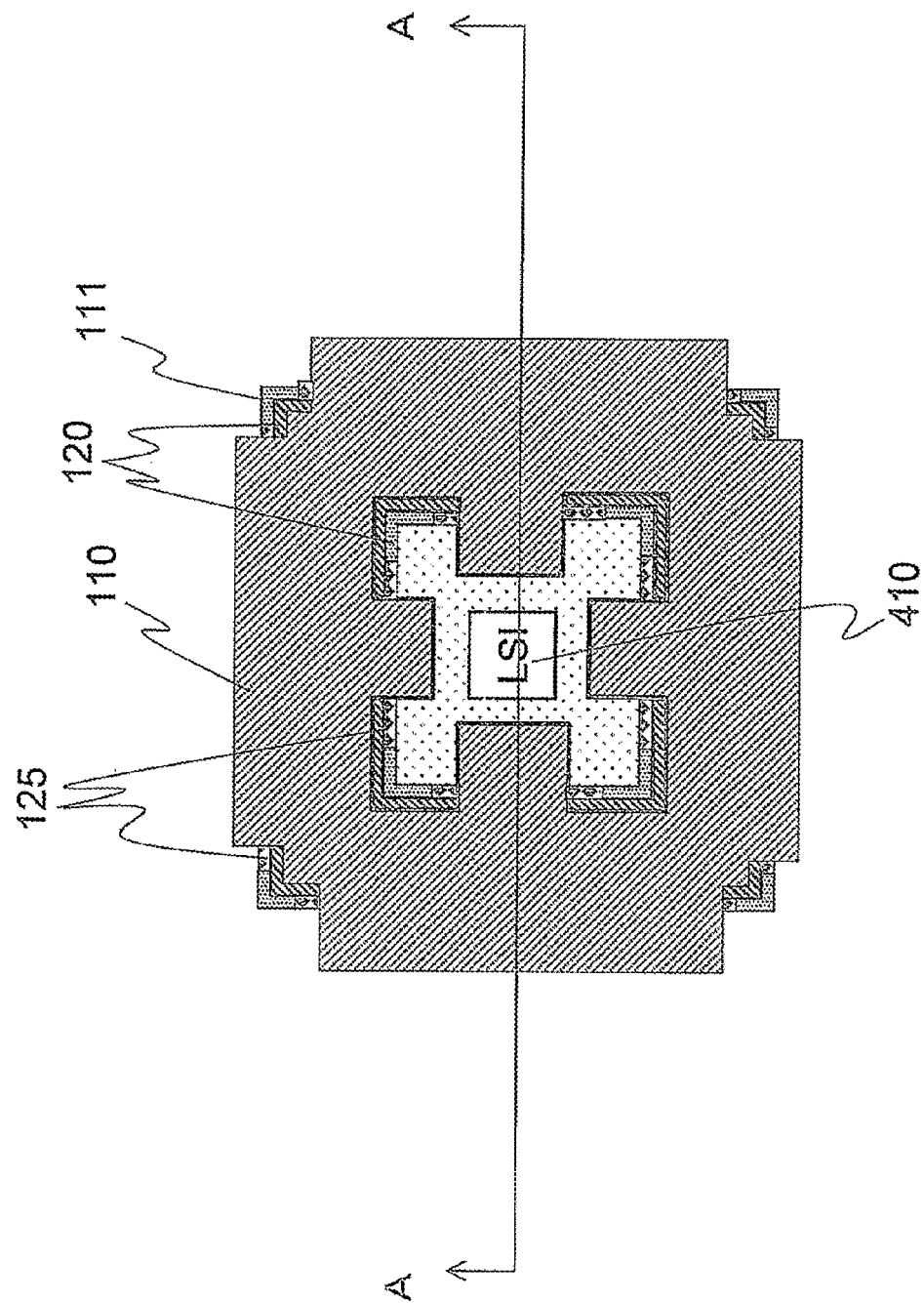
FIG. 67 is a cross-sectional view of FIG. 66 taken along the line M-M.
Figure 68:
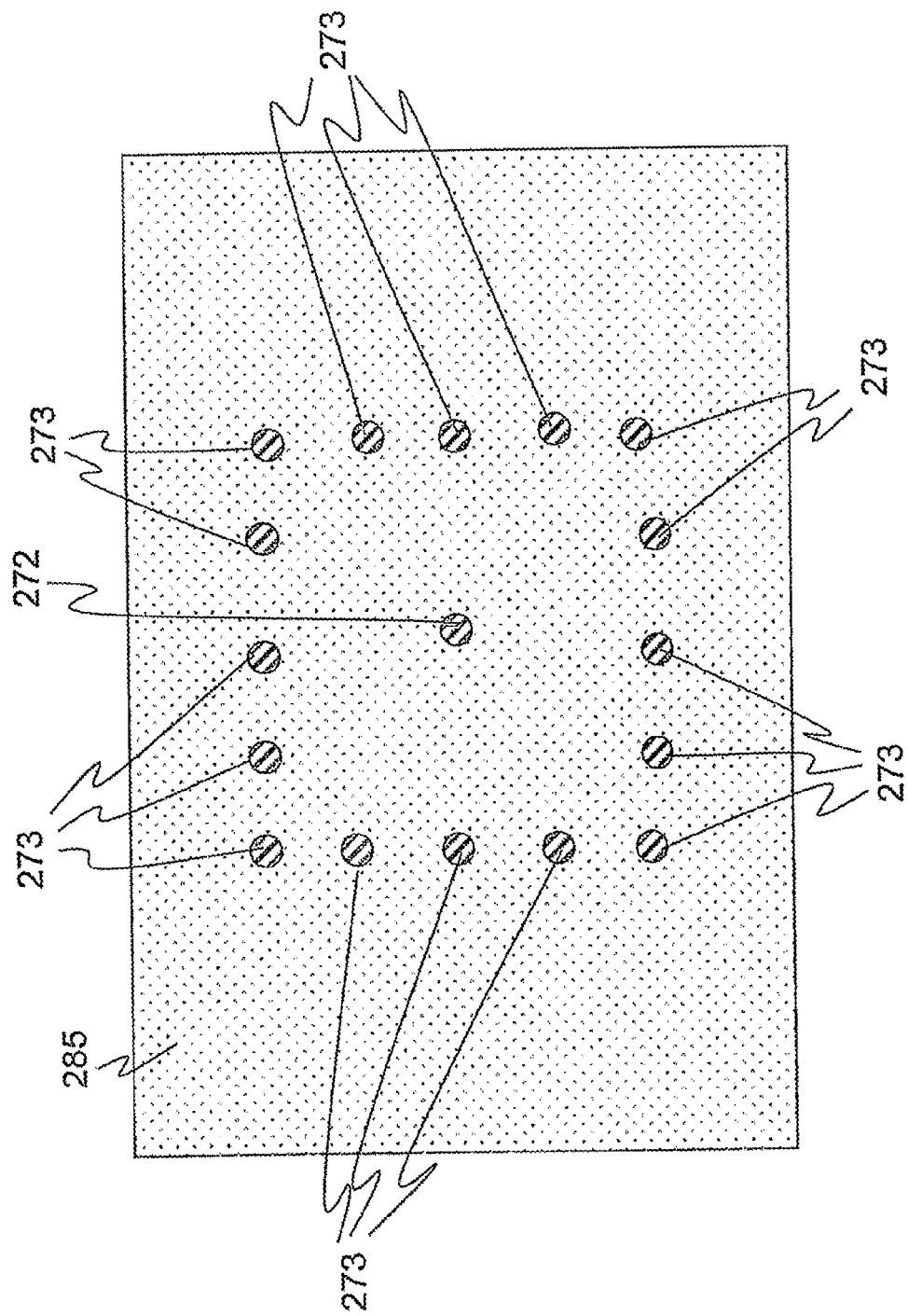
FIG. 68 is a cross-sectional view of FIG. 66 taken along the line N-N.

Then, FIGS. 66 to 68 show the capacitive element 2 provided on the surface layer of the printed wiring board 200 according to a seventh embodiment of the present invention. FIG. 66 is a cross-sectional view, like FIG. 49, along the line A-A. A via 273 electrically connects the ground inside the power wiring layer to the ground 250. FIG. 67 is a cross-sectional view of FIG. 66 taken along the line M-M. Inside the capacitive element 2, the LSI 410 is disposed. The power supply of the LSI 410 is connected to the board power supply portion via the capacitive element 2. FIG. 68 is a cross-sectional view of FIG. 66 taken along the line N-N. The ground of the LSI 410 is connected to the ground 250 via the via 272. The opposite electrode 111 of the capacitive element 2 is connected to the ground 250 via a plurality of vias 273. The vias 273 prevent high-frequency power from propagating between the layers of the power layer and the ground layer. The vias 273 also prevent the excitation of the power layer and the ground. The installation interval between the vias 273 is determined based on a target frequency; about one-tenth of the wavelength inside the board of a target maximum frequency is generally sufficient.

According to the present embodiment, the portion of the element is mounted on the surface of the board to expose part of the opposite electrode 111 from the surface of the board, making it possible to mount a cover for shielding and connect a heat sink to the ground.

Eighth Embodiment

Figure 69:
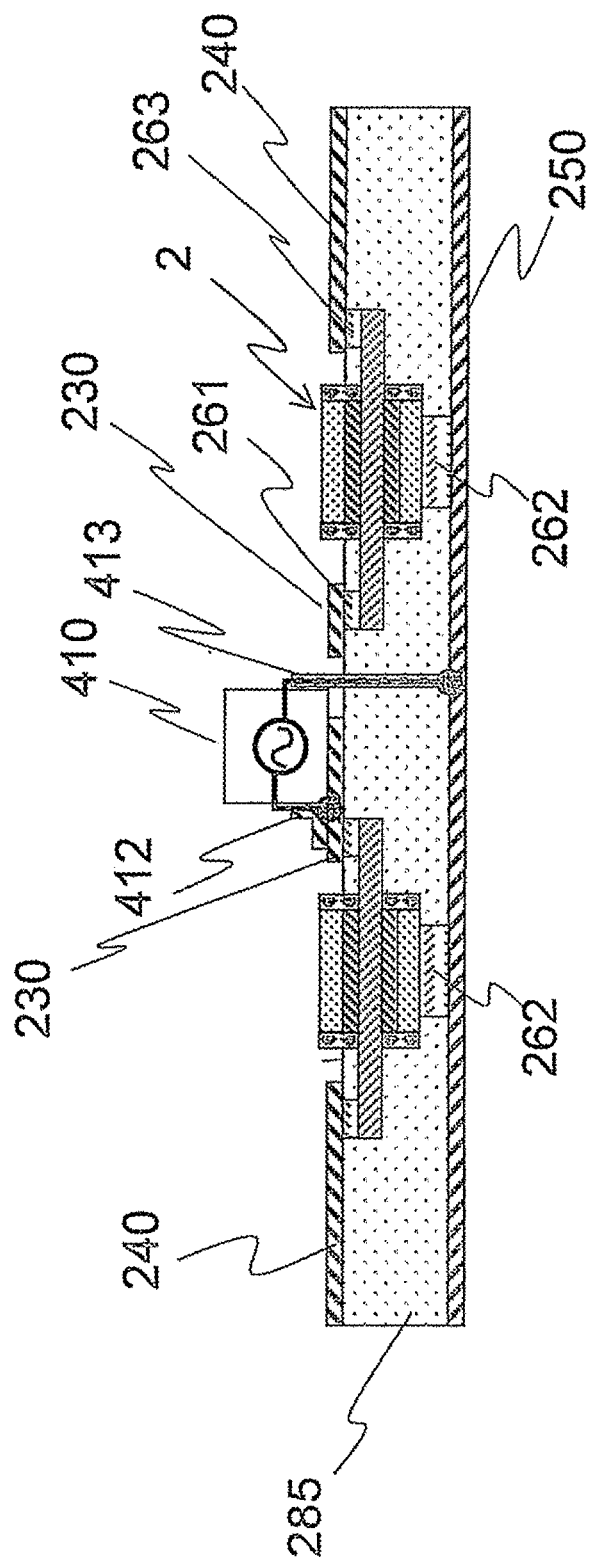
FIG. 69 is a cross-sectional view of an eighth embodiment of the present invention.

Then, FIG. 69 is a cross-sectional view of the double-side board containing the capacitive element 2 according to an eighth embodiment of the present invention. The opposition electrode 111 is bonded to the ground 250 by the conductive adhesive 262. The other surface of the opposite electrode 111 is exposed from the surface of the printed board 200. The exposed opposite electrode 111, for example, can serve as the ground for the heat sink.

According to the present embodiment, like the seventh embodiment, the portion of the element is mounted on the surface of the board to expose part of the opposite electrode 111 from the surface of the board, making it possible to mount the cover for shielding and connect the heat sink to the ground.

Ninth Embodiment

Figure 70:
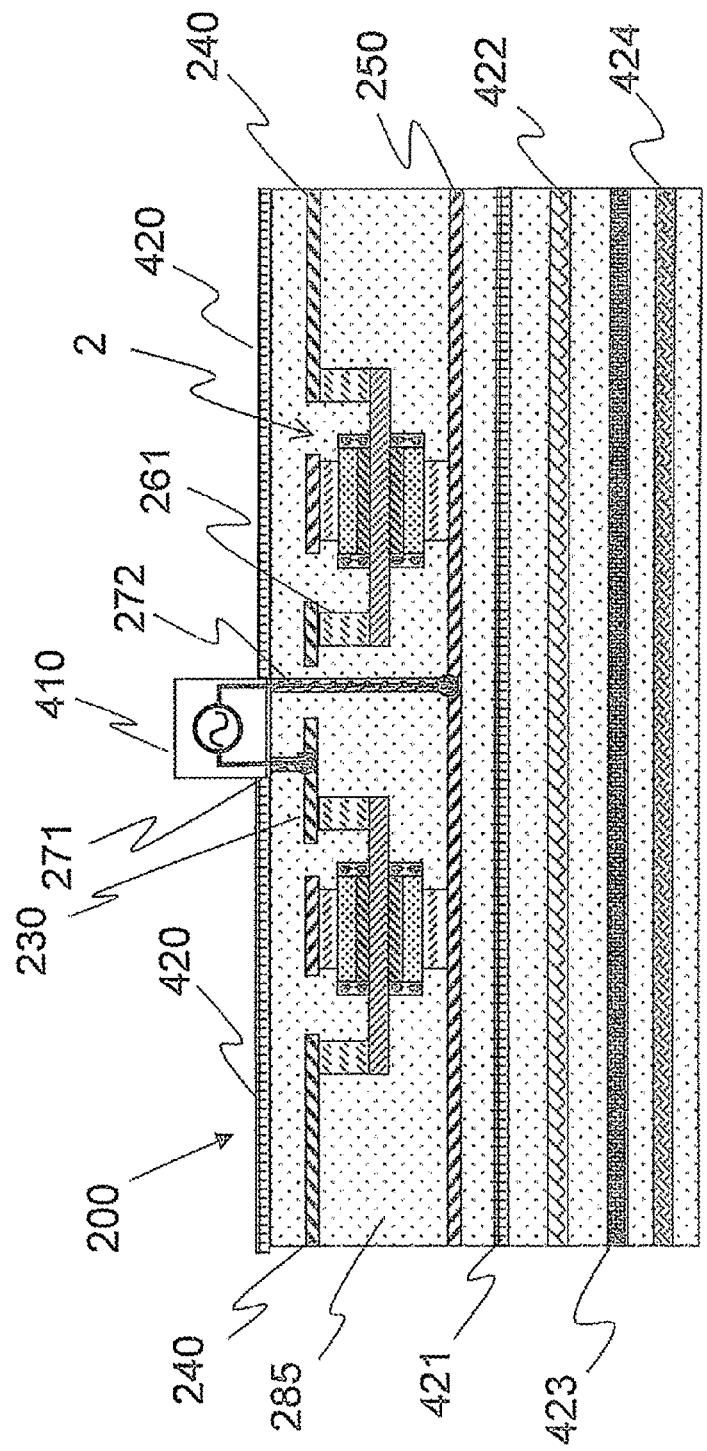
FIG. 70 is a cross-sectional view of a ninth embodiment of the present invention.

Then, FIG. 70 shows a multilayer printed wiring board 200 on which the capacitive element 2 is mounted according to a ninth embodiment of the present invention. The multilayer printed wiring board 200 is produced in the same way as the sixth embodiment. The difference between the ninth and sixth embodiments is that instead of the double-side board 202 of the sixth embodiment, the multilayer board is used. The capacitive element 2 is disposed between the power wiring 240 of the printed wiring board 200 and the ground 250. Signal and other power wirings are wiring layers 420, 421, 422, 423, and 424. The power supply of the LSI 410, which is a target circuit, is connected to the power wiring (target circuit portion) 230 through the via 271. The ground of the LSI 410 is connected to the ground 250 via the via 272. Therefore, the printed wiring board 200 is realized by which the interference caused by the high-frequency power generated from the LSI 410 to the other wiring layers 420, 421, 422, 423, and 424 is small.

Incidentally, if the power wiring connected to the target circuit LSI and the power wiring connected to the power supply should be separated in a height direction perpendicular to the surface of the printed board, the capacitive element including two or more outgoing terminals 131 and 141 may be used on the surface of the capacitive formation portion 100 as described in the fifth embodiment, thereby simplifying the configuration because the projecting portion does not have to be provided.

The above-described printed wiring board can induce an excitation phenomenon between the voltage layers, which is the excitation of high-frequency power between the voltage layer 240 of the printed wiring board 200 and the ground 250, due to the high-frequency power (noise) generated at the target circuit LSI 410. That is, the high-frequency power (noise) propagates through the power wiring, interfering with the operation of the adjacent circuits from the LSI 410 or radiating outside the printed wiring board, and hampers the operation of other devices. Since the capacitive formation portion 100 of the capacitive element surrounds the target circuit LSI 410, the capacitive element reflects or absorbs the noise generated at the LSI 410, reducing the amount of noise propagating through the power wiring. Since the opposite electrode is connected to the ground layer 250 of the printed wiring board 200, a shield wall is formed between the power layer and the ground layer, providing an effect to efficiently reduce the spatial coupling that propagates through the space as an electromagnetic field. According to Patent Documents 4 to 8, high-frequency power propagates from the circuit-side edge portion of the separated power layer to the edge portion of the power layer of the printed wiring board due to spatial coupling. Therefore, the decoupling element having filtering characteristics cannot demonstrate the true capability thereof. According to the configurations of the sixth to ninth embodiments, dramatic improvements are made to such points.

Tenth Embodiment

Figure 71:
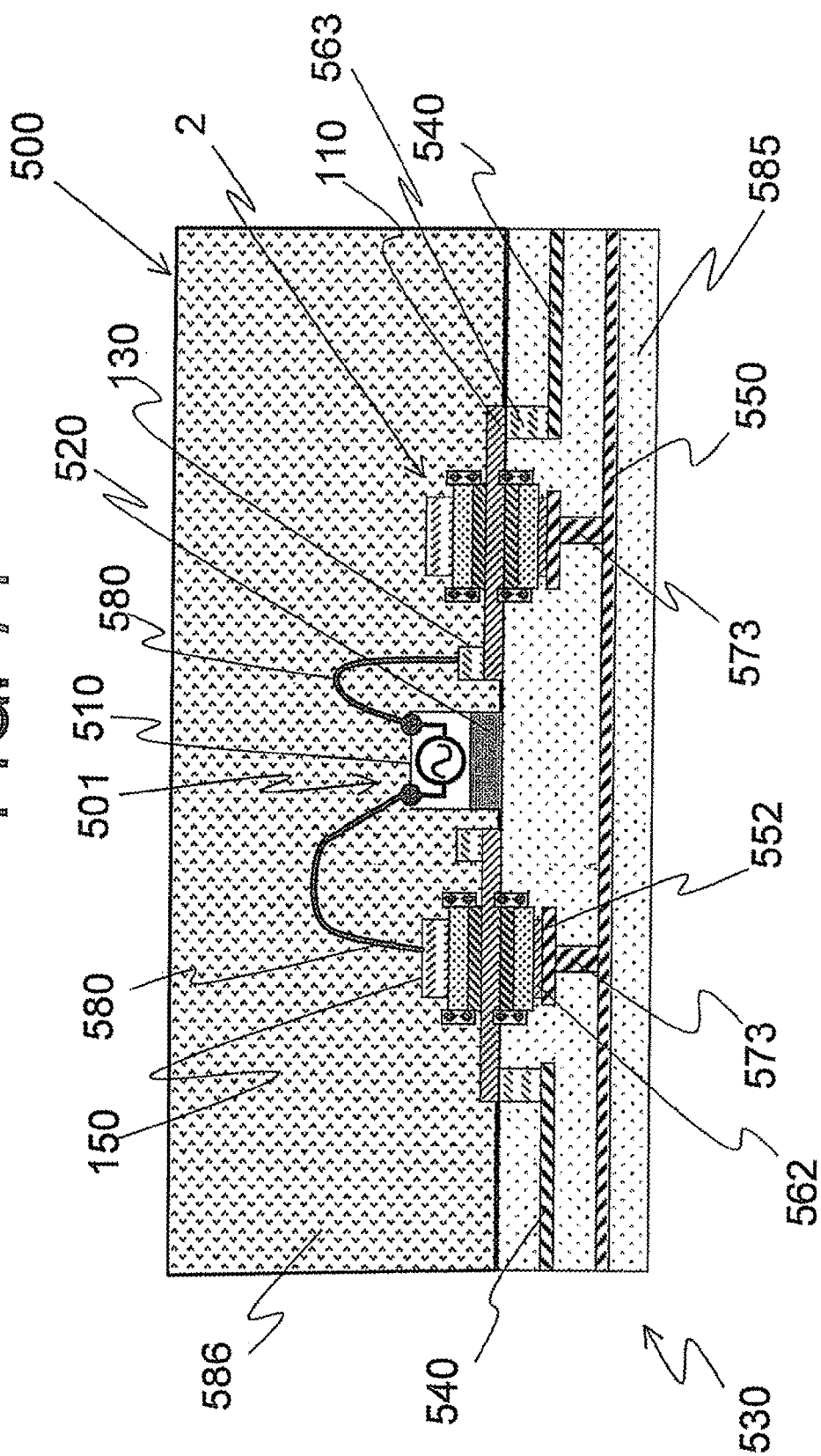
FIG. 71 is a cross-sectional view of a tenth embodiment of the present invention.

Then, FIG. 71 shows a semiconductor package 500 in which the capacitive element 2 is mounted according to a tenth embodiment of the present invention. In an interposer 530, a ground 552 is provided on the same layer as a power wiring 540, a ground 550, and a power wiring 540 are. The ground 552 is connected to the ground 550 through a via 573. The second projecting portion at the outer circumference of the capacitive formation portion of the capacitive element is connected to the power wiring 540 by a conductive adhesive 563. The opposite electrode of the capacitive element is connected to the ground 552 inside a power layer by a conductive adhesive 562. A semiconductor chip 501 on a silicon wafer 502 of which a functional circuit portion 510 is formed is bonded to the interposer 530. The internal circumference outgoing terminal 130 of the first projecting portion at the inner circumference of the capacitive formation portion of the capacitive element, an outgoing terminal 150 of the opposite electrode of the capacitive element, and the like are connected to the semiconductor chip 501 by a bonding wire 580. The components are sealed by a molding resin 586. Therefore, it is possible to efficiently reduce the amount of high-frequency power propagating outside the semiconductor package after being generated at the functional circuit portion 510. The reference numeral 585 denotes an insulating resin. The object of the molding resin 586 is to protect the semiconductor chip 501 from outside air. Therefore, as long as the molding resin 586 can block outside air, it is not necessary to fill up so as to leave no space, and there may be an air bubble.

Eleventh Embodiment

Figure 72:
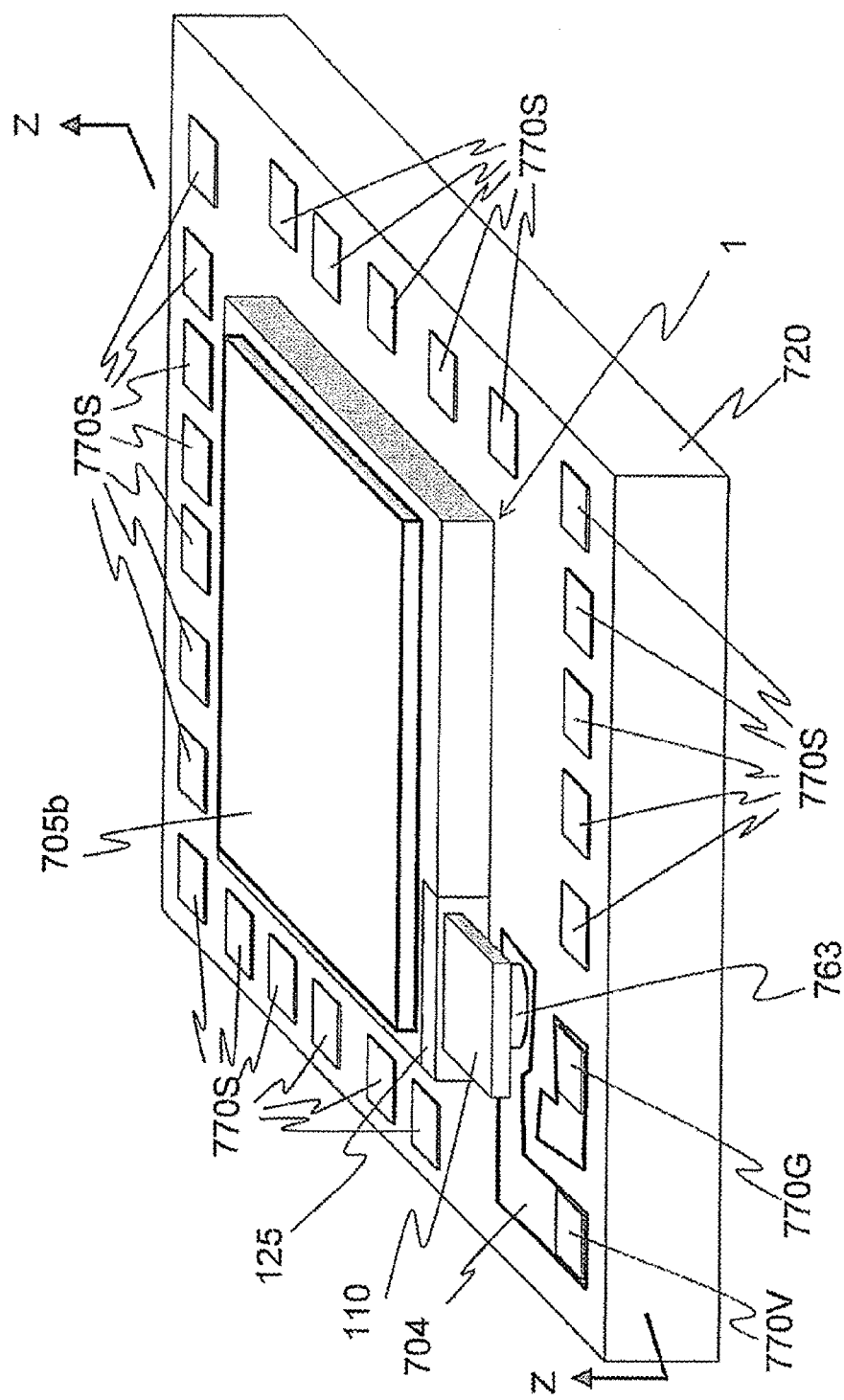
FIG. 72 is a perspective view of an eleventh embodiment of the present invention.
Figure 81:
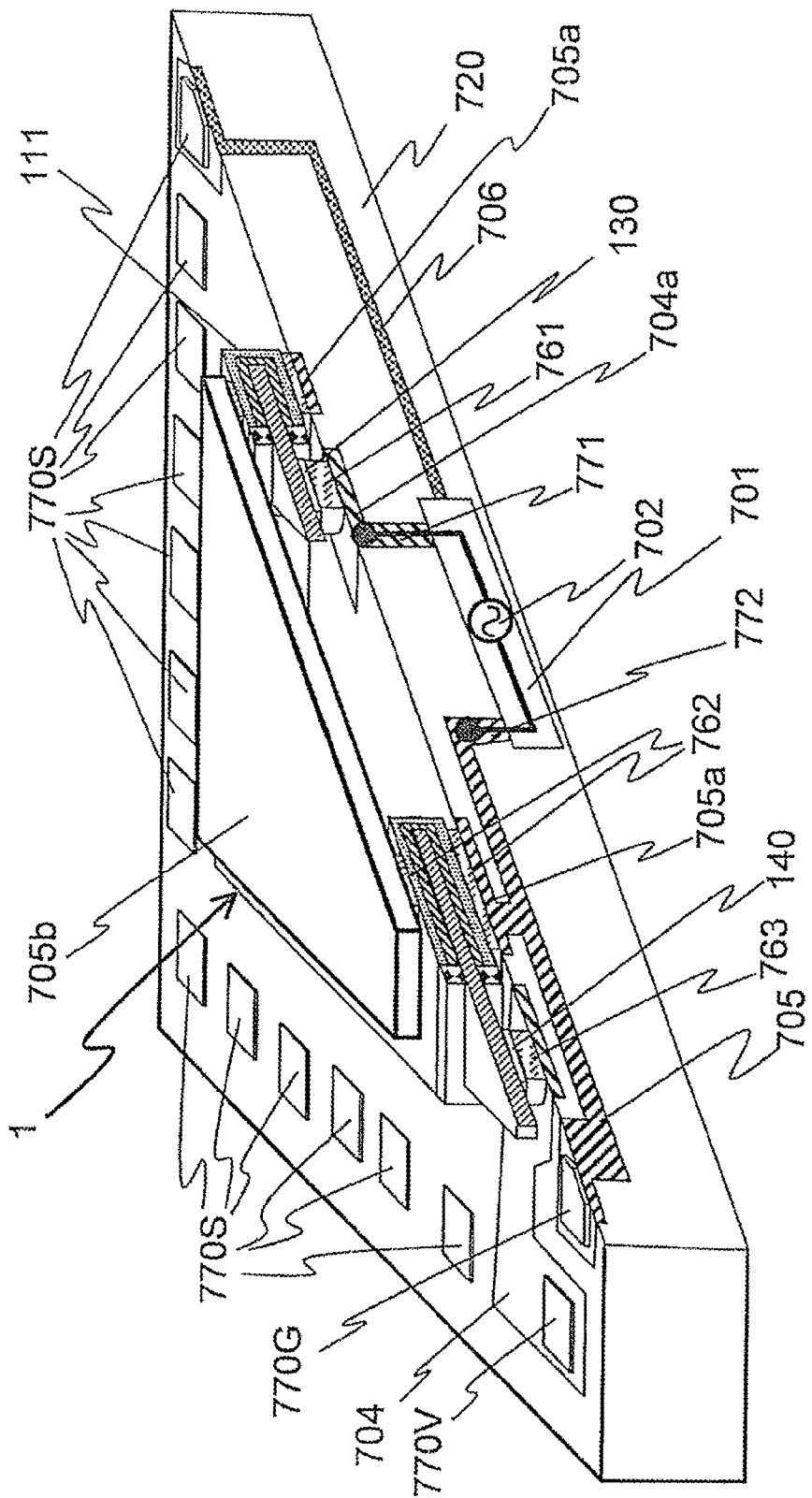
FIG. 81 is a perspective view of FIG. 72 cut along the line Z-Z.

Then, FIGS. 72 and 81 show a semiconductor circuit where the capacitive element 1 is disposed on a silicon wafer 720 according to an eleventh embodiment of the present invention. FIG. 72 is a perspective view of the semiconductor circuit. FIG. 81 is a perspective view of FIG. 72 cut along the line Z-Z.

As shown in FIG. 81, a functional circuit portion 701 is formed inside the silicon wafer 720. According to the present embodiment, inside the functional circuit portion 701, there is a noise source 702. The noise source 702 is connected to a power layer 704a and a ground layer 705 through vias 771 and 772. The capacitive element 1 is disposed on the silicon wafer 720. The outer circumference outgoing terminal 140 is connected to the power layer 704 by a conductive adhesive 763. The internal circumference outgoing terminal 130 is connected to the power layer 704a by a conductive adhesive 761.

The opposite electrode 111 of the capacitive element 1 is connected to ground layers 705a and 705b by a conductive adhesive 762. On the upper surface of the silicon wafer 720, pads (a power supply pad 770V, a ground pad 770G, and signal pads 770S) to which bonding wires are connected are provided. The signal pads 770S are connected to the functional circuit portion 701 through a signal wiring 706. Part of the signal wiring 706 is omitted for simplification.

The ground layer 705b plays an effective role to suppress the radiation of electromagnetic waves directly from the noise source 702. If the noise generated at the noise source 702 is small, the ground layer 705b can be omitted.

According to the above configuration, the high-frequency power propagating through the via 771 after being generated at the noise source 702 enters the capacitive element 1 via the internal circumference outgoing terminal 130, passes through the internal portion of the capacitive element 1, and reaches the power layer 704 via the outer circumference outgoing terminal 140. Therefore, provided is the semiconductor circuit that can efficiently demonstrate the performance of the capacitive element 1.

In the examples of the above-described sixth to tenth embodiments, the capacitive element of the second embodiment is provided. However, the capacitive elements of the first, and third to fifth embodiments may be used when necessary. Moreover, in the example of the eleventh embodiment, the capacitive element of the first embodiment is provided. However, the capacitive elements of the second to fifth embodiments may be used when necessary.

Moreover, in the examples of the sixth to eleventh embodiments, the circuit that generates high-frequency power is disposed inside the capacitive element. However, the circuit that needs protection against high-frequency power may be disposed to suppress the effect of the high-frequency power from outside the capacitive element.

Twelfth Embodiment

In the example of the above-mentioned fifth embodiment, as shown in FIGS. 46 to 48, the dielectric layer and the opposite electrode are opened to expose the electrode, and the upper-portion outgoing terminal 131 and the lower-portion outgoing terminal 141 are respectively provided on the ceiling plane and the bottom plane of the capacitive formation portion 100.

Figure 82:
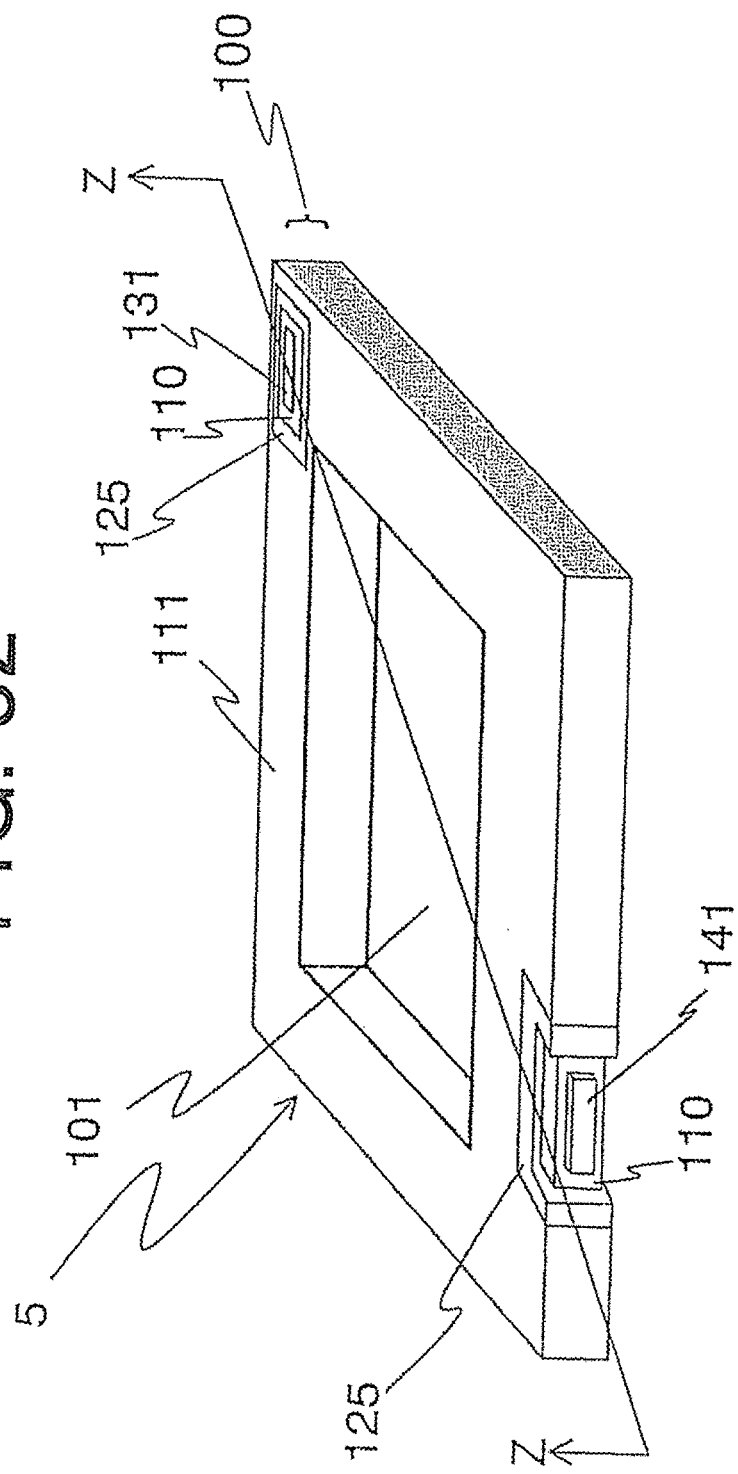
FIG. 82 is a perspective view of a capacitive element according to a twelfth embodiment of the present invention.
Figure 83:
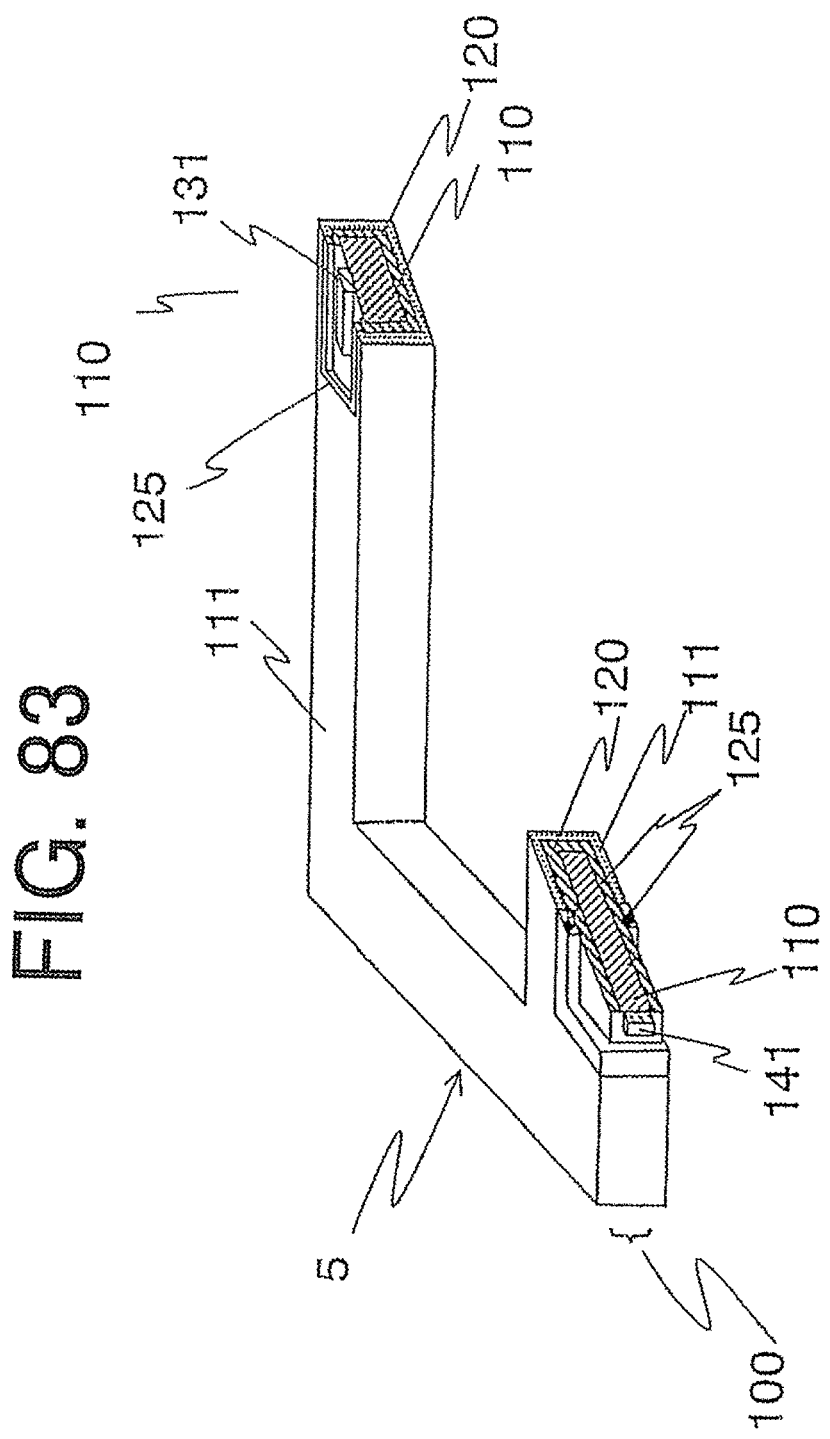
FIG. 83 is a perspective view of FIG. 82 cut along the line Z-Z.

In an example of the present embodiment, one outgoing terminal is provided on the side plane of the outer circumference of the capacitive formation portion 100. FIG. 82 is a perspective view of a capacitive element according to a twelfth embodiment of the present invention. FIG. 83 is a perspective view of FIG. 82 cut along the line Z-Z. According to the present embodiment, one outgoing terminal 131 is provided on the ceiling plane, while the outgoing terminal 141 is provided on the side plane of the capacitive formation portion 100.

According to the present embodiment, a dielectric layer and an opposite electrode, which are respectively positioned at the ceiling plane and the side plane of the capacitive formation portion 100, are opened to expose an electrode that serves as a connection portion with a circuit, and the outgoing terminals 131 and 141 are provided. However, there may be two exposed surfaces, which serve as the connection portions, on the ceiling plane, two on the bottom plane, and two on the side plane. One of the exposed surfaces on the side plane is, for example, provided on the plane of the inner circumference, and the other on the plane of the outer circumference. The outgoing terminals are provided on the above exposed surfaces.

Moreover, the projecting portions of the first to fourth embodiments and the exposed surface of the fifth or present embodiment can be used in combination. For example, there are a combination of the first projecting portion $110_1$ of the first embodiment and the exposed surface provided on the side plane of the outer circumference of the capacitive formation portion 100 of the second embodiment, and a combination of the second projecting portion $110_2$ of the first embodiment and the exposed surface provided on the side plane of the inner circumference of the capacitive formation portion 100, as examples of the configuration.

The above describes the representative embodiments of the present invention. However, the present invention may be embodied in other specific forms without departing from the spirit or essential characteristics as defined by the appended claims. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

INDUSTRIAL APPLICABILITY

The present invention can be applied to a printed wiring board, a semiconductor package, and a semiconductor circuit that operate in high frequency or at high speed with large amounts of power and that can be equipped with a circuit generating high-frequency noise. Moreover, the present invention is expected to have an effect to prevent high-frequency power from entering a target circuit from the outside, and may be applied to a circuit or semiconductor that requires immunity capabilities.

The invention claimed is:
1. A capacitive element comprising
a capacitive formation portion that includes an opening for surrounding a circuit that generates high-frequency power or needs to be protected from high-frequency power, wherein
the capacitive formation portion, which is shaped in form of a loop, includes an electrode in the shape of a closed curve, a dielectric layer that covers the electrode, and an opposite electrode that covers the dielectric layer and faces the electrode, wherein the dielectric layer is piled on a ceiling surface, a bottom surface, and side circumference surfaces of the electrode; and the opposite electrode is piled on a ceiling surface, a bottom surface, and side circumference surfaces of the dielectric layer;

the electrode includes at least one first projecting portion for electric connection which is formed as a portion that projects from a core of the capacitive formation portion in a direction of inside the capacitive formation through the inner circumference of the capacitive formation portion, and at least one second projecting portion for electric connection which is formed as a portion that projects from the core of the capacitive formation portion in a direction of outside of the capacitive formation through the outer circumference of the capacitive formation portion;

the dielectric layer and the opposite electrode surround, except the first and second projecting portions, the electrode; and the first projecting portion serves as a connection portion to be electrically connected to the circuit.

2. The capacitive element according to claim 1, wherein the number of at least one of the first and second projecting portions is more than one.

3. The capacitive element according to claim 1, wherein a first outgoing terminal is provided on the first projecting portion, and a second outgoing terminal is provided on the second projecting portion.

4. The capacitive element according to claim 1, wherein the capacitive formation portion is in the shape of a square frame, and the second projecting portion is mounted on the corner of the outer circumference of the capacitive formation portion.

5. The capacitive element according to claim 1, wherein the capacitive formation portion is in the shape of a square frame, and the first projecting portion is mounted on the corner of the inner circumference of the capacitive formation portion.

6. The capacitive element according to claim 1, wherein one or both of the electrode or the opposite electrode are made of a metal having a valve action.

7. The capacitive element according to claim 1, wherein the dielectric layer includes a metal oxide film.

8. The capacitive element according to claim 1, wherein the opposite electrode which is made of a plurality of conductive materials is connected to a fixed potential layer.

9. A printed wiring board comprising:
a circuit that generates high-frequency power or needs to be protected from high-frequency power, the circuit being mounted on the printed wiring board; and
a capacitive element claimed in claim 1 and provided inside the printed board or on the surface of the printed board,
wherein the circuit is disposed inside the opening of the capacitive element.

10. The printed wiring board according to claim 9, wherein the potential of the opposite electrode of the capacitive element is fixed.

11. A semiconductor package comprising:
an interposer having a power wiring;
a capacitive element claimed in claim 1 and placed on the interposer; and
a circuit that is surrounded by the capacitive element, and generates high-frequency power or needs to be protected from high-frequency power.

12. The semiconductor package according to claim 11, wherein
the interposer includes a fixed potential wiring, and an opposite electrode of the capacitive element is connected to the fixed potential wiring.

13. A semiconductor circuit comprising:
a semiconductor substrate on which a power wiring is formed;
a capacitive element claimed in claim 1 and placed on the semiconductor substrate; and
a circuit that is surrounded by the capacitive element, and generates high-frequency power or needs to be protected from high-frequency power.

14. The semiconductor circuit according to claim 13, wherein
a fixed potential wiring is formed on the semiconductor substrate, and an opposite electrode of the capacitive element is connected to the fixed potential wiring.

15. A capacitive element comprising
a capacitive formation portion that includes an opening for surrounding a circuit that generates high-frequency power or needs to be protected from high-frequency power, wherein
the capacitive formation portion, which is shaped in form of a loop, includes an electrode in the shape of a closed curve, a dielectric layer that covers the electrode, and an opposite electrode that covers the dielectric layer and faces the electrode, wherein
the dielectric layer is piled on a ceiling surface, a bottom surface, and side circumference surfaces of the electrode; and
the opposite electrode is piled on a ceiling surface, a bottom surface, and side circumference surfaces of the dielectric layer;
the dielectric layer and the opposite electrode are opened so as to expose at least a portion of one surface of the electrode and a portion of the other surface of the electrode or to expose at least two portions of one surface of the electrode; and
one of the exposed surfaces of the electrode serves as a connection portion to be electrically connected to the circuit.

16. The capacitive element according to claim 15, wherein an outgoing terminal is provided on the exposed electrode surface.

17. The capacitive element according to claim 15, wherein one or both of the electrode or the opposite electrode are made of a metal having a valve action.

18. The capacitive element according to claim 15, wherein the dielectric layer includes a metal oxide film.

19. The capacitive element according to claim 15, wherein either the electrode or the opposite electrode is made of a plurality of conductive materials.

20. A printed wiring board comprising:
a circuit that generates high-frequency power or needs to be protected from high-frequency power, the circuit being mounted on the printed wiring board; and
a capacitive element claimed in claim 15 and provided inside the printed board or on the surface of the printed board,
wherein the circuit is disposed inside the opening of the capacitive element.

21. The printed wiring board according to claim 20, wherein
the potential of the opposite electrode of the capacitive element is fixed.

22. A semiconductor package comprising:
an interposer having a power wiring;
a capacitive element claimed in claim 15 and placed on the interposer; and
a circuit that is surrounded by the capacitive element, and generates high-frequency power or needs to be protected from high-frequency power.

23. The semiconductor package according to claim 22, wherein
the interposer includes a fixed potential wiring, and an opposite electrode of the capacitive element is connected to the fixed potential wiring.

24. A semiconductor circuit comprising:
a semiconductor substrate on which a power wiring is formed;
a capacitive element claimed in claim 15 and placed on the semiconductor substrate; and
a circuit that is surrounded by the capacitive element, and generates high-frequency power or needs to be protected from high-frequency power.

25. The semiconductor circuit according to claim 24, wherein
a fixed potential wiring is formed on the semiconductor substrate, and an opposite electrode of the capacitive element is connected to the fixed potential wiring.

26. A capacitive element comprising:
a capacitive formation portion that includes an opening for surrounding a circuit that generates high-frequency power or needs to be protected from high-frequency power, wherein
the capacitive formation portion, which is shaped in form of a loop, includes an electrode in the shape of a closed curve, a dielectric layer that covers the electrode, and an opposite electrode that covers the dielectric layer and faces the electrode, wherein
the dielectric layer is piled on a ceiling surface, a bottom surface, and side circumference surfaces of the electrode; and
the opposite electrode is piled on a ceiling surface, a bottom surface, and side circumference surfaces of the dielectric layer;
the electrode includes at least one projecting portion for electric connection at the inner or outer circumference of the capacitive formation portion and the dielectric layer covers, except the projecting portion, the electrode;
the dielectric layer and the opposite electrode are opened so as to expose a portion of at least one surface of the electrode; and
the projecting portion serves as a connection portion to be electrically connected to the circuit if the projection portion is formed as a portion which projects from a core of the capacitive formation portion in a direction of inside the capacitive formation through the inner circumference, while the exposed surface of the electrode serves as a connection portion to be electrically connected to the circuit if the projection portion is formed as a portion which projects from the core of the capacitive formation portion in a direction of outside of the capacitive formation through the outer circumference.

27. The capacitive element according to claim 26, wherein an outgoing terminal is provided on the exposed electrode surface.

28. The capacitive element according to claim 26, wherein one or both of the electrode or the opposite electrode are made of a metal having a valve action.

29. The capacitive element according to claim 26, wherein the dielectric layer includes a metal oxide film.

30. The capacitive element according to claim 26, wherein either the electrode or the opposite electrode is made of a plurality of conductive materials.

31. A printed wiring board comprising:
a circuit that generates high-frequency power or needs to be protected from high-frequency power, the circuit being mounted on the printed wiring board; and
a capacitive element claimed in claim 26 and provided inside the printed board or on the surface of the printed board,
wherein the circuit is disposed inside the opening of the capacitive element.

32. The printed wiring board according to claim 31, wherein
the potential of the opposite electrode of the capacitive element is fixed.

33. A semiconductor package comprising:
an interposer having a power wiring;
a capacitive element claimed in claim 26 and placed on the interposer; and a circuit that is surrounded by the capacitive element, and generates high-frequency power or needs to be protected from high-frequency power.

34. The semiconductor package according to claim 33, wherein
the interposer includes a fixed potential wiring, and an opposite electrode of the capacitive element is connected to the fixed potential wiring.

35. A semiconductor circuit comprising:
a semiconductor substrate on which a power wiring is formed;
a capacitive element claimed in claim 26 and placed on the semiconductor substrate; and
a circuit that is surrounded by the capacitive element, and generates high-frequency power or needs to be protected from high-frequency power.

36. The semiconductor circuit according to claim 35, wherein
a fixed potential wiring is formed on the semiconductor substrate, and an opposite electrode of the capacitive element is connected to the fixed potential wiring.

* * * * *